(12) United States Patent
Lee et al.

(10) Patent No.: US 9,524,983 B2
(45) Date of Patent: Dec. 20, 2016

(54) VERTICAL MEMORY DEVICES

(71) Applicants: Byung-Jin Lee, Seoul (KR); Jee-Yong Kim, Hwaseong-si (KR); Dae-Seok Byeon, Seongnam-si (KR)

(72) Inventors: Byung-Jin Lee, Seoul (KR); Jee-Yong Kim, Hwaseong-si (KR); Dae-Seok Byeon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/988,178

(22) Filed: Jan. 5, 2016

(65) Prior Publication Data

US 2016/0268301 A1 Sep. 15, 2016

Related U.S. Application Data

(60) Provisional application No. 62/130,697, filed on Mar. 10, 2015.

(30) Foreign Application Priority Data

Mar. 10, 2015 (KR) .................. 10-2015-0033070
May 14, 2015 (KR) .................. 10-2015-0067286

(51) Int. Cl.
*H01L 27/115* (2006.01)

(52) U.S. Cl.
CPC ... *H01L 27/11582* (2013.01); *H01L 27/11568* (2013.01); *H01L 27/11573* (2013.01)

(58) Field of Classification Search
CPC .................. H01L 27/11568; H01L 27/11582; H01L 27/11573; H01L 27/1157; H01L 23/528; H01L 23/535
See application file for complete search history.

(56) References Cited

U.S. PATENT DOCUMENTS

| 7,679,133 | B2 | 3/2010 | Son et al. |
| 7,847,334 | B2 * | 12/2010 | Katsumata ............ H01L 21/764 257/314 |
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,728,889 | B2 | 5/2014 | Lee et al. |
| 8,822,285 | B2 | 9/2014 | Hwang et al. |
| 8,828,884 | B2 | 9/2014 | Lee et al. |
| 8,871,591 | B2 | 10/2014 | Kwon et al. |
| 8,928,149 | B2 | 1/2015 | Chen |

(Continued)

FOREIGN PATENT DOCUMENTS

KR 2014-0093038 A 7/2014

*Primary Examiner* — Kyoung Lee
(74) *Attorney, Agent, or Firm* — Harness, Dickey & Pierce, P.L.C.

(57) ABSTRACT

A vertical memory device includes a substrate, gate lines, channels, contacts and contact spacers. The gate lines are stacked on top of each other on the substrate. The gate lines are spaced apart from each other in a vertical direction with respect to a top surface of the substrate. The gate lines include step portions that extend in a parallel direction with respect to the top surface of the substrate. The channels extend through the gate lines in the vertical direction. The contacts are on the step portions of the gate lines. The contact spacers are selectively formed along sidewalls of a portion of the contacts.

21 Claims, 61 Drawing Sheets

(56) References Cited

U.S. PATENT DOCUMENTS

| | | |
|---|---|---|
| 2010/0013049 A1* | 1/2010 | Tanaka .............. H01L 21/76816 |
| | | 257/532 |
| 2011/0233648 A1 | 9/2011 | Seol et al. |
| 2014/0162420 A1 | 6/2014 | Oh et al. |
| 2014/0197546 A1 | 7/2014 | Hwang et al. |
| 2014/0199815 A1 | 7/2014 | Hwang et al. |
| 2014/0225183 A1 | 8/2014 | Park et al. |
| 2014/0264934 A1 | 9/2014 | Chen |
| 2014/0293703 A1 | 10/2014 | Jeong et al. |
| 2014/0306279 A1 | 10/2014 | Park et al. |
| 2014/0367759 A1 | 12/2014 | Lee et al. |
| 2015/0035065 A1 | 2/2015 | Park et al. |
| 2015/0064900 A1 | 3/2015 | Lee et al. |

* cited by examiner

VERTICAL MEMORY DEVICES

CROSS-REFERENCE TO RELATED APPLICATION

This U.S. Non-Provisional application claims priority under 35 USC §119 to U.S. Provisional Application No. 62/130,697 filed on Mar. 10, 2015 in the USPTO, and Korean Patent Applications No. 10-2015-0033070 filed on Mar. 10, 2015 and No. 10-2015-0067286 filed on May 14, 2015 in the Korean Intellectual Property Office (KIPO), the contents of which are incorporated by reference herein in their entirety.

BACKGROUND

1. Field

Example embodiments relate to vertical memory devices. More particularly, example embodiments relate to vertical memory devices including vertically stacked gate lines.

2. Description of Related Art

Recently, a vertical memory device including a plurality of memory cells stacked vertically with respect to a surface of a substrate has been developed for achieving a high degree of integration. In the vertical memory device, a channel having a pillar shape or a cylindrical shape may protrude vertically from the surface of the substrate, and gate lines and insulation layers surrounding the channel may be repeatedly stacked.

As the degree of integration of the vertical memory device becomes greater, the stacked number of the gate lines and the insulation layers may be increased, and thus higher process reliability may be needed.

SUMMARY

Example embodiments provide a vertical memory device having improved structural and mechanical reliability.

Example embodiments provide a method of manufacturing a vertical memory device having improved structural and mechanical reliability.

According to example embodiments, a vertical memory device includes a substrate, gate lines, channels, contacts, and contact spacers. The gate lines may be stacked on top of each other on the substrate. The gate lines may be spaced apart from each other in a vertical direction with respect to a top surface of the substrate. The gate lines may include step portions that extend in a parallel direction with respect to the top surface of the substrate. The channels may extend through the gate lines in the vertical direction. The contacts may be arranged on the step portions of the gate lines. The contact spacers may be selectively formed along sidewalls of a portion of the contacts.

In example embodiments, the contact spacers may include one of silicon nitride and silicon oxynitride.

In example embodiments, the vertical memory device may further include a mold protection layer covering top and lateral surfaces of the step portions. The mold protection layer may include silicon oxide.

In example embodiments, the contact spacers may surround the portion of the contacts and the contact spacers may extend through the mold protection layer. Remaining contacts except the portion of the contacts may be in contact with the mold protection layer and the remaining contacts may extend through the mold protection layer.

In example embodiments, the substrate may include a channel region, a first region, and a second region. The channels may be on the channel region. The first region and the second region may be sequentially positioned from the channel region in the parallel direction. The contacts may include first contacts on the step portions included in the first region, and second contacts on the step portions included in the second region.

In example embodiments, the contact spacers may include first contact spacers along sidewalls of the first contacts.

In example embodiments, the gate lines may include a ground selection line (GSL), word lines and a string selection line (SSL) sequentially stacked from the top surface of the substrate. The first contacts may be electrically connected to the SSL, and upper word lines adjacent to the SSL among the word lines.

In example embodiments, the second contacts may be electrically connected to remaining word lines except for the upper word lines, and the GSL. The contact spacers may not be formed along sidewalls of the second contacts.

In example embodiments, the substrate may further include a third region extended from the second region in the parallel direction. The contacts may further include third contacts on the step portions included in the third region.

In example embodiments, the first region, the second region and the third region may be allotted based on an order of a photo process. The contact spacers may further include second contact spacers along sidewalls of the second contacts. The contact spacers may not be formed along sidewalls of the third contacts.

In example embodiments, the vertical memory device may further include a peripheral circuit on a peripheral portion of the substrate, a mold protection layer covering top and lateral surfaces of the step portions and the peripheral circuit, and a peripheral circuit contact extending through the mold protection layer to the peripheral circuit. The peripheral circuit contact may be electrically connected to the peripheral circuit. The peripheral circuit contact may be in contact with the mold protection layer.

In example embodiments, the contacts may be arranged in a zigzag arrangement along the parallel direction.

In example embodiments, the portion of contacts on which the contact spacers may be formed along may be selectively arranged on the step portions of either odd levels or even levels.

According to example embodiments, there is provided a vertical memory device. The vertical memory device includes a substrate, a gate line structure on the substrate, gate line contacts, a peripheral circuit contact, and contact spacers. The substrate may include a channel region, a contact region, and a peripheral circuit region. The gate line structure may include gate lines on the channel region and the contact region, and stacked vertically from the substrate. The gate lines may include step portions that extend to the contact region. The gate line structure may include insulating interlayer patterns between the gate lines, and channels extending vertically through the gate lines and the insulating interlayer patterns. The gate line contacts may be electrically connected to the gate lines on the contact region. The peripheral circuit contact may be on the peripheral circuit region. The contact spacers may be selectively formed along sidewalls of a portion of the gate line contacts.

In example embodiments, the contact spacers may not be formed along a sidewall of the peripheral circuit contact.

In example embodiments, the contact spacers may be selectively formed on sidewalls of upper gate line contacts at desired (and/or alternatively predetermined) levels among the gate line contacts.

According to example embodiments, there is provided a method of manufacturing a vertical memory device. In the method, a stepped mold structure including a plurality of layers may be formed on a substrate. Channels extending through the stepped mold structure may be formed. A mold protection layer at least partially covering the stepped mold structure may be formed. A portion of layers among the plurality of layers may be replaced with gate lines to form a gate line structure. A plurality of photo processes may be formed to form contact holes extending through the mold protection layer and exposing the gate lines. Contact spacers may be formed on sidewalls of the contact holes which may be formed by a specific photo process of the plurality of photo processes. Contacts may be formed in the contact holes.

In example embodiments, the specific photo process may include an initial photo process among the plurality of photo processes.

In example embodiments, the plurality of photo processes may include a first photo process, a second photo process and a third photo process. The specific photo process may include the first and second processes.

In example embodiments, a peripheral circuit may be formed before forming the stepped mold structure. A peripheral circuit contact hole may be formed through the mold protection layer such that the peripheral circuit may be exposed. A peripheral circuit contact may be formed in the peripheral circuit contact hole.

According to example embodiments, a vertical memory device includes a substrate, vertical channel structures spaced apart from each other on the substrate, gate lines surrounding the vertical channel structures, contacts, and contact spacers. The gate lines are spaced apart from each other in a vertical direction. The gate lines include step portions that extend different extension lengths in a horizontal direction from a same one of the channel structures. The extension lengths of the step portions increase from top to bottom. The contacts extend vertically and connect to corresponding ones of the step portions. The contacts include first contacts and second contacts. The contact spacers surround one of the first contacts and the second contacts.

In example embodiments, the one of the first and second contacts may be the first contacts. The gate lines may include first gate lines on top of second gate lines. The first contacts may be connected the step portions of the first gate lines. The second contacts may be connected to the step portions of the second gate lines. The contact spacers may not surround the second contacts.

In example embodiments, the contact spacers may include one of silicon nitride and silicon oxynitride.

In example embodiments, the vertical memory device may further include a mold protection layer on the step portions. The mold protection layer and the contact spacers may be formed of different insulating materials.

In example embodiments, the vertical memory device may further include a peripheral circuit on the substrate and at least one peripheral circuit contact that extends through the mold protection layer and connects to the peripheral circuit. The peripheral circuit may be spaced apart from the gate lines.

BRIEF DESCRIPTION OF THE DRAWINGS

Example embodiments will be more clearly understood from the following detailed description taken in conjunction with the accompanying drawings of non-limiting embodiments of inventive concepts. The drawings are not necessarily to scale, emphasis instead being placed upon illustrating principles of inventive concepts. In the drawings.

DESCRIPTION OF EXAMPLE EMBODIMENTS

Figure 1:
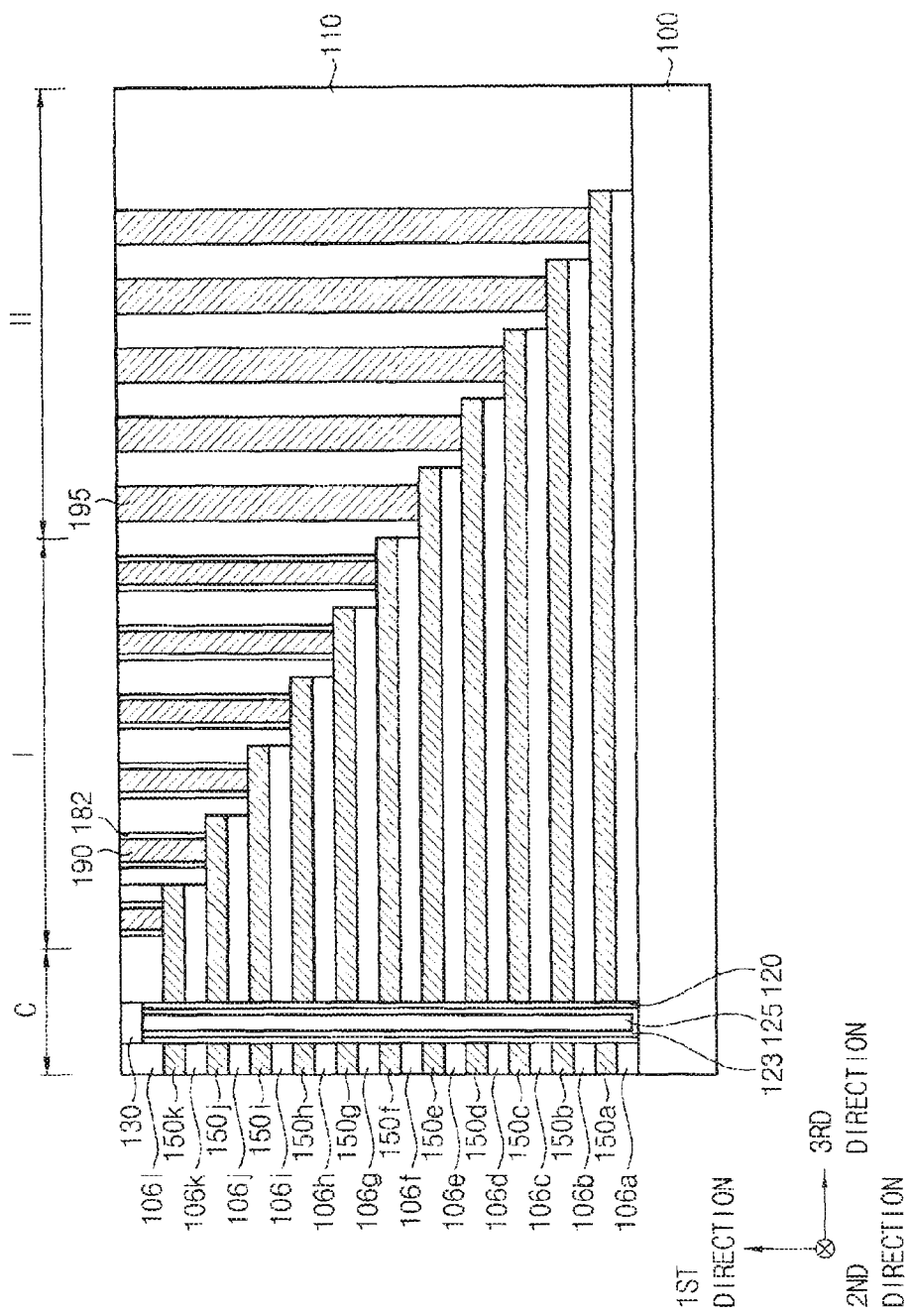
FIGS. 1 and 2 are a cross-sectional view and a top plan view, respectively, illustrating a vertical memory device in accordance with example embodiments.

Various example embodiments will be described more fully hereinafter with reference to the accompanying drawings, in which some example embodiments are shown. Example embodiments of inventive concepts may, however, be embodied in many different forms and should not be construed as limited to the embodiments set forth herein. Rather, these example embodiments are provided so that this description will be thorough and complete, and will fully convey the scope of inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Unless otherwise defined, all terms (including technical and scientific terms) used herein have the same meaning as commonly understood by one of ordinary skill in the art to which example embodiments of inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
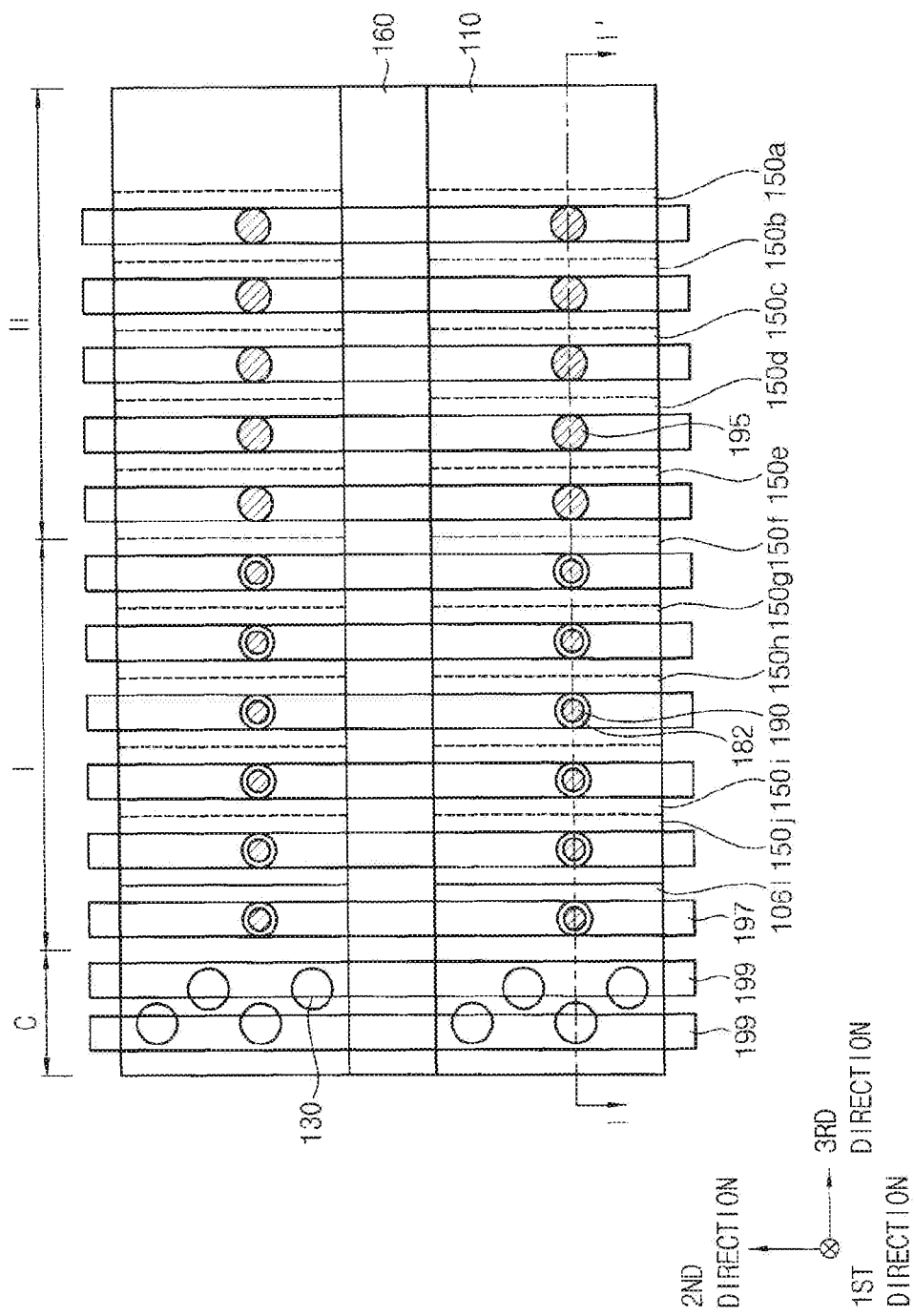

FIGS. 1 and 2 are a cross-sectional view and a top plan view, respectively, illustrating a vertical memory device in accordance with example embodiments. For example, FIG. 1 is a cross-sectional view taken along a line I-I' indicated in FIG. 2.

In FIGS. 1 and 2, a direction substantially vertical to a top surface of a substrate is referred to as a first direction, and two directions substantially parallel to the top surface of the substrate and substantially crossing each other are referred to as a second direction and a third direction. For example, the second direction and the third direction are substantially perpendicular to each other. Additionally, a direction indicated by an arrow and a reverse direction thereof are considered as the same direction. The above mentioned definitions of the directions are the same throughout all the figures in this specification.

Referring to FIGS. 1 and 2, the vertical memory device may include a vertical channel structure including a channel 123, a dielectric layer structure 120 and a first filling pattern 125 and extending in a first direction from a top surface of a substrate 100, gate lines 150 (e.g., 150a through 150k) surrounding the vertical channel structure 123 and being stacked in a stepped structure or a pyramidal structure, and contacts 190 and 195 electrically connected to the gate lines 150.

The substrate 100 may include a semiconductor material, e.g., silicon and/or germanium. In example embodiments, the substrate 100 may include single crystalline silicon. For example, the substrate 100 may serve as a p-type well of the vertical memory device. Alternatively, the substrate 100 may include a semiconductor-on-insulator structure such as silicon or germanium on an insulator (e.g., silicon oxide).

In example embodiments, the substrate 100 may include a channel region C, a first region I and a second region II. In example embodiments, the vertical channel structure may be disposed in the channel region C. First contacts 190 may be disposed in the first region I. Second contacts 195 may be disposed in the second region II. The first region I and the second region II may be a first contact region and a second contact region, respectively, allotted for a formation of the contacts 190 and 195. The first region I and the second region II may be a first photo region and a second photo region, respectively, allotted for the formation of the contacts 190 and 195. The first region I and the second region II may be arranged sequentially from the channel region C along the third direction.

In example embodiments, the first region I and the second region II may be arranged symmetrically with respect to the channel region C. For example, a central portion of the substrate 100 may be allotted as the channel region C, and both lateral portions of the channel region C may be allotted as the first region I and the second region II.

The channel 123 may be in contact with the top surface of the substrate 100 in the channel region I. The channel 123 may have a hollow cylindrical shape or a cup shape. The channel 123 may include polysilicon or single crystalline silicon, and may include p-type impurities such as boron (B) in a portion thereof.

The first filling pattern 125 may fill an inner space of the channel 123, and may have a solid cylindrical shape or a pillar shape. The first filling pattern 125 may include an insulation material such as silicon oxide. In example embodiments, the channel 123 may have a pillar shape or a solid cylindrical shape, and the first filling pattern 125 may be omitted.

The dielectric layer structure 120 may be formed on an outer sidewall of the channel 123. The dielectric layer structure 120 may have a straw shape or a cup shape of which a central bottom is opened.

The dielectric layer structure 120 may include a tunnel insulation layer, a charge storage layer and a blocking layer which may be sequentially stacked from the outer sidewall of the channel 123. The blocking layer may include silicon oxide or a metal oxide such as hafnium oxide or aluminum oxide. The charge storage layer may include a nitride such as silicon nitride or a metal oxide, and the tunnel insulation layer pattern may include an oxide such as silicon oxide. For example, the dielectric layer structure 120 may have an oxide-nitride-oxide (ONO) layered structure.

In example embodiments, a semiconductor pattern (not illustrated) may be further disposed between the top surface of the substrate 100 and a bottom of the channel 123. In this case, the channel 123 may be disposed on a top surface of the semiconductor pattern, and the dielectric layer structure 120 may be disposed on a peripheral portion of the top surface of the semiconductor pattern. The semiconductor pattern may include, e.g., a single crystalline silicon or polysilicon.

A pad 130 may be formed on the dielectric layer structure 120, the channel 123 and the first filling pattern 125. For example, upper portions of the dielectric layer structure 120, the channel 123 and the first filling pattern 125 may be capped by the pad 130.

The pad 130 may be electrically connected to, e.g., a bit line 199, and may serve as a source/drain region through which charges may be moved or transferred to the channel 123. The pad 130 may include polysilicon or single crystalline silicon, and may be optionally doped with n-type impurities such as phosphorus (P) or arsenic (As).

A plurality of the pads 130 may be arranged along the third direction on the channel region C such that a pad row may be defined, and a plurality of the pad rows may be arranged in the second direction. The vertical channel structure including the dielectric layer structure 120, the channel 123 and the first filling layer pattern 125 may be also arranged according to an arrangement of the pads 130. For example, a plurality of the vertical channel structures may be arranged along the third direction in the channel region C to form a channel row, and a plurality of the channel rows may be arranged in the second direction.

The gate lines 150 (e.g., 150a through 150k) may be formed on an outer sidewall of the dielectric structure 120, and may be spaced apart from each other along the first direction. In example embodiments, each of the gate line 150 may partially surround the channels 123 or the vertical channel structures included in the plurality of the channel rows and may extend in the third direction.

In example embodiments, each of the gate line 150 may surround the channel rows corresponding to four pad rows.

In this case, a gate line structure may be defined by 4 channel rows and the gate lines 150 surrounding the 4 channel rows. A plurality of the gate line structures may be arranged along the second direction.

In example embodiments, widths or length of the gate lines 150 in the third direction may be reduced along the first direction from the top surface of the substrate 100. For example, as illustrated in FIG. 1, a plurality of the gate lines 150 may be stacked in a pyramidal shape or a stepped shape. Accordingly, the gate line 150 of each level may include a step portion protruding in the third direction from an upper gate line 150, and the step portion of each gate line 150 may serve as a pad for landing the contact 190 and 195.

The gate lines 150 may include a ground selection line (GSL), a word line and a string selection line (SSL). For example, a lowermost gate line 150a may serve as the GSL. Two uppermost gate lines 150j and 150k may serve as the SSLs. The gate lines 150b to 150i between the GSL and the SSL may serve as the word lines. As illustrated in FIG. 1, the gate lines 150 of 8 levels may serve as the word lines in each gate line structure. However, the word lines may be formed at increased levels in consideration of a circuit design and a degree of integration of the vertical memory device, e.g. 16 levels, 24 levels, 48 levels, etc.

The gate line 150 may include a metal having a low electrical resistance or a nitride thereof. For example, the gate line 150 may include tungsten (W), tungsten nitride, titanium (Ti), titanium nitride, tantalum (Ta), tantalum nitride, platinum (Pt), or the like. In example embodiments, the gate line 150 may have a multi-layered structure including a barrier layer formed of a metal nitride and a metal layer.

Insulating interlayer patterns 106 (e.g., 106a through 106l) may be disposed between the gate lines 150 neighboring in the first direction. The insulating interlayer pattern 106 may include a silicon oxide-based material, e.g., silicon dioxide ($SiO_2$), silicon oxycarbide (SiOC) or silicon oxyfluoride (SiOF). The gate lines 150 included in one gate line structure may be insulated from each other by the insulating interlayer patterns 106. In example embodiments, the insulating interlayer patterns 106 may be stacked along the first direction in a pyramidal shape or a stepped shape substantially the same as or similar to that of the gate lines 150.

A mold protection layer 110 may be formed on a lateral portion of the gate line structure. The mold protection layer 110 may be in contact with the step portions of the gate lines 150. The mold protection layer 110 may include an insulation material such as silicon oxide.

A second filling pattern 160 may be interposed between the gate line structures neighboring each other. For example, the second filling pattern 160 may intersect the gate lines 150, the insulating interlayer patterns 106 and the mold protection layer 110, and may extend in the third direction. The second filling pattern 160 may serve as a gate line cut pattern defining the gate line structure.

An impurity region 101 (see FIG. 18) may be formed at an upper portion of the substrate 100 under the second filling pattern 160. The impurity region 101 may extend in the third direction, and may serve as a common source line (CSL) of the vertical memory device.

The first contacts 190 and the second contacts 195 may be arranged in the first region I and the second region II, respectively, of the substrate 100. The first contacts 190 may extend through an uppermost insulating interlayer pattern 106l or the mold protection layer 110 to be in contact with or electrically connected to the step portions of the gate lines 150.

In example embodiments, the step portions of upper gate lines 150 included in the gate line structure may be included in the first region I. Accordingly, the first contacts 190 may be landed on the step portions included in the desired (and/or alternatively predetermined) number of the upper gate lines 150 (e.g., 150f through 150k). For example, the first contacts 190 may be landed on the SSL and some of the word lines.

In example embodiments, a first contact spacer 182 may be formed on a sidewall of each first contact 190. In this case, a first contact spacer 182 may extend through an upper insulating interlayer pattern 106l or the mold protection layer 110, and may have a straw shape surrounding the first contact 190.

For example, the first contact spacer 182 may include an insulating material such as silicon nitride or silicon oxynitride. A material of the first contact spacer 182 may be different than a material of the mold protection layer 110 and/or insulating interlayer patterns 106.

The step portions of remaining gate lines 150 except for the gate lines 150 covered by the first region I may be included in the second region II. For example, the second contacts 195 may extend through the mold protection layer 110 to be electrically connected to or in contact with the step portions of lower gate lines 150 (e.g., 150a to 150e) included in the gate line structure. For example, the second contacts 195 may be landed on the remaining word lines and the GSL.

In example embodiments, contact spacers may not be formed on sidewalls of the second contacts 195. In example embodiments, the sidewalls of the second contacts 195 may be in contact with the mold protection layer 110.

As illustrated in FIG. 2, wirings 197, each of which may electrically connect the contacts 190 and 195 landed on the gate lines 150 of the same level, and included in the different gate line structures may be disposed on the mold protection layer 110. For example, each wiring 197 may extend in the second direction and may be electrically connected to a plurality of the contacts 190 and 195.

The bit line 199 may be disposed on the channel region C of the substrate 100, and may electrically connect a plurality of the pads 130. For example, the bit line 199 may extend in the second direction on the uppermost insulating interlayer pattern 106l, and may electrically connect the pads 130 included in the different channel rows. In example embodiments, a bit line contact may be interposed between the pad 130 and the bit line 199.

The first and second contacts 190 and 195, the wirings 197 and the bit line 199 may include a conductive material such as a metal, a metal nitride, a metal silicide or the like.

According to example embodiments as described above, the contact spacers may be formed selectively on sidewalls of some of the contacts electrically connected to the gate lines 150. For example, the first contact spacer 182 may be formed selectively on sidewalls of the first contacts 190 landed on the upper gate lines 150 included in the first region I. In example embodiments, as the stacked number of the gate lines 150 becomes greater, the contact spacers may be provided on only some contacts that may be vulnerable to a failure and may be selected in consideration of a manufacturing process.

FIGS. 3 to 29 are cross-sectional views and top plan views illustrating a method of manufacturing a vertical memory device in accordance with example embodiments. For example, FIGS. 3 to 29 illustrate a method of manufacturing the vertical memory device of FIGS. 1 and 2.

Specifically, FIGS. 6, 10, 11, 17, 19, 22, 24, 27 and 29 are top plan views illustrating the method. FIGS. 3, 4, 5, 7, 8, 9, 13, 15, 20, 21, 23, 25, 26 and 28 are cross-sectional views taken along lines I-I' indicated in the top plan views. FIGS. 12, 14, 16 and 18 are cross-sectional views taken along lines II-II' indicated in FIGS. 11, 17 and 19.

Figure 3:
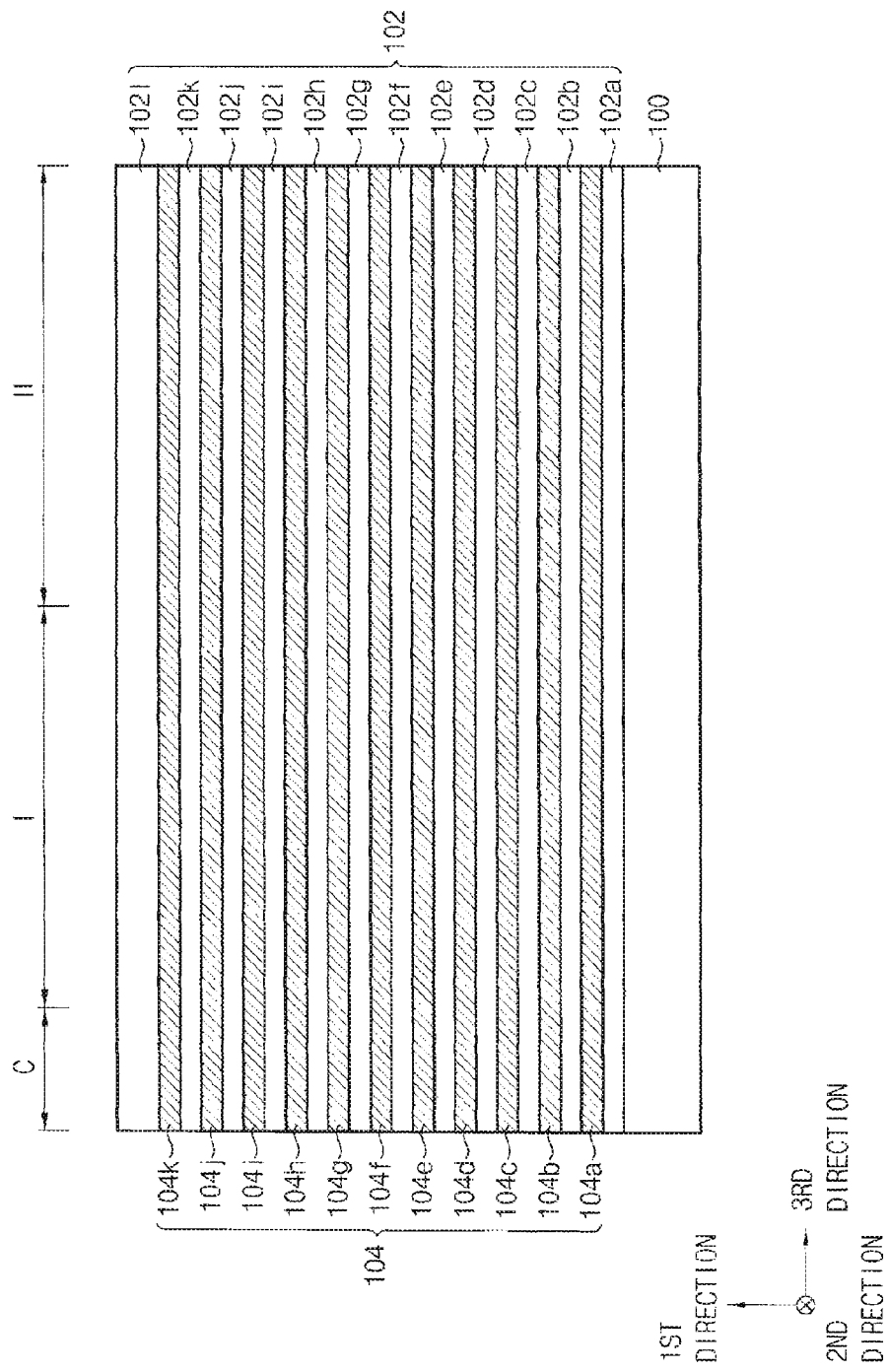
FIGS. 3 to 29 are cross-sectional views and top plan views illustrating a method of manufacturing a vertical memory device in accordance with example embodiments.

Referring to FIG. 3, insulating interlayers 102 (e.g., 102a through 102l) and sacrificial layers 104a through 104k may be alternately and repeatedly formed on a substrate 100 to form a mold structure.

A semiconductor substrate including, e.g., single crystalline silicon or germanium may be used as the substrate 100. The substrate 100 may be divided into a channel region C, a first region I and a second region II. A channel 123 (see FIG. 8), a first contact 190 (see FIG. 28) and a second contact 195 (see FIG. 28) may be formed in the channel region C, the first region I and the second region II, respectively, by subsequent processes.

In example embodiments, the insulating interlayer 102 may be formed of an oxide-based material, e.g., silicon dioxide, silicon oxycarbide and/or silicon oxyfluoride. The sacrificial layer 104 may be formed of a material that may have an etching selectivity with respect to the insulating interlayer 102 and may be easily removed by a wet etching process. For example, the sacrificial layer 104 may be formed of a nitride-based material, e.g., silicon nitride and/or silicon boronitride.

The insulating interlayer 102 and the sacrificial layer 104 may be formed by a deposition process, such as at least one of a chemical vapor deposition (CVD) process, a plasma enhanced chemical vapor deposition (PECVD) process, a high density plasma chemical vapor deposition (HDP-CVD) process, an atomic layer deposition (ALD) process and a sputtering process.

In example embodiments, a lowermost insulating interlayer 102a may be formed by a different process than the process used to form the other insulating layers 102b to 102l. For example, the insulating interlayer 102a may be formed using a thermal oxidation process on a top surface of the substrate 100. In example embodiments, an uppermost insulating interlayer 102l may have a relatively large thickness compared to the insulating interlayers 102a to 102k.

The sacrificial layers 104 may be removed in a subsequent process to provide spaces for a GSL, a word line and an SSL. Thus, the number of the insulating interlayers 102 and the sacrificial layers 104 may be determined in consideration of the number of the GSL, the word line and the SSL. FIG. 3 illustrates that the sacrificial layers 104 and the insulating interlayers 102 are formed at 11 levels and 12 levels, respectively. However, the number of the insulating interlayers 102 and the sacrificial layers 104 may be increased according to a degree of integration of the vertical memory device.

Figure 4:
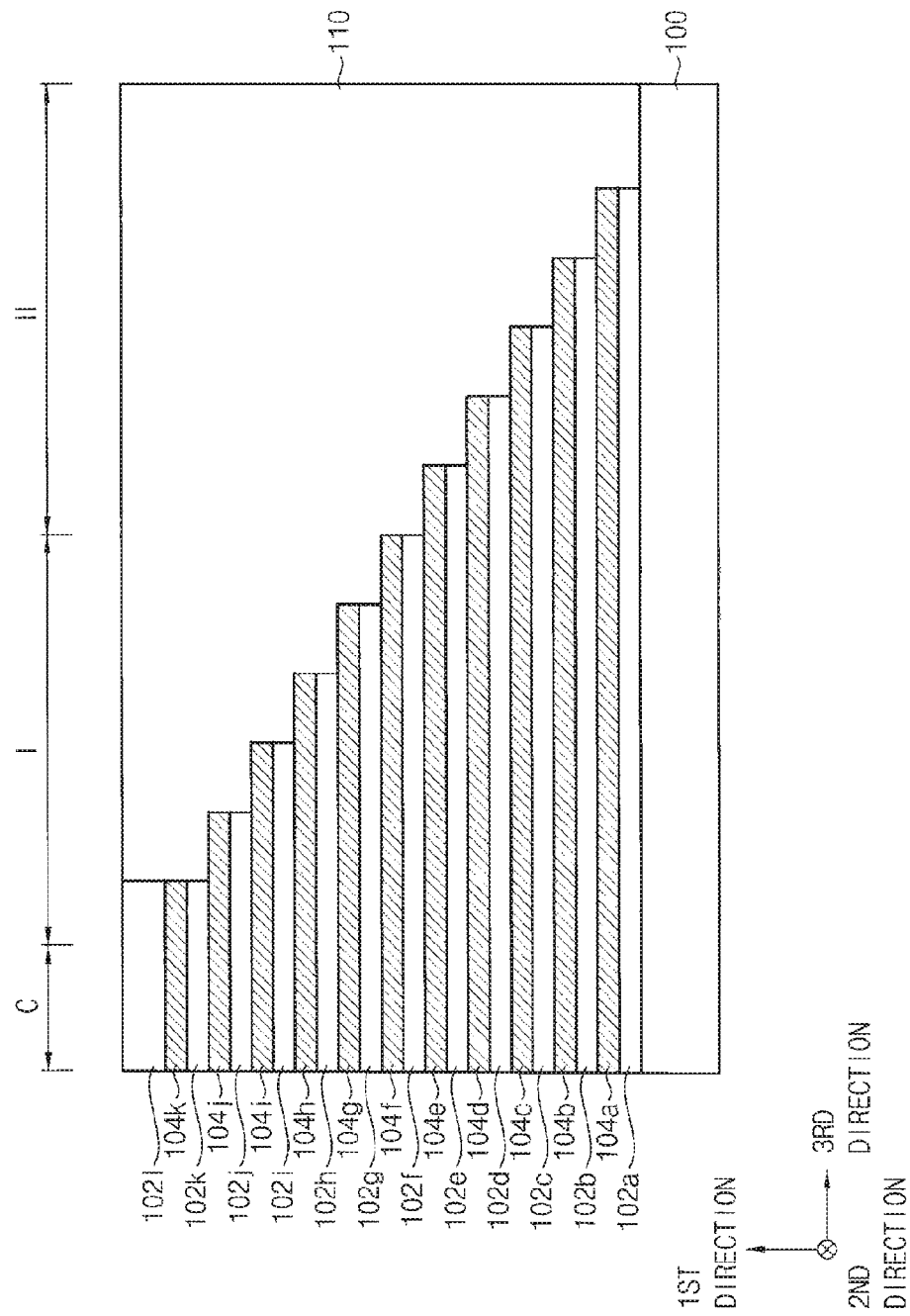

Referring to FIG. 4, a lateral portion of the mold structure may be partially etched in, e.g., a stepwise manner to form a stepped mold structure.

For example, a photoresist pattern (not illustrated) may be formed on an uppermost insulating interlayer 102l to cover the channel region C and the first region I, and partially cover the second region II. Both ends of the insulating interlayers 102 (e.g., 102l to 102a) and the sacrificial layers 104 (e.g., 104k to 104a) may be etched using the photoresist pattern as an etching mask. Both ends of the photoresist pattern may then be removed so that a width of the photoresist pattern may be reduced. Next, both ends of the insulating interlayers 102 (e.g., 102l to 102b) and the sacrificial layers 104 (e.g., 104k to 104b) may be etched using the photoresist pattern as the etching mask again.

Etching processes may be repeated in a similar manner as described above to obtain the stepped mold structure illustrated in FIG. 4.

After the formation of the stepped mold structure, a mold protection layer 110 covering lateral portions or steps of the stepped mold structure may be formed. For example, an insulation layer covering the stepped mold structure may be formed on the substrate 100 using, e.g., silicon oxide by a CVD process or a spin coating process. An upper portion of the insulation layer may be planarized until the uppermost insulating interlayer **102*l* is exposed to form the mold protection layer 110**. The planarization process may include a chemical mechanical polish (CMP) process and/or an etch-back process.

Figure 5:
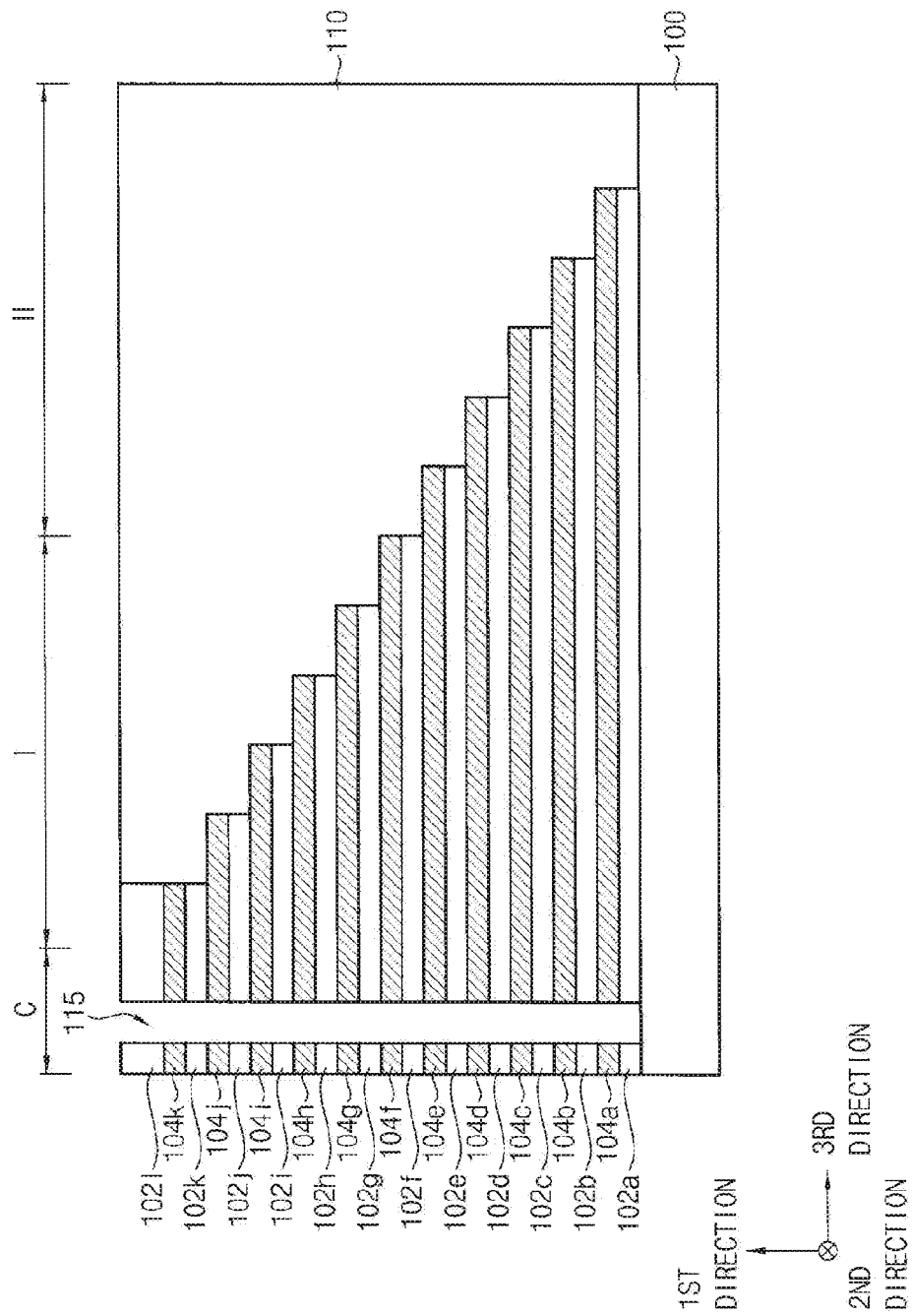
Figure 6:
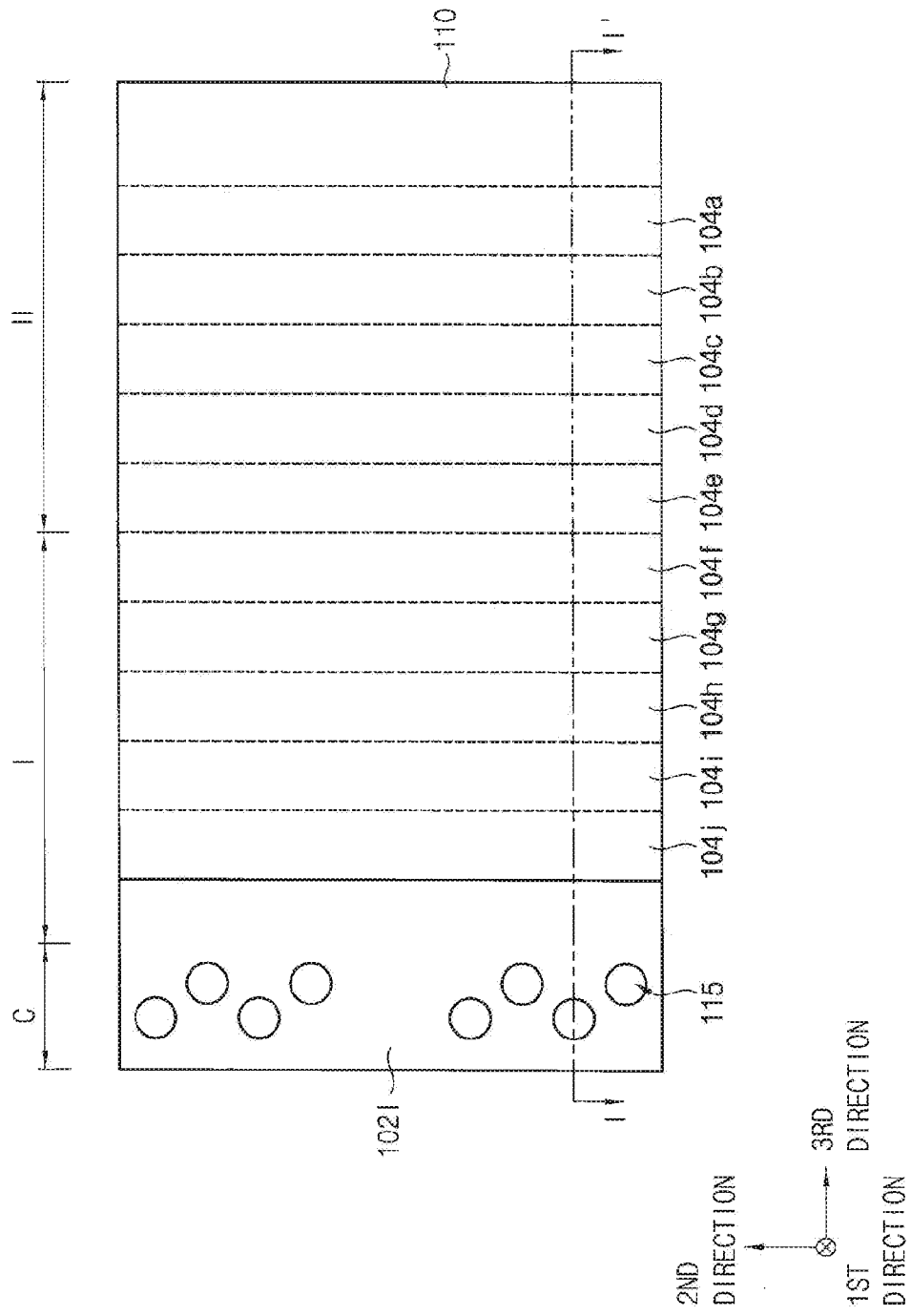

Referring to FIGS. 5 and 6, a channel hole 115 may be formed through the stepped mold structure in the channel region C.

For example, a hard mask (not illustrated) may be formed on the uppermost insulating interlayer **102*l* and the mold protection layer 110. The insulating interlayers 102 and the sacrificial layers 104 of the stepped mold structure may be partially etched by performing, e.g., a dry etching process. The hard mask may be used as an etching mask to form the channel hole 115. A top surface of the substrate 100 may be partially exposed by the channel hole 115. The channel hole 115 may extend in the first direction from the top surface of the substrate 100**. The hard mask may be formed of silicon-based or carbon-based spin-on hardmask (SOH) materials, and/or a photoresist material.

In example embodiments, a plurality of the channel holes 115 may be formed in the third direction to form a channel hole row. A plurality of the channel hole rows may be formed in the second direction. The channel hole rows may be arranged such that the channel holes 115 may be formed in a zigzag arrangement along the second direction. For convenience of descriptions, only one channel hole 115 is illustrated per each channel hole row in FIG. 6.

The hard mask may be removed by an ashing process and/or a strip process after the formation of the channel holes 115.

Figure 7:
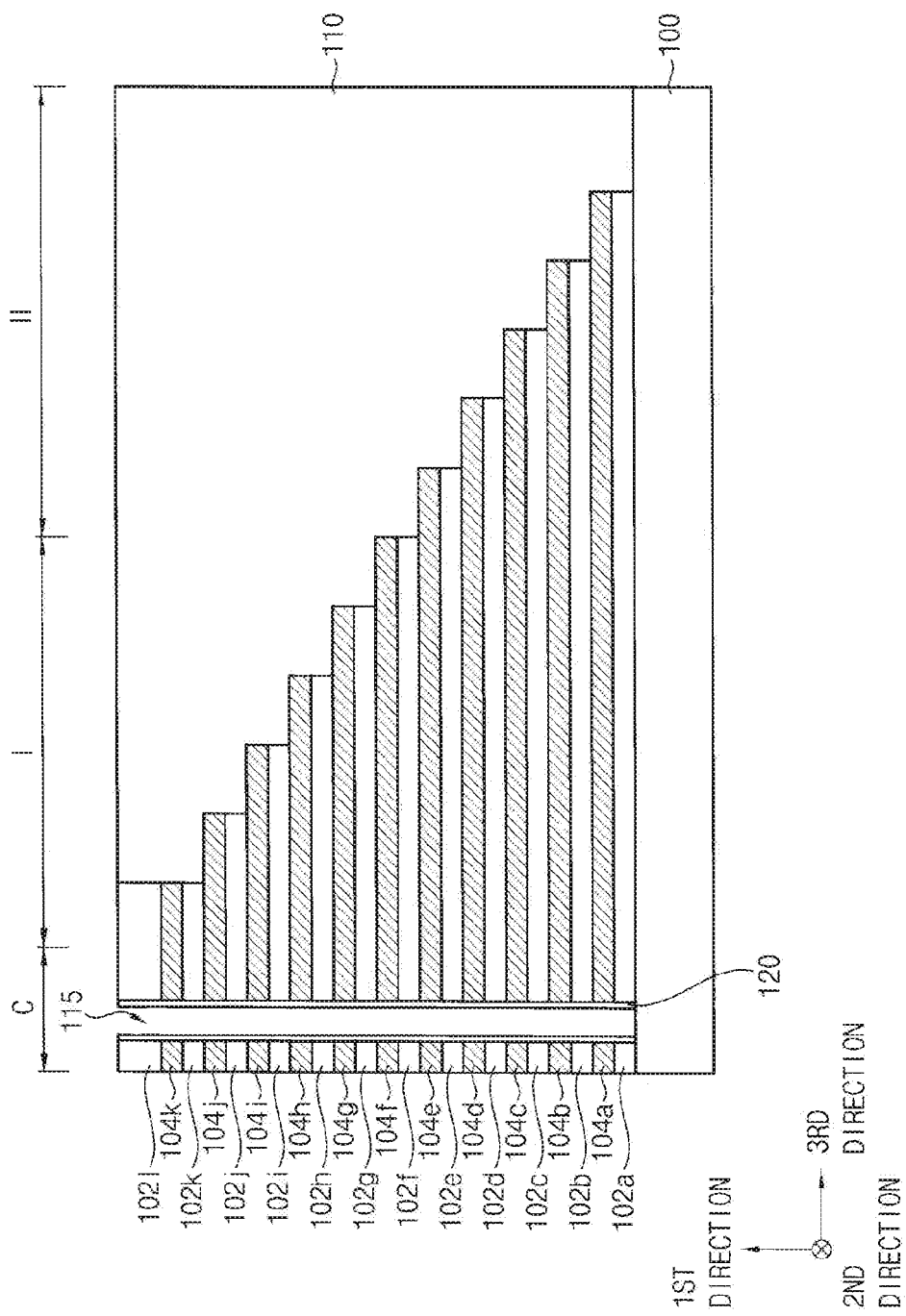

Referring to FIG. 7, a dielectric layer structure 120 may be formed on a sidewall of each channel hole 115.

In example embodiments, a dielectric layer may be formed on sidewalls and bottoms of the uppermost insulating interlayer **102*l* and the mold protection layer 110, and on the sidewall and bottoms of the channel holes 115**. The dielectric layer may be formed by sequentially forming a blocking layer, a charge storage layer and a tunnel insulation layer. For example, the blocking layer may be formed using an oxide, e.g., silicon oxide, the charge storage layer may be formed using silicon nitride or a metal oxide, and the tunnel insulation layer may be formed using an oxide, e.g., silicon oxide. In example embodiments, the dielectric layer may be formed as an oxide-nitride-oxide (ONO) layered structure. The blocking layer, the charge storage layer and the tunnel insulation layer may be formed by a CVD process, a PECVD process, an ALD process, etc.

For example, a portion of the dielectric layer formed on the bottoms of the channel holes 115 may be removed by, e.g., an etch-back process. Thus, the top surface of the substrate 100 may be exposed again. A portion of the dielectric layer formed on the uppermost insulating interlayer **102*l* and the mold protection layer 110 may be also removed by the etch-back process and/or a CMP process. Accordingly, the dielectric layer structure 120 having, e.g., a straw shape may be formed on the sidewall of each channel hole 115**.

Figure 8:
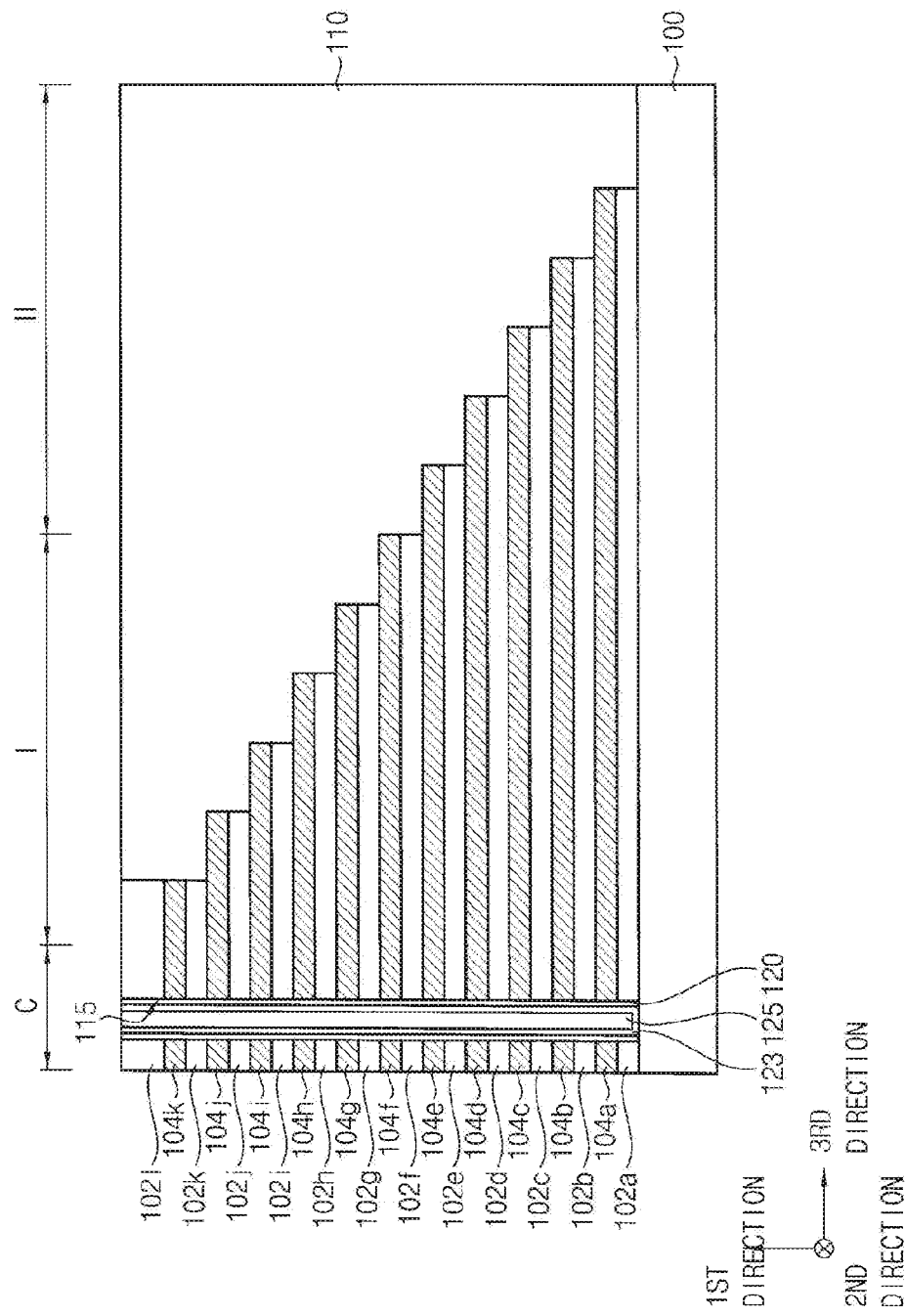

Referring to FIG. 8, a channel 123 and a first filling pattern 125 may be formed in a remaining portion of the each channel hole 115.

In example embodiments, a channel layer may be formed on the uppermost insulating interlayer **102*l*, the mold protection layer, sidewalls of the dielectric layer structure 120 and the bottoms of the channel holes 115. A first filling layer filling remaining portions of the channel holes 115** may be formed on the channel layer. The channel layer may be formed of polysilicon or amorphous silicon which is optionally doped with impurities. In example embodiments, a heat treatment or a laser beam irradiation may be further performed on the channel layer. In this case, the channel layer may be transformed to include single crystalline silicon. The first filling layer may be formed using an insulation material, e.g., silicon oxide or silicon nitride.

The channel layer and the first filling layer may be formed by a CVD process, a PECVD process, an ALD process, a PVD process, a sputtering process, etc.

Upper portions of the channel layer and the first filling layer may be planarized by, e.g., a CMP process until the uppermost insulating interlayer **102*l* or the mold protection layer 110 is exposed to form the channel 123 and the first filling pattern 125 in the each channel hole 115**.

The channel 123 may be formed on the sidewall of the dielectric layer structure 120 and may be in contact with the top surface of the substrate 100. For example, the channel may have a substantially cup shape, and the first filling pattern 125 may have a substantially pillar shape inserted in the channel 123.

After performing the above-mentioned processes, a vertical channel structure including the dielectric layer structure 120, the channel 123 and the first filling layer pattern 125 sequentially formed on the sidewall of the channel hole 115 may be formed in the each channel hole 115. According to the arrangement of the channel holes 115 as described above, a plurality of the vertical channel structures may be arranged along the third direction to define a channel row, and a plurality of the channel rows may be arranged along the second direction.

In example embodiments, a semiconductor pattern may be further formed at a lower portion of the channel hole 115 before forming the dielectric layer structure 120. The semiconductor pattern may be formed by a selective epitaxial growth (SEG) process using the top surface of the substrate 100 exposed through the channel hole 115 as a seed. The semiconductor pattern may include polysilicon or single crystalline silicon. Alternatively, an amorphous silicon layer filling the lower portion of the channel hole 115 may be formed, and then a laser epitaxial growth (LEG) process or a solid phase epitaxi (SPE) process may be performed on the amorphous silicon layer to form the semiconductor pattern. In this case, the dielectric layer structure 120 and the channel 123 may be formed on a top surface of the semiconductor pattern.

Figure 9:
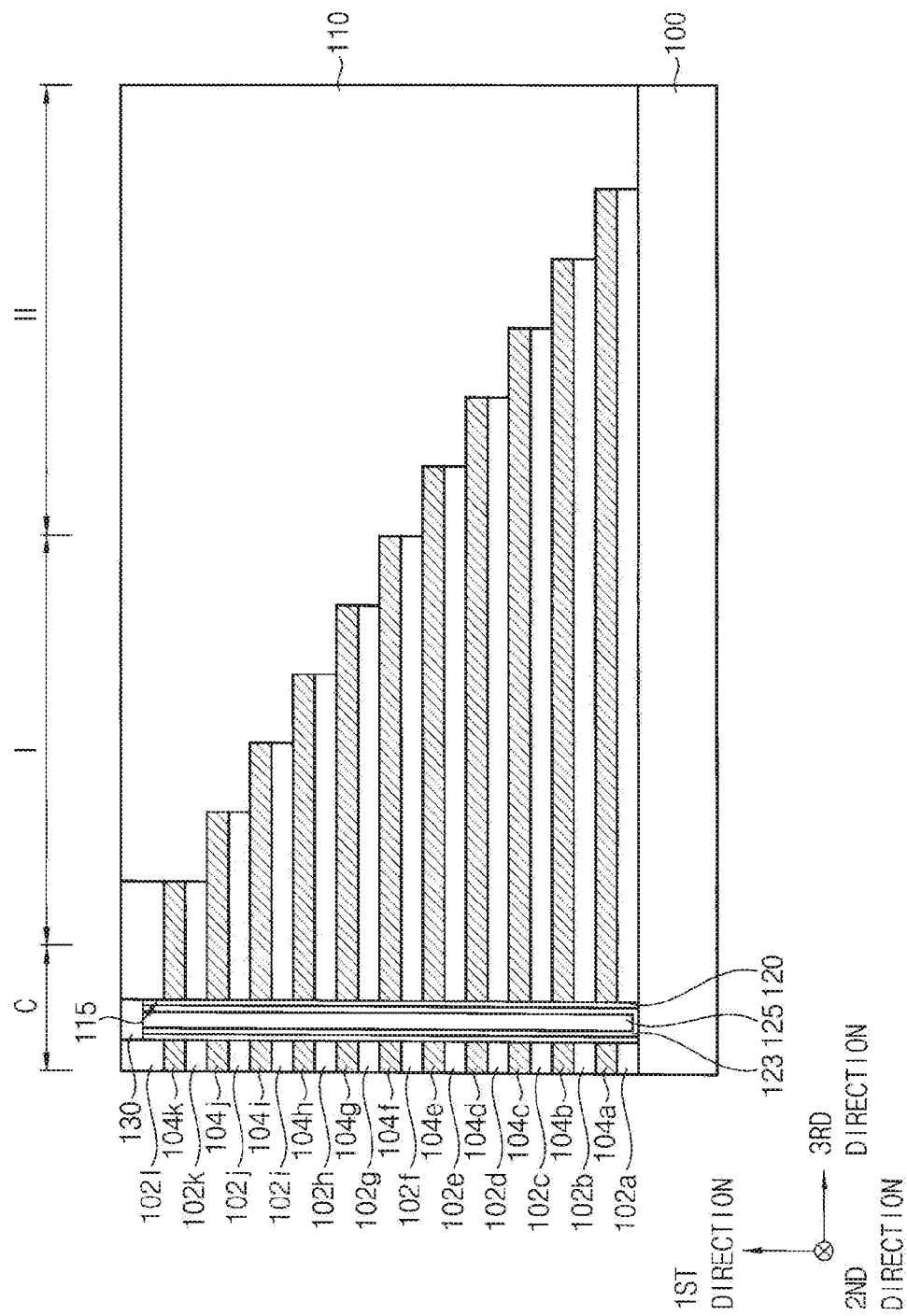
Figure 10:
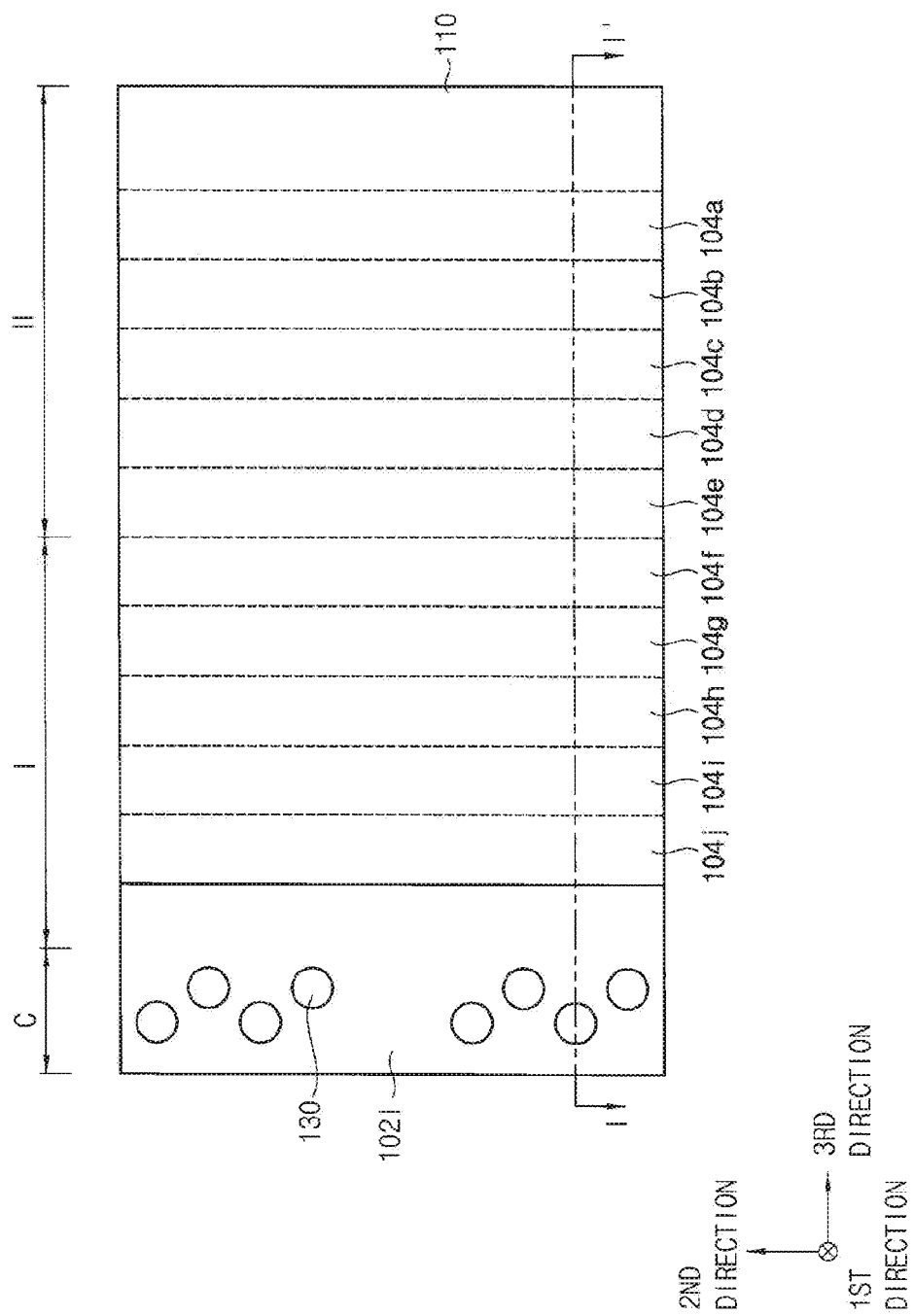

Referring to FIGS. 9 and 10, a pad 130 filling an upper portion of the channel hole 115 may be formed.

For example, upper portions of the dielectric layer structure 120, the channel 123 and the first filling pattern 125 may be partially removed by, e.g., an etch-back process to form a recess. A pad layer may be formed on the dielectric layer structure 120, the channel 123, the first filling pattern 125, the uppermost insulating interlayer **102*l* and the mold protection layer 110 to sufficiently fill the recess. An upper portion of the pad layer may be planarized by, e.g., a CMP process until top surfaces of the uppermost insulating interlayer 102*l* and/or the mold protection layer 110** may be exposed to form the pad 130 from a remaining portion of the pad layer. In example embodiments, the pad layer may be formed using polysilicon optionally doped with n-type impurities. In example embodiments, a preliminary pad layer including amorphous silicon may be formed, and then a crystallization process may be performed thereon to form the pad layer. The planarization process may include a CMP process.

According to the arrangement of the channel row, a plurality of the pads 130 may define a pad row in the uppermost insulating interlayer 102*l*.

Figure 11:
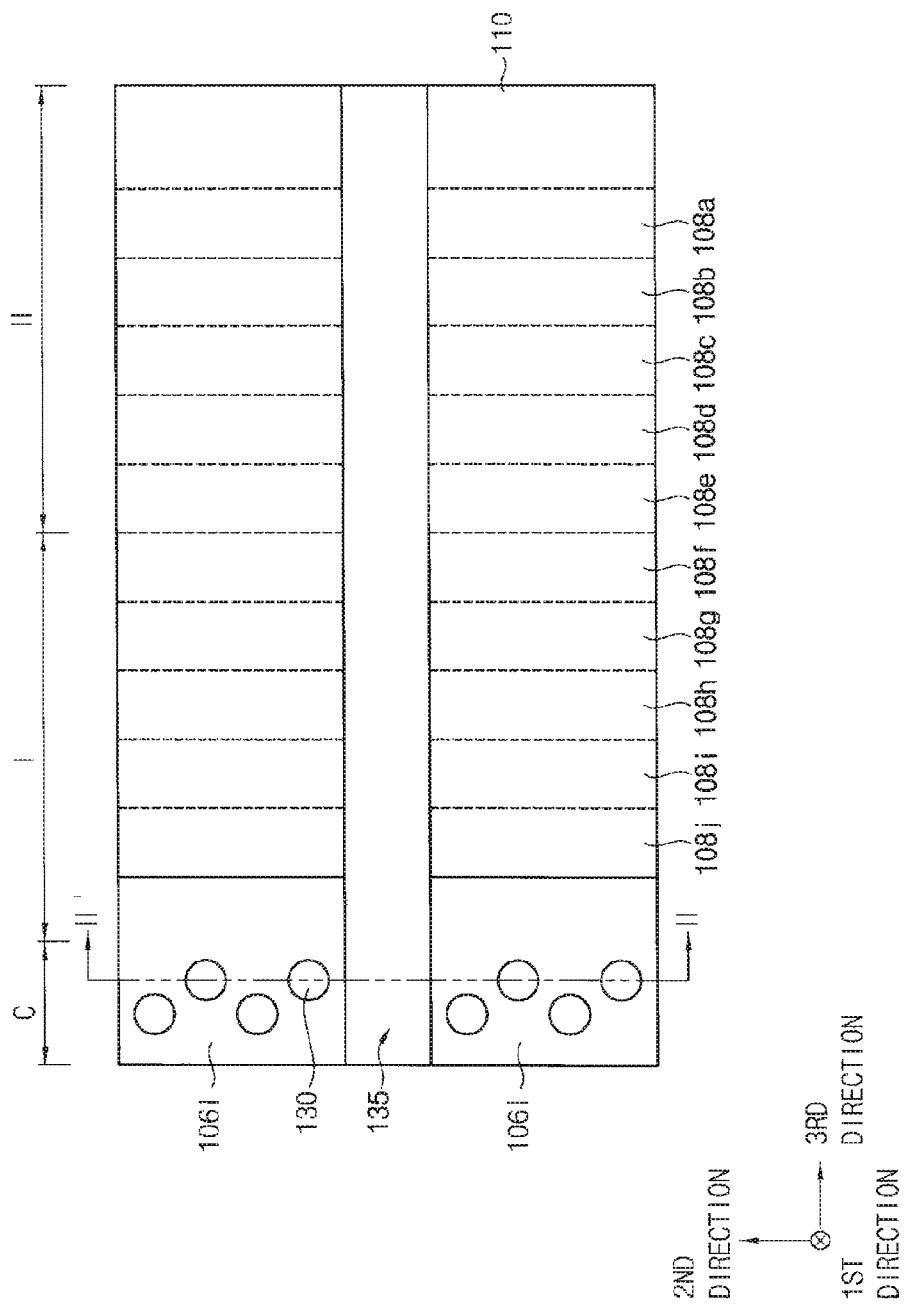
Figure 12:
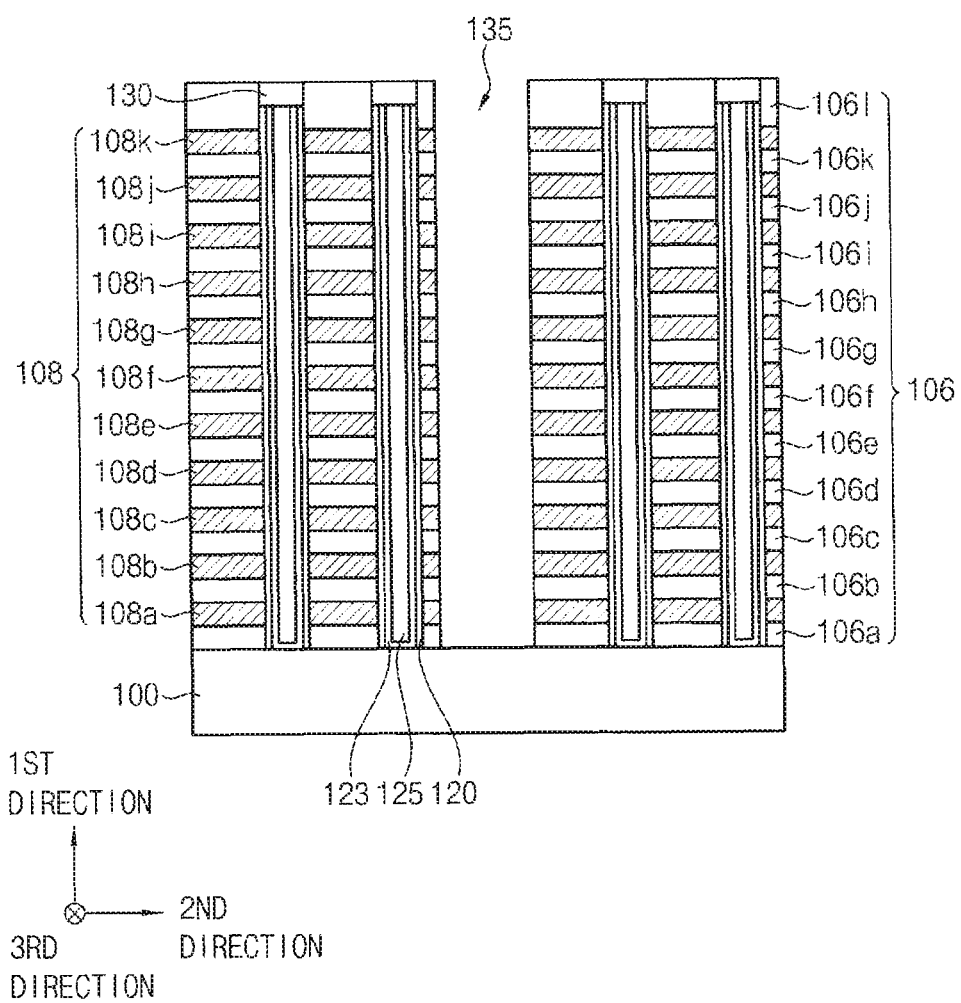

Referring to FIGS. 11 and 12, an opening 135 extending through the stepped mold structure may be formed.

For example, a hard mask (not illustrated) covering the pads 130 and partially exposing the uppermost insulating interlayer 102*l* and the mold protection layer 110 between some of the channel rows may be formed on the uppermost insulating interlayer 102*l* and the mold protection layer 110. The mold protection layer 110, the insulating interlayers 102 and the sacrificial layers 104 may be partially etched by, e.g., a dry etching process using the hard mask as an etching mask to form the opening 135. The hard mask may be formed using a photoresist material or an SOH material. The hard mask may be removed by an ashing process and/or a strip process after the formation of the opening 135.

In example embodiments, the opening 135 may extend in the third direction, and a plurality of the openings 135 may be formed along the second direction. The desired (and/or alternatively predetermined) number of the channel rows may be arranged between the openings 135 neighboring in the second direction. For example, as illustrated in FIG. 11, four channel rows may be included between the neighboring openings 135. However, the number of the channel rows between the openings 135 may be properly adjusted in consideration of a circuit design or a degree of integration of the vertical memory device.

As illustrated in FIG. 12, after the formation of the opening 135, the insulating interlayers 102 and the sacrificial layers 104 may be changed into insulating interlayer patterns 106 (e.g., 106*a* through 106*l*) and sacrificial patterns 108 (e.g., 108*a* through 108*k*). The insulating interlayer pattern 106 and the sacrificial pattern 108 at each level may have a plate shape extending in the third direction. The top surface of the substrate 100, and sidewalls of the insulating interlayer patterns 106 and the sacrificial patterns 108 may be exposed through the opening 135.

Figure 13:
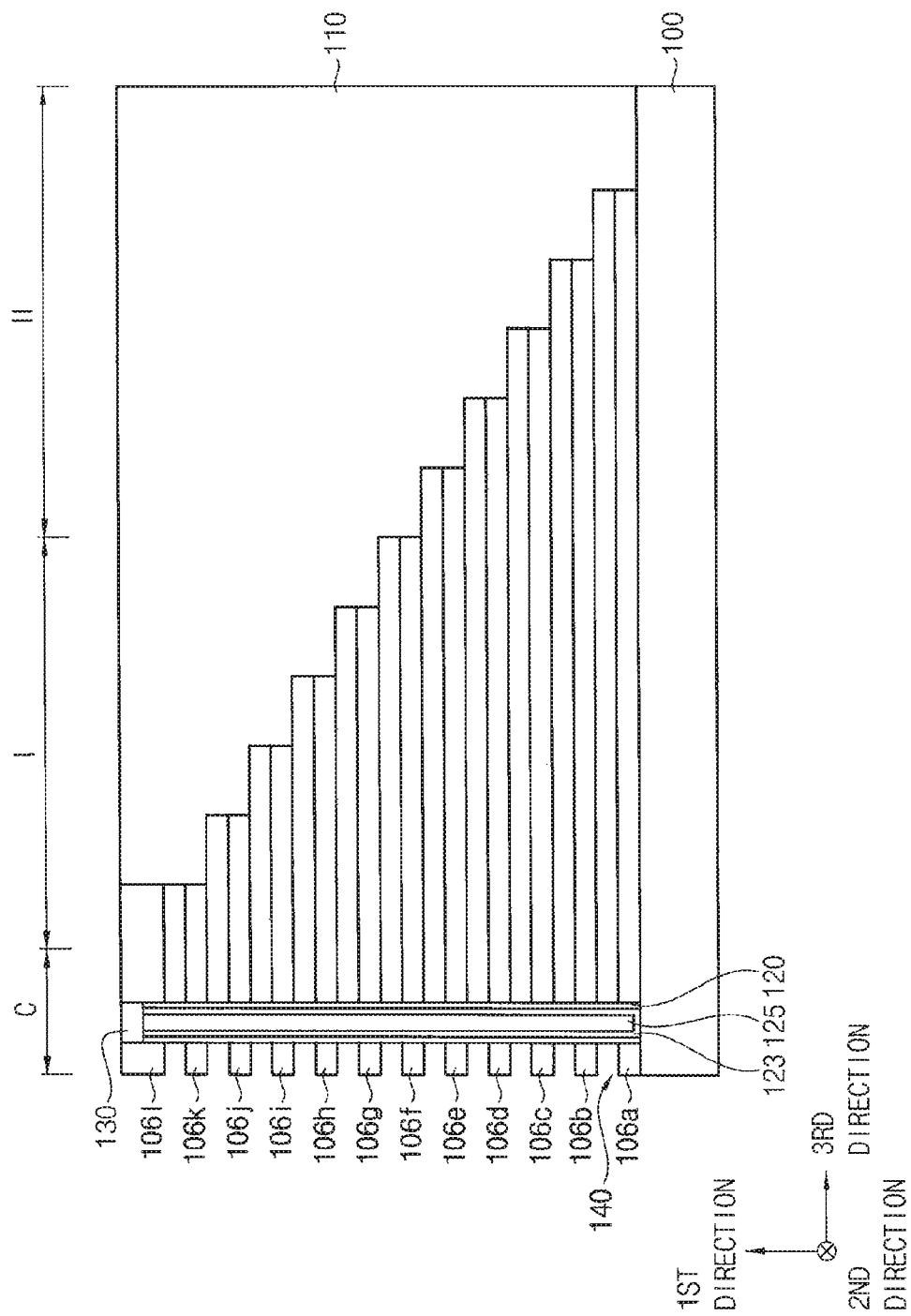
Figure 14:
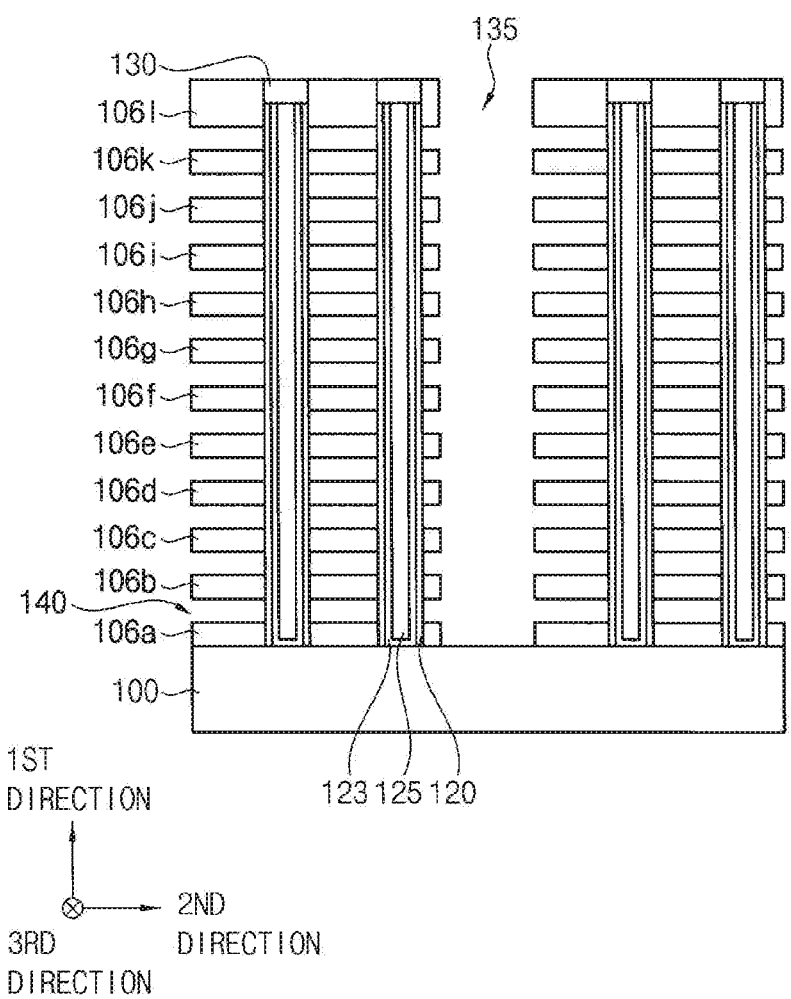

Referring to FIGS. 13 and 14, the sacrificial patterns 108, the sidewalls of which are exposed by the opening 135 may be removed. In example embodiments, the sacrificial patterns 108 may be removed by a wet etching process using, e.g., phosphoric acid and/or sulfuric acid as an etchant solution.

A gap 140 may be defined by a space from which the sacrificial pattern 108 is removed. A plurality of the gaps 160 may be formed along the first direction. Each gap 140 may be formed between the adjacent insulating interlayer patterns 106. Outer sidewalls of the dielectric layer structure 120 may be partially exposed by the gap 140.

Figure 15:
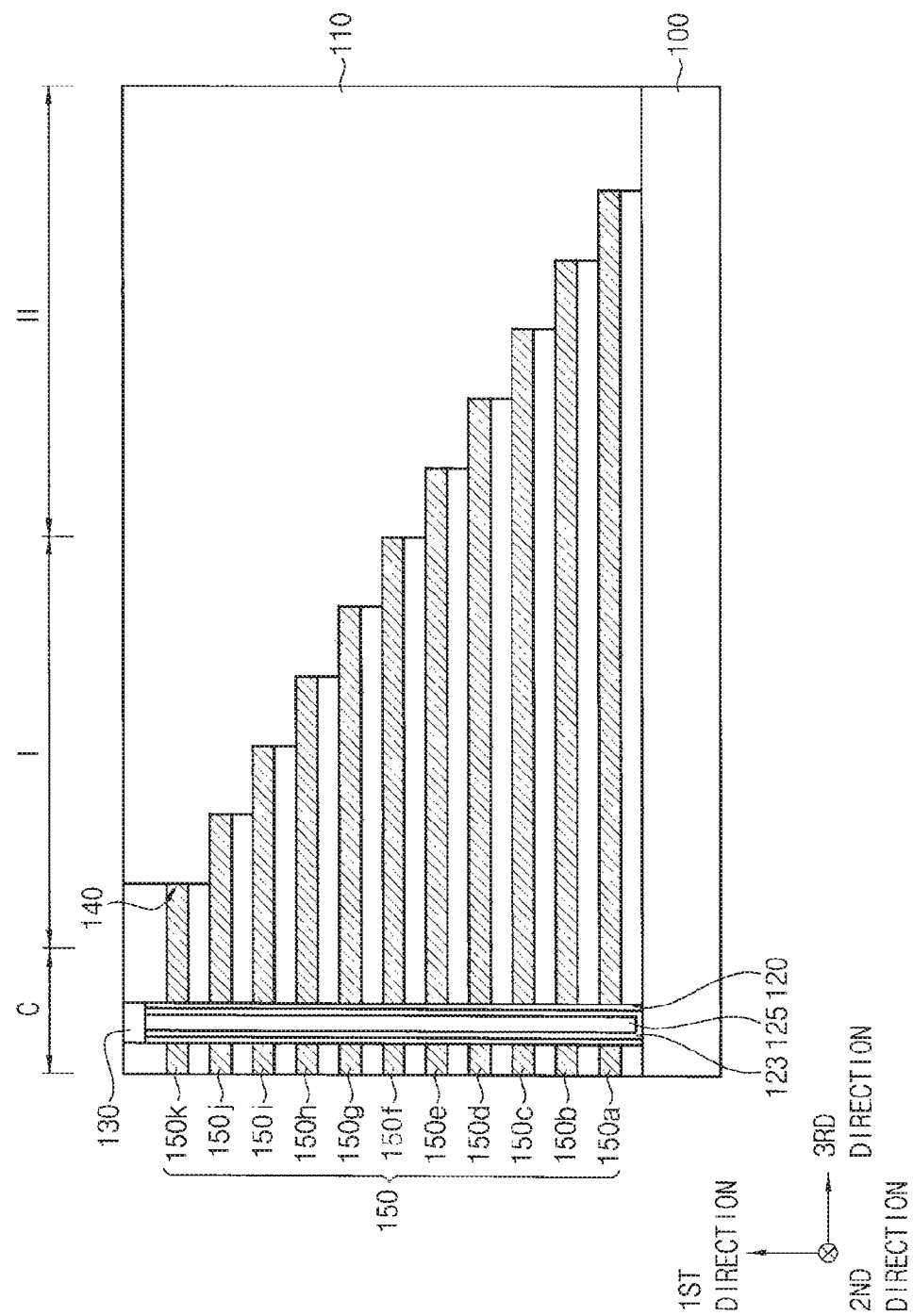
Figure 16:
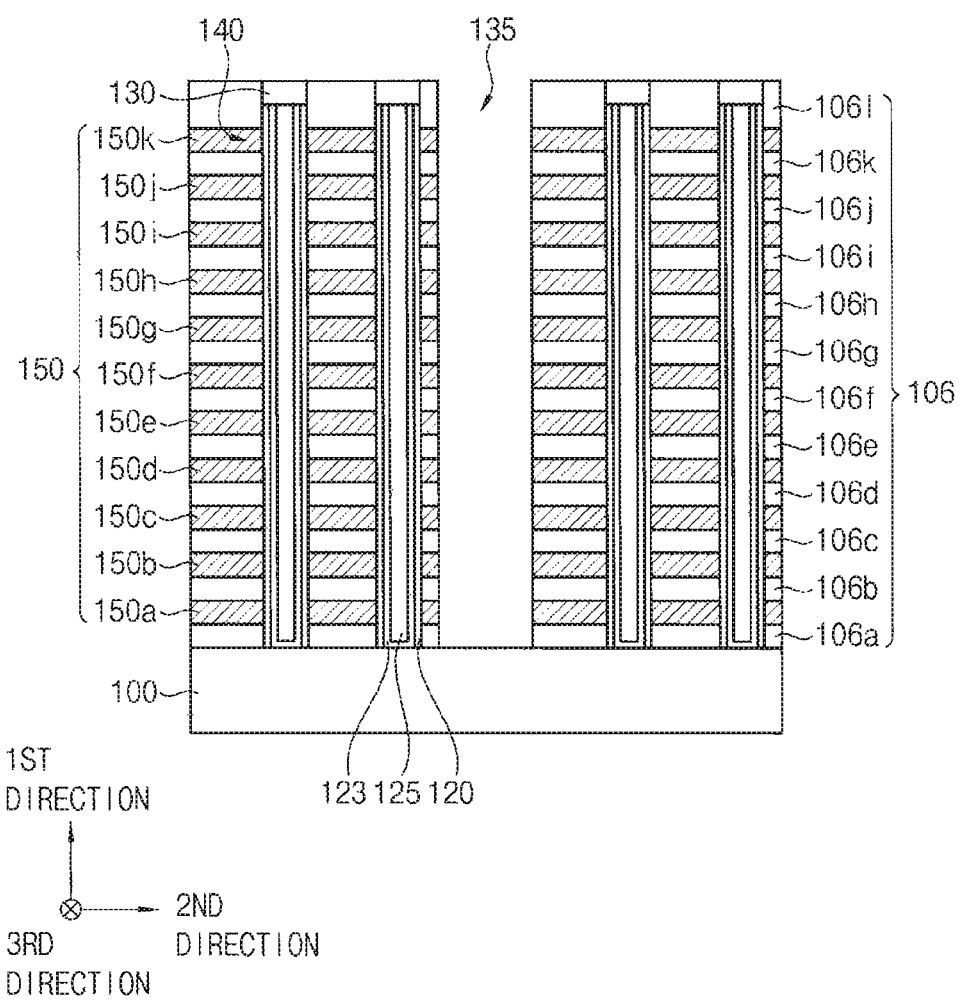
Figure 17:
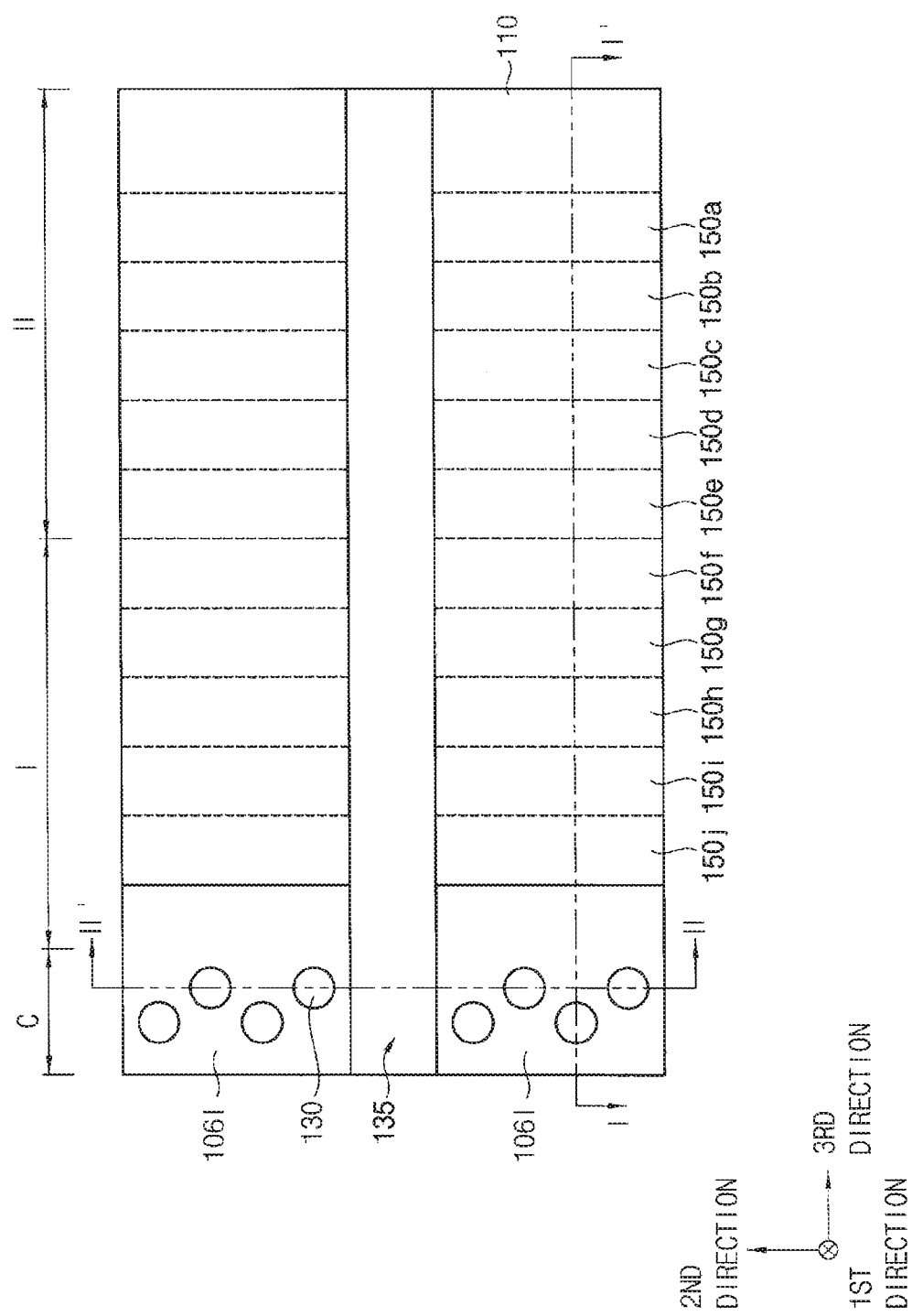

Referring to FIGS. 15 to 17, gate lines 150 (e.g., 150*a* through 150*k*) may be formed in the gaps 140. Accordingly, the sacrificial layer 104 or the sacrificial pattern 108 of each level may be replaced with the gate line 150.

In example embodiments, a gate electrode layer may be formed on the exposed outer sidewalls of the dielectric layer structure 120, surfaces of the insulating interlayer patterns 106, the exposed top surface of the substrate 100 and top surfaces of the pads 130. The gate electrode layer may sufficiently fill the gaps 140 and at least partially fill the opening 135. The gate electrode layer may also cover the top surface of the mold protection layer 110.

The gate electrode layer may be formed using a metal or a metal nitride having low electrical resistance and work function. For example, the gate electrode layer may be formed of tungsten, tungsten nitride, titanium, titanium nitride, tantalum, tantalum nitride, platinum, etc. In example embodiments, the gate electrode layer may be formed as a multi-layered structure including a barrier layer formed of a metal nitride, and a metal layer. The gate electrode layer may be formed by a CVD process, a PECVD process, an ALD process, a PVD process, a PVD process, a sputtering process, etc.

In example embodiments, an additional blocking layer may be formed along inner walls of the gaps 140 and the surfaces of the insulating interlayer patterns 106 prior to the formation of the gate electrode layer. The additional blocking layer may be formed of silicon oxide or a metal oxide.

Subsequently, the gate electrode layer may be partially removed to form the gate line 150 in the gap 140 at each level.

For example, an upper portion of the gate electrode layer may be planarized by a CMP process until an uppermost insulating interlayer pattern 106*l* and/or the mold protection layer 110 may be exposed. Portions of the gate electrode layer formed in the opening 135 and on the top surface of the substrate 100 may be etched to obtain the gate lines 150. The gate electrode layer may be partially etched by a wet etching process using, e.g., a hydrogen peroxide-containing solution.

The gate lines 150 may include the GSL, the word line and the SSL sequentially stacked and spaced apart from one another in the first direction. For example, a lowermost gate line 150*a* may serve as the GSL. The gate lines 150*b* to 150*i* on the GSL may serve as the word lines. The gate lines 150*j* and 150*k* at two levels on the word line may serve as the SSL.

The gate line 150 at each level may surround the desired (and/or alternatively predetermined) number of the channel rows, e.g., four channel rows. Accordingly, a gate line structure may be defined by the gate lines 150 that are stacked in the first direction, surround the desired (and/or alternatively predetermined) number of the channel rows and extend in the third direction. A plurality of the gate line structures may be defined by the opening 135, and may be arranged along the second direction In example embodiments, the gate line structure may have a pyramidal shape or a stepped shape substantially the same as or similar to the shape of the stepped mold structure. For example, the gate line 150 at each level may include a step portion protruding in the third direction from an upper gate structure 150 thereof.

Figure 18:
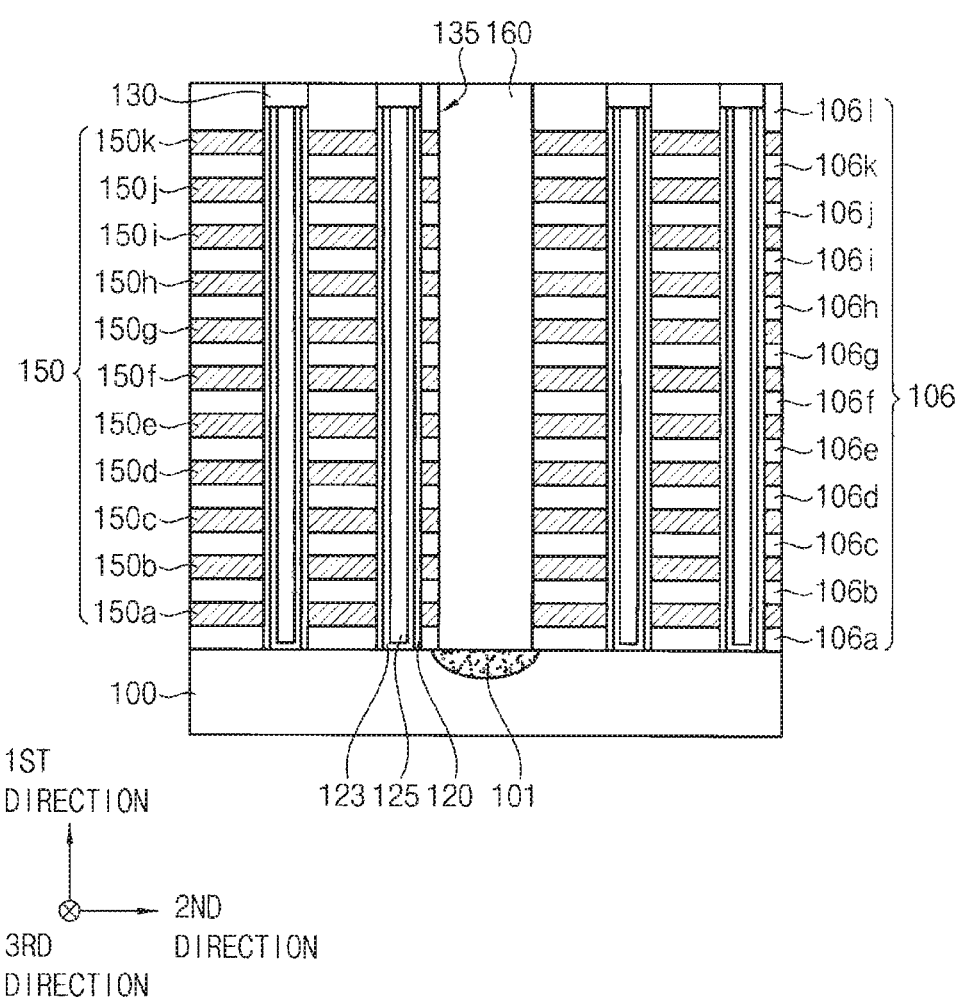
Figure 19:
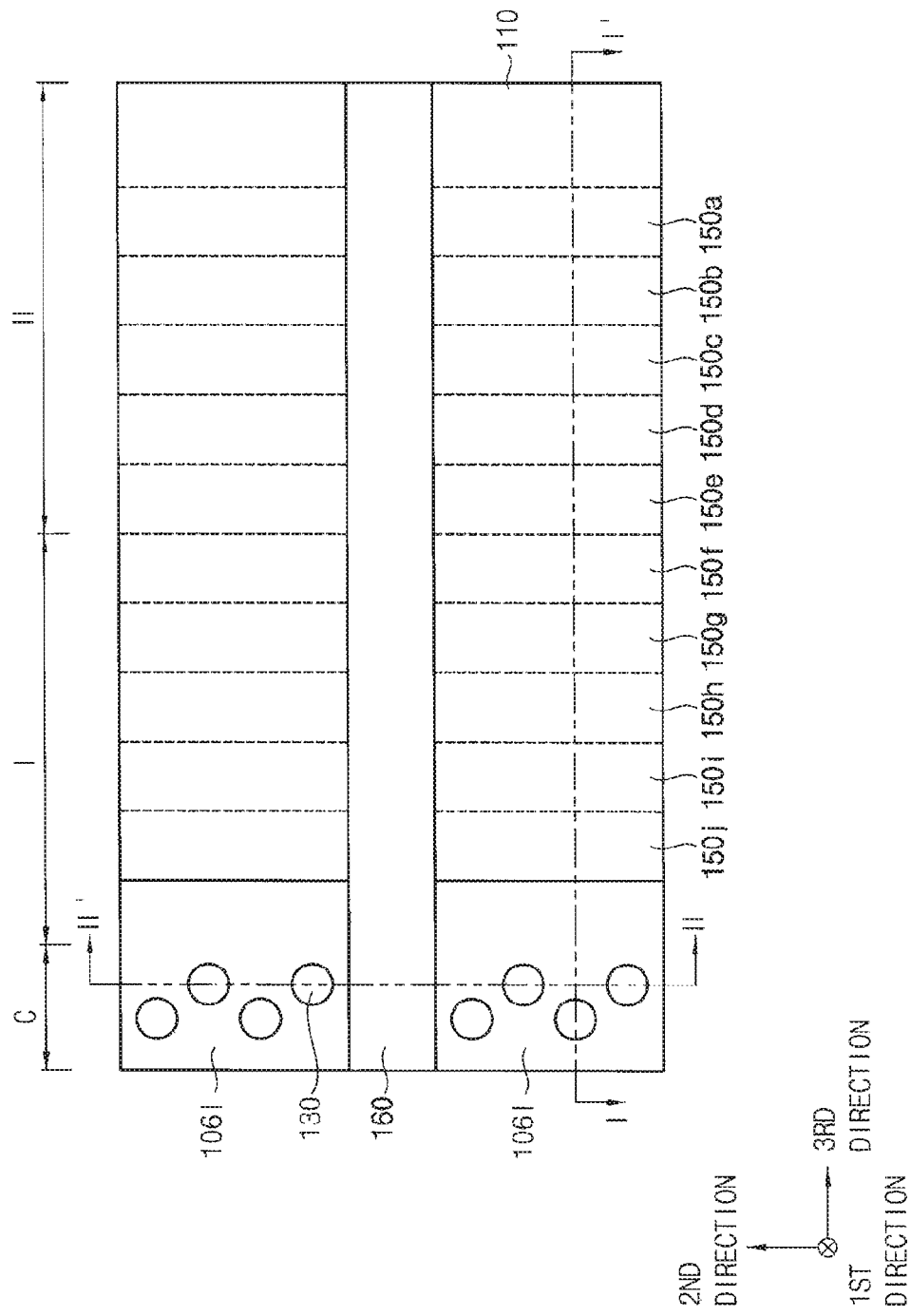

Referring to FIGS. 18 and 19, an impurity region 101 may be formed at an upper portion of the substrate 100 exposed through the opening 135, and a second filling pattern 160 may be formed in the opening 135.

For example, n-type impurities such as P or As may be implanted through the opening 135 to form the impurity region 101. The impurity region 101 may serve as a CSL extending in the third direction. In example embodiments, a metal silicide pattern (not illustrated) including, e.g., nickel silicide or cobalt silicide may be further formed on the impurity region 101 to reduce a resistance of the CSL.

An insulation layer sufficiently filling the opening 135 may be formed on the impurity region 101, the uppermost insulating interlayer pattern 106*l*, the pad 130 and the mold protection layer 110. An upper portion of the insulation layer may be planarized by a CMP process or an etch-back process until the uppermost insulating interlayer pattern 106*l* is exposed to form the second filling pattern 160. The insulation layer may be formed of, e.g., silicon oxide.

Figure 20:
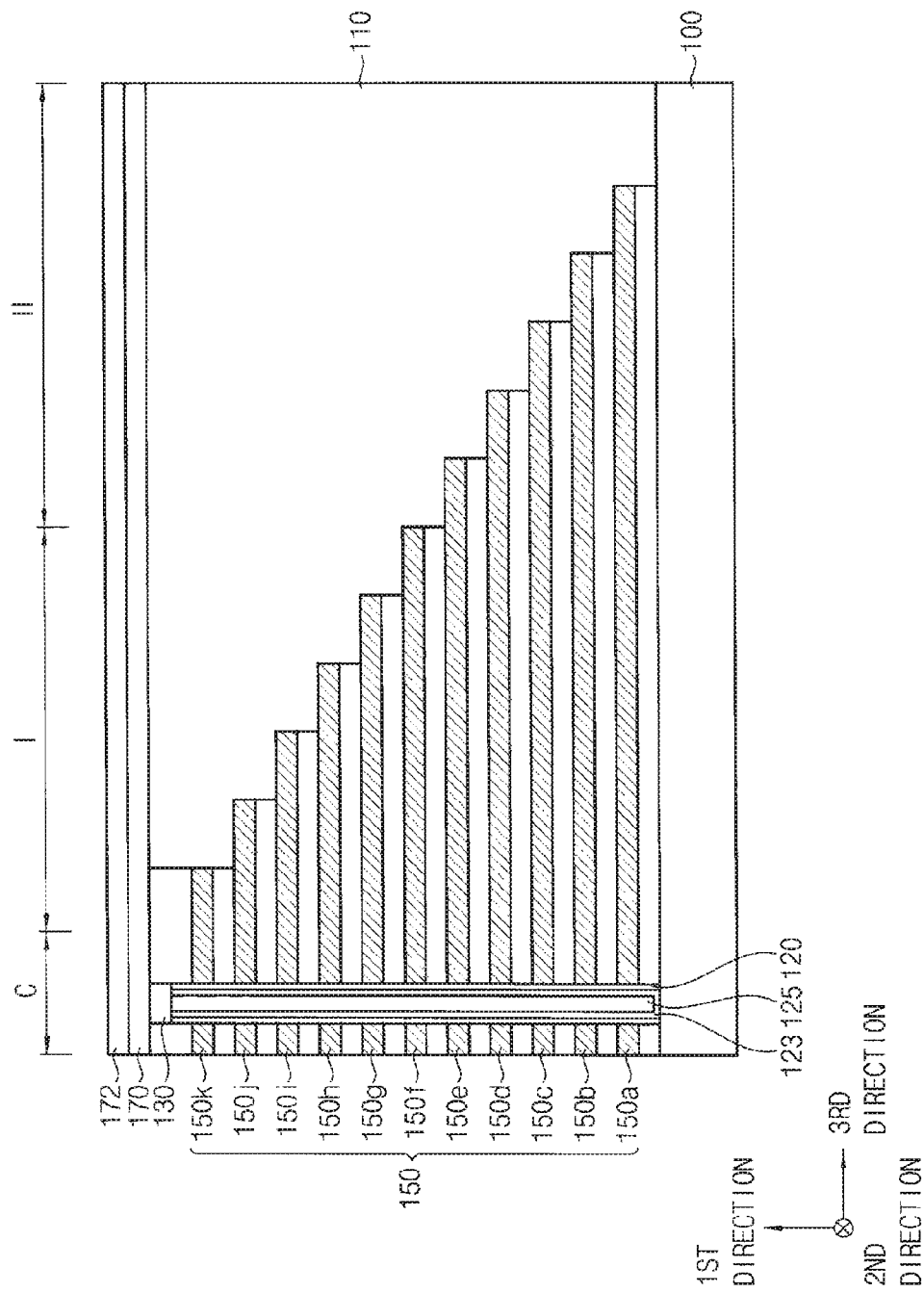

Referring to FIG. 20, a first mask layer 170 may be formed on the uppermost insulating interlayer pattern 106*l*, the mold protection layer 110 and the pads 130, and a first photoresist layer 172 may be formed on the first mask layer 170.

The first mask layer 170 may include, e.g., an amorphous carbon film. The first mask layer 170 and the first photoresist layer 172 may be formed on the plurality of the gate line structures 150, and may extend continuously on the channel region C, the first region I and the second region II.

Figure 21:
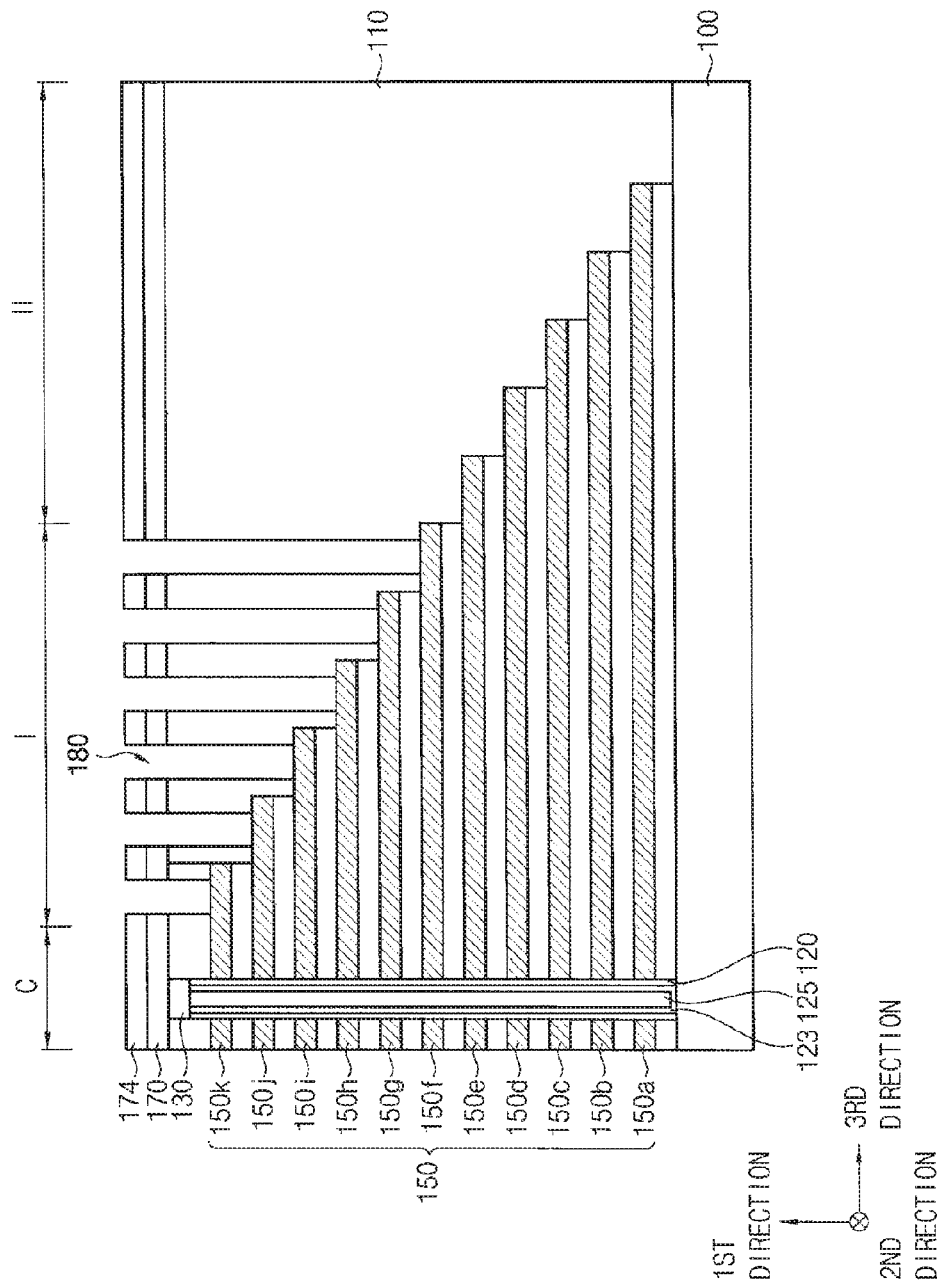
Figure 22:
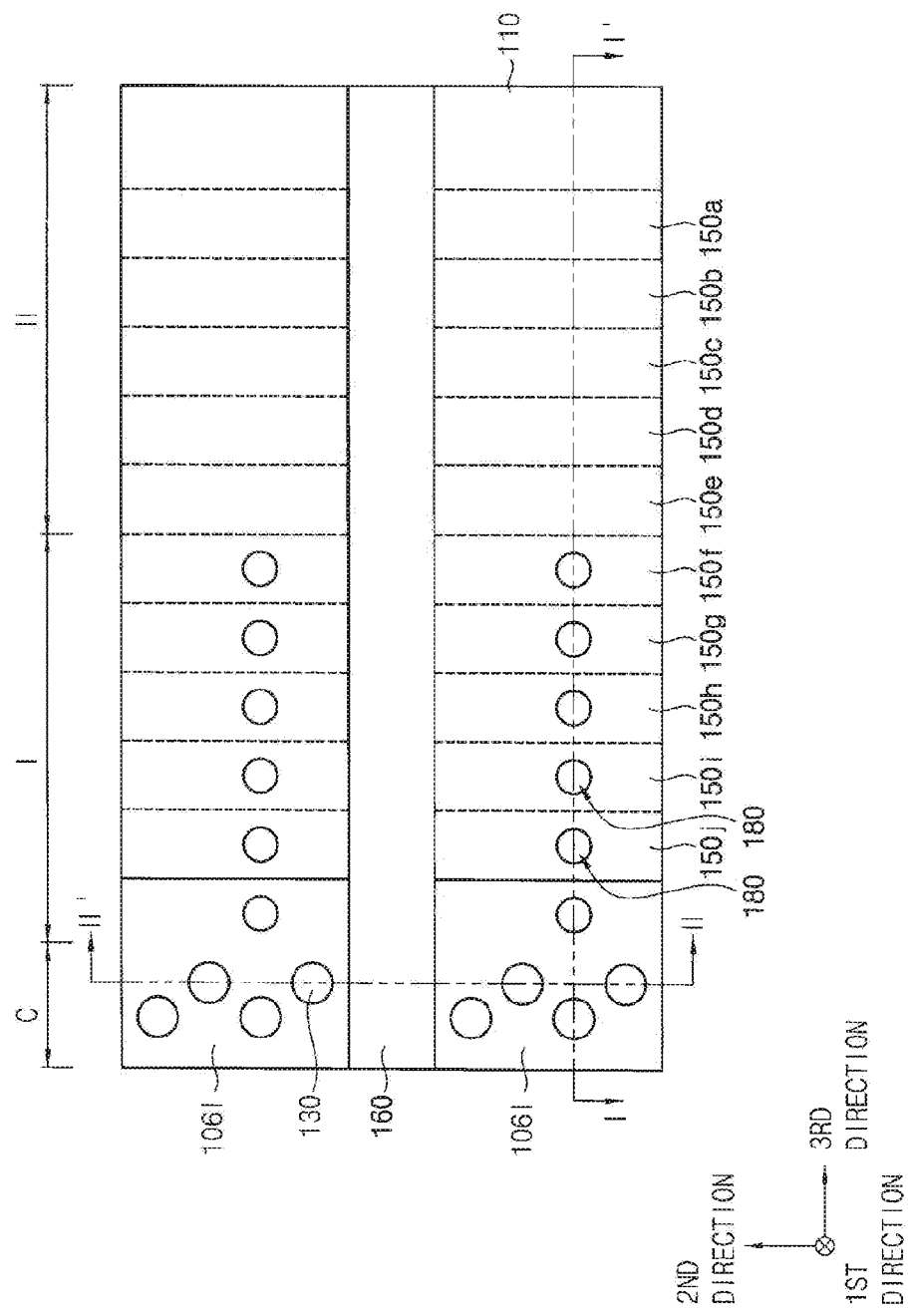

Referring to FIGS. 21 and 22, exposure and developing processes may be performed to partially remove a portion of the first photoresist layer 172 formed on the first region I such that a first photoresist pattern 174 may be formed.

The first mask layer 170 may be partially removed using the first photoresist pattern 174 as an etching mask, and then the uppermost insulating interlayer pattern 106*l* and the mold layer 110 may be partially removed to form first contact holes 180.

In example embodiments, top surfaces of the step portions of the gate lines 150 (e.g., 150*k* to 150*f*) included in the first region I may be exposed through the first contact holes 180.

Figure 23:
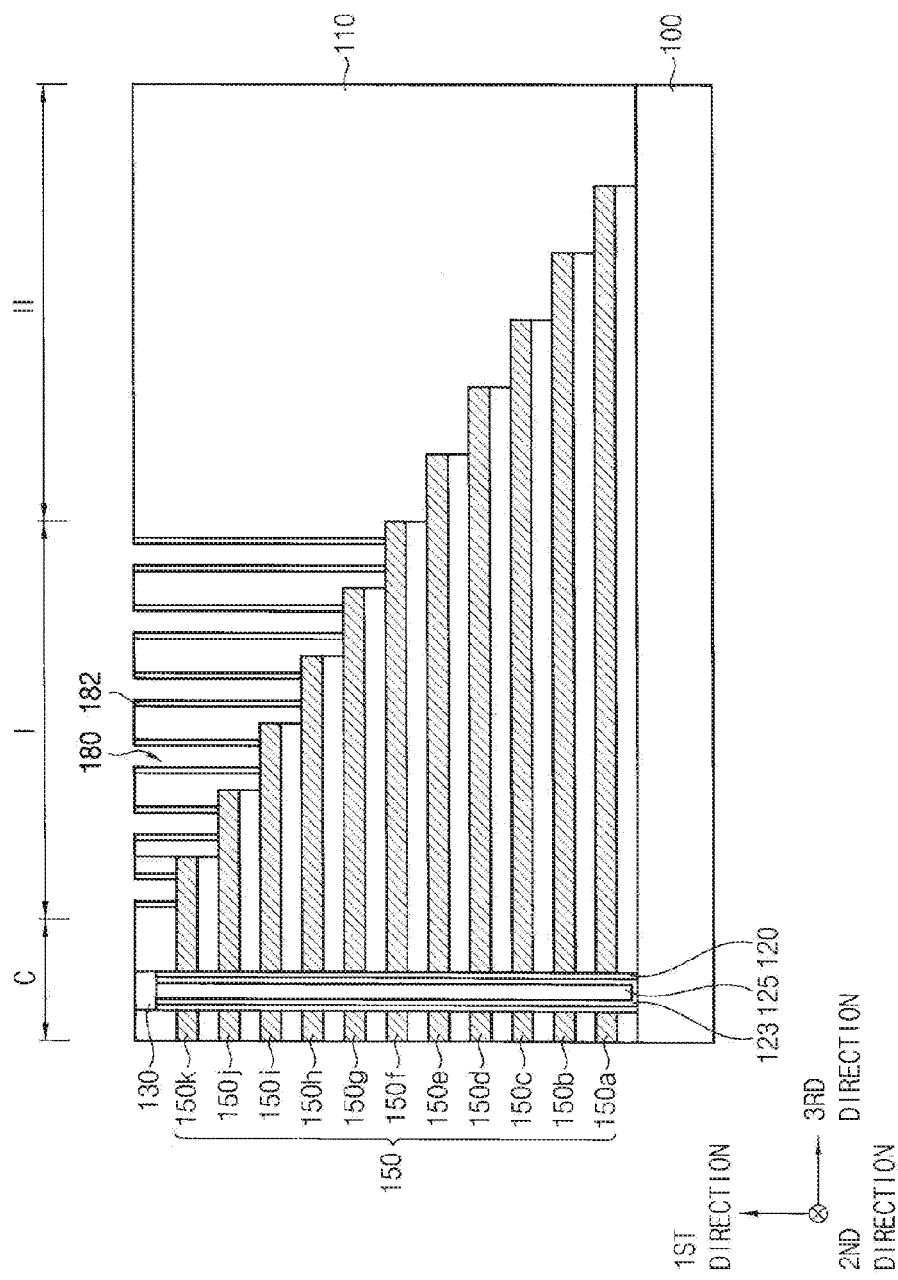
Figure 24:
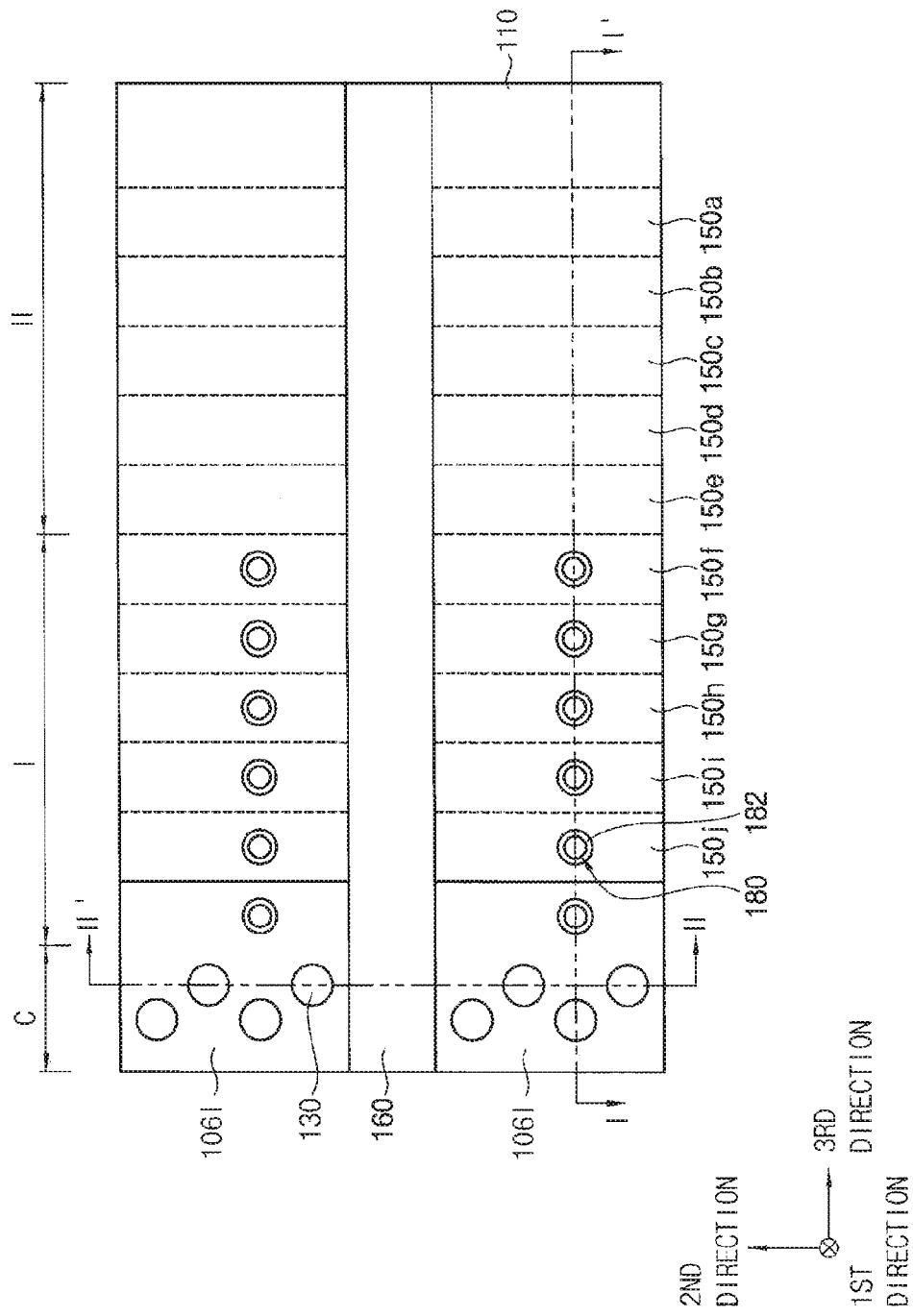

Referring to FIGS. 23 and 24, the first photoresist pattern 174 and the first mask layer 170 may be removed by, e.g., an ashing process and/or a strip process. Subsequently, a first contact spacer 182 may be formed on a sidewall of each first contact hole 180.

For example, a first spacer layer may be formed conformally on top surfaces of the uppermost insulating interlayer pattern 106*l*, the mold protection layer 110 and the pads 130, and on the sidewalls and bottoms of the first contact holes 180. The first spacer layer may be formed of silicon nitride or silicon oxynitride by a CVD process, a PECVD process, a sputtering process or an ALD process.

Portions of the first spacer layer formed on the top surfaces of the uppermost insulating interlayer pattern 106*l*, the mold protection layer 110 and the pads 130, and on the bottoms of the first contact holes 180 may be removed by an etch-back process. Thus, the first contact spacer 182 may be defined on the sidewall of the each first contact hole 180 from remaining portions of the first spacer layer. Further, the top surfaces of the step portions of the gate lines 150 (e.g., 150*k* to 150*f*) may be exposed again.

Figure 25:
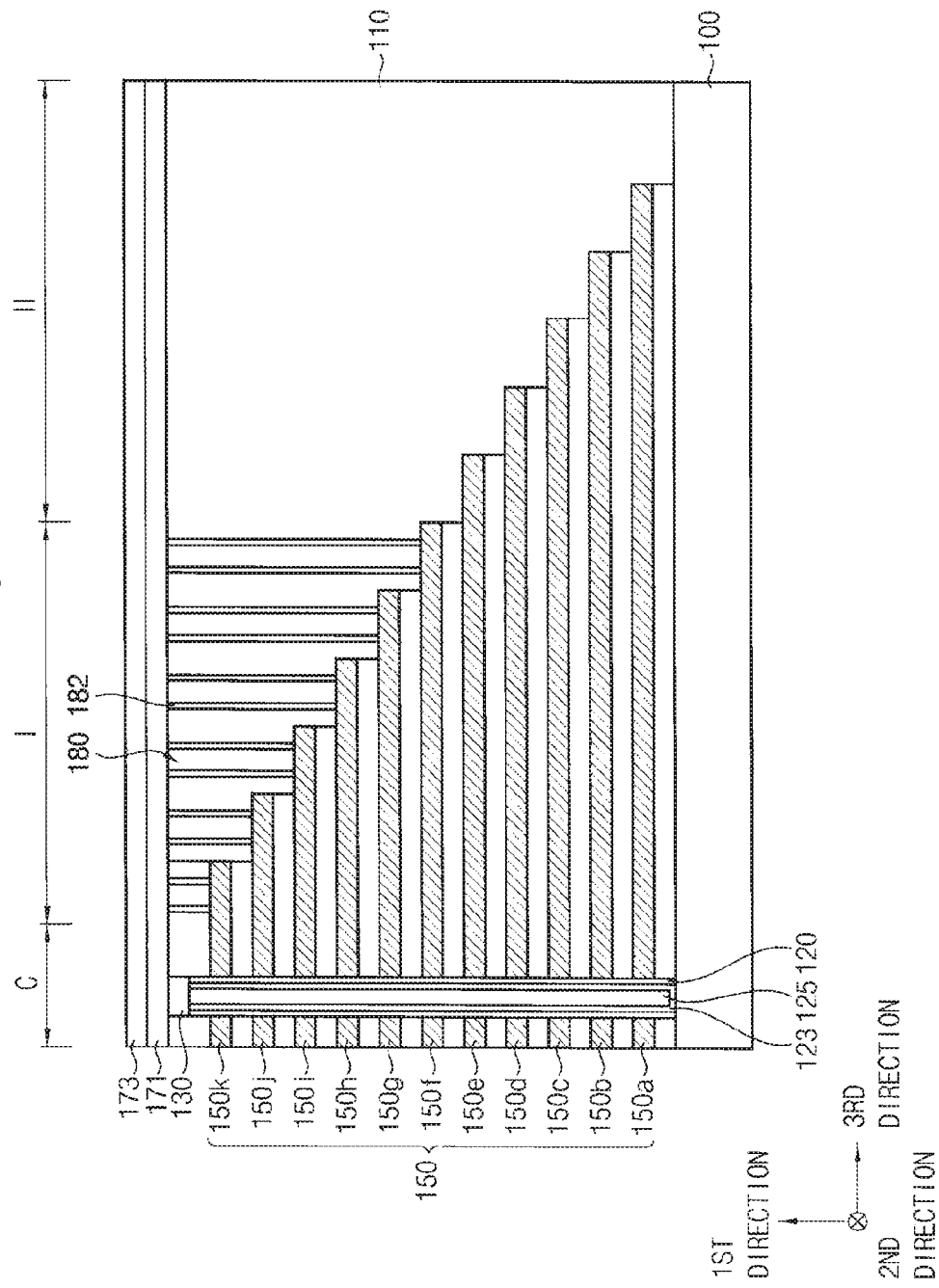

Referring to FIG. 25, a second mask layer 171 capping the first contact holes 180 may be formed on the uppermost insulating interlayer pattern 106*l*, the mold protection layer 110 and the pads 130. A second photoresist layer 173 may be formed on the second mask layer 171.

The second mask layer 171 may include an amorphous carbon film substantially the same as or similar to that of the first mask layer 170.

The second mask layer 171 may be formed in a low step coverage-condition to overhang the first contact holes 180. In some embodiments, the second mask layer 171 may at least partially fill the first contact holes 180.

Figure 26:
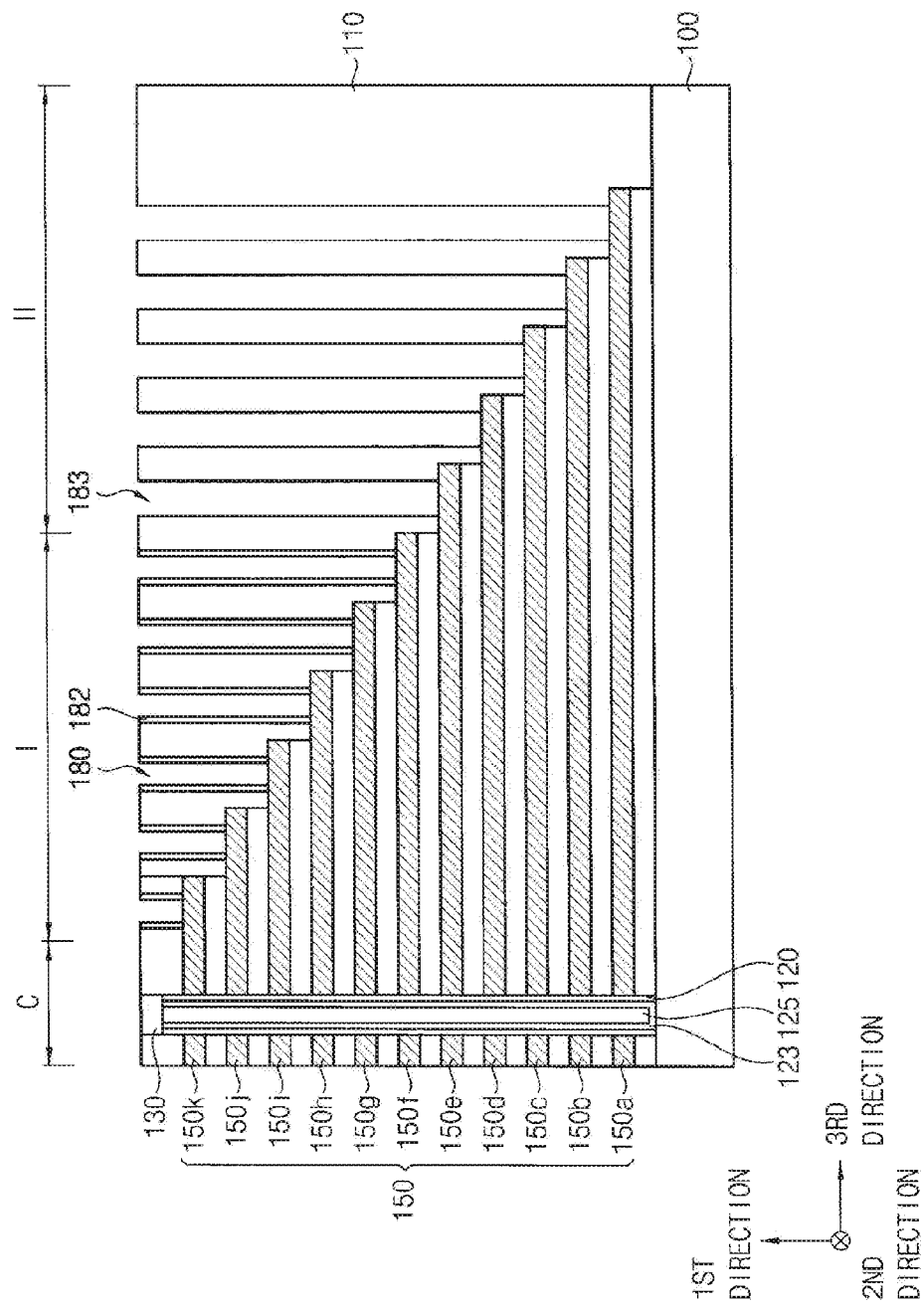
Figure 27:
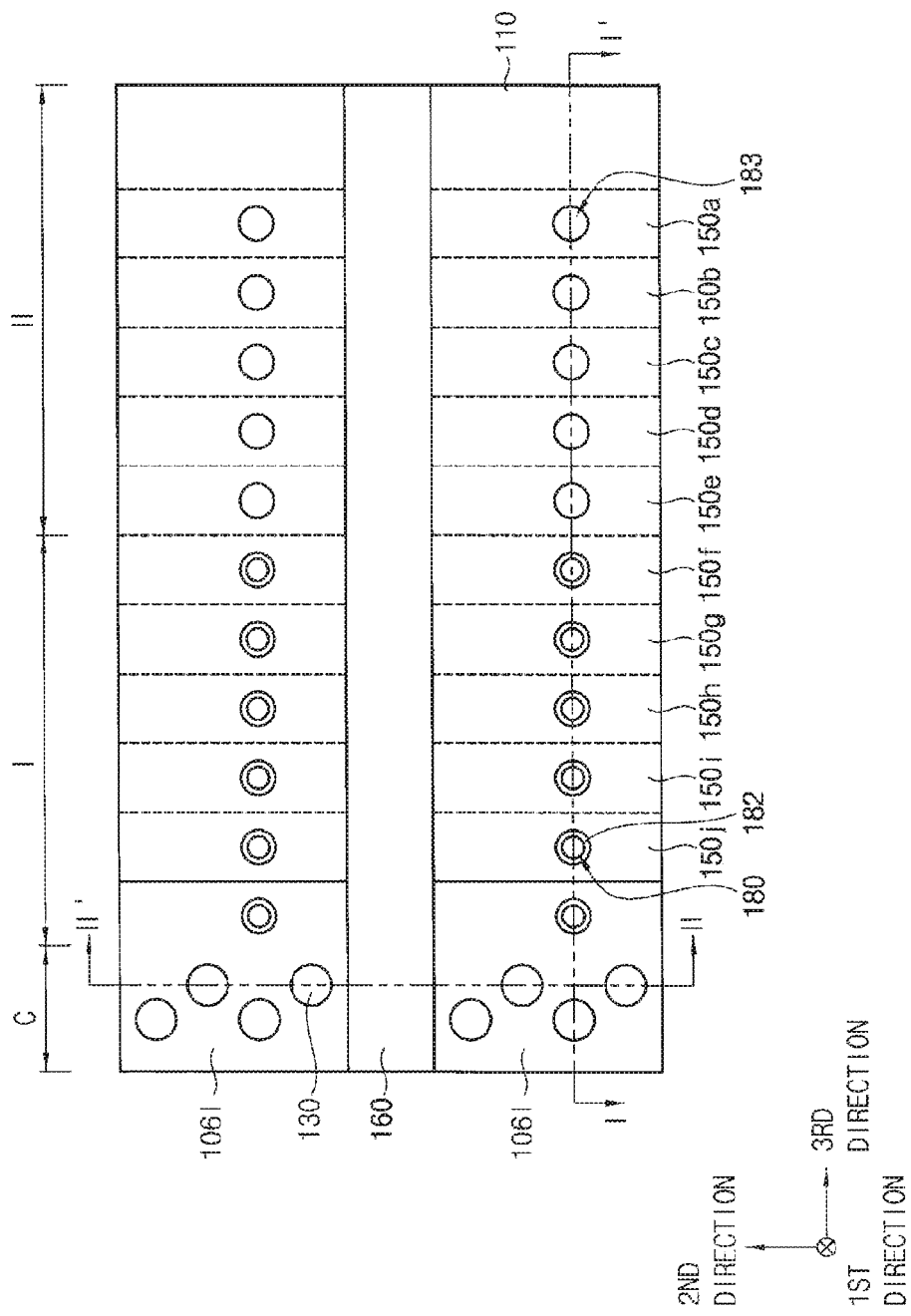

Referring to FIGS. 26 and 27, a portion of the second photoresist layer 173 formed on the second region II may be partially removed by, e.g., exposure and developing processes to form a second photoresist pattern. The second mask layer 171 and the mold protection layer 110 may be partially removed using the second photoresist pattern as an etching mask to form second contact holes 183.

In example embodiments, top surfaces of the step portions of the gate lines 150 (e.g., 150*e* to 150*a*) included in the second region II may be exposed through the second contact holes 183.

The second photoresist pattern and the second mask layer 171 may be removed by an ashing process and/or a strip process after the formation of the second contact holes 183.

According to example embodiments as described above, contact holes formed on the step portions of the gate lines 150 may be formed by, e.g., a 2-step photo process. For example, the first contact holes 180 may be formed by a first photo process, and the second contact holes 183 may be formed by a second photo process.

In a comparative example where contact holes are formed by a single photo process simultaneously, the contact holes having different heights due to a stepped structure may not be easily formed. For example, while forming the contact hole on a lowermost gate line 150*a*, an uppermost gate line 150*k* may be damaged from an excessive exposure to an etching process, and profiles of upper contact holes may be also damaged or degraded. As the number of levels of the gate line structure becomes greater, the above-mentioned problems from the single photo-process may be exacerbated.

However, according to example embodiments, a process for forming the contact holes may be divided by at least two photo processes, so that the contact holes having a regular sidewall profile may be achieved without damaging the gate lines 150.

In example embodiments, the first contact spacer 182 may be formed on the sidewall of the first contact hole 180. Thus, a diffusion of an etching residue such as an etching gas generated when the first contact hole 180 is formed may be blocked by the first contact spacer 182. Accordingly, damages of, e.g., the second mask layer 171 and the second photoresist layer 173 by the etching residue may be avoided during an etching process for the formation of the second contact hole 183. Therefore, the sidewall profile of the first contact hole 180 may be uniformly maintained.

In a comparative example, forming contact spacers simultaneously on sidewalls of entire contact holes may be considered. However, while performing an etch-back process on a spacer layer for the formation of the contact spacers, upper gate lines 150 may be damaged, and the spacer layer may not be removed uniformly because of height differences of the contact holes 180 and 183.

However, according to example embodiments, the first contact spacers 182 may be formed selectively on the first contact holes 180 which may be formed by the first photo process in consideration of the number and an order of entire etching processes. Therefore, structural and mechanical reliability of the gate lines 150 and the contact holes 180 and 183 may be improved through the plurality of the photo processes.

Figure 28:
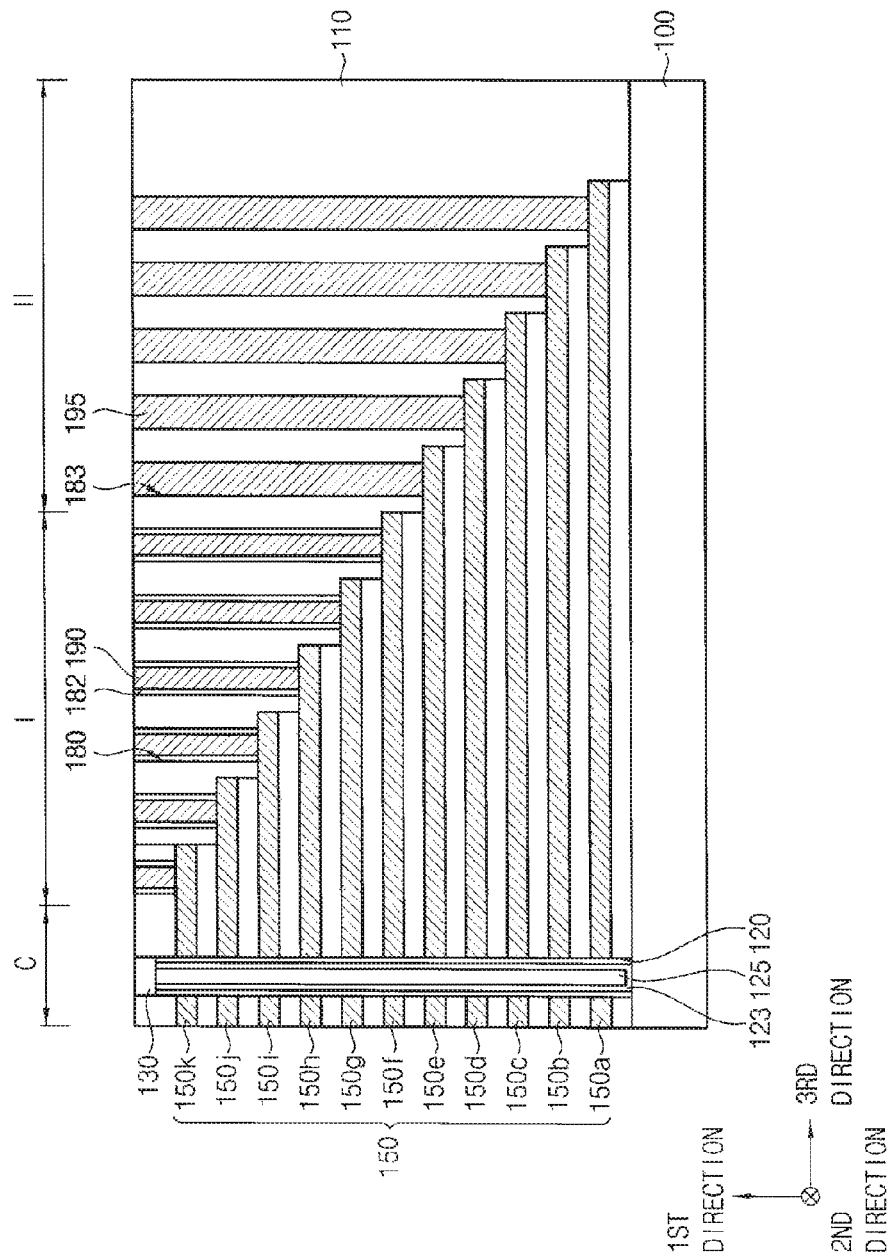
Figure 29:
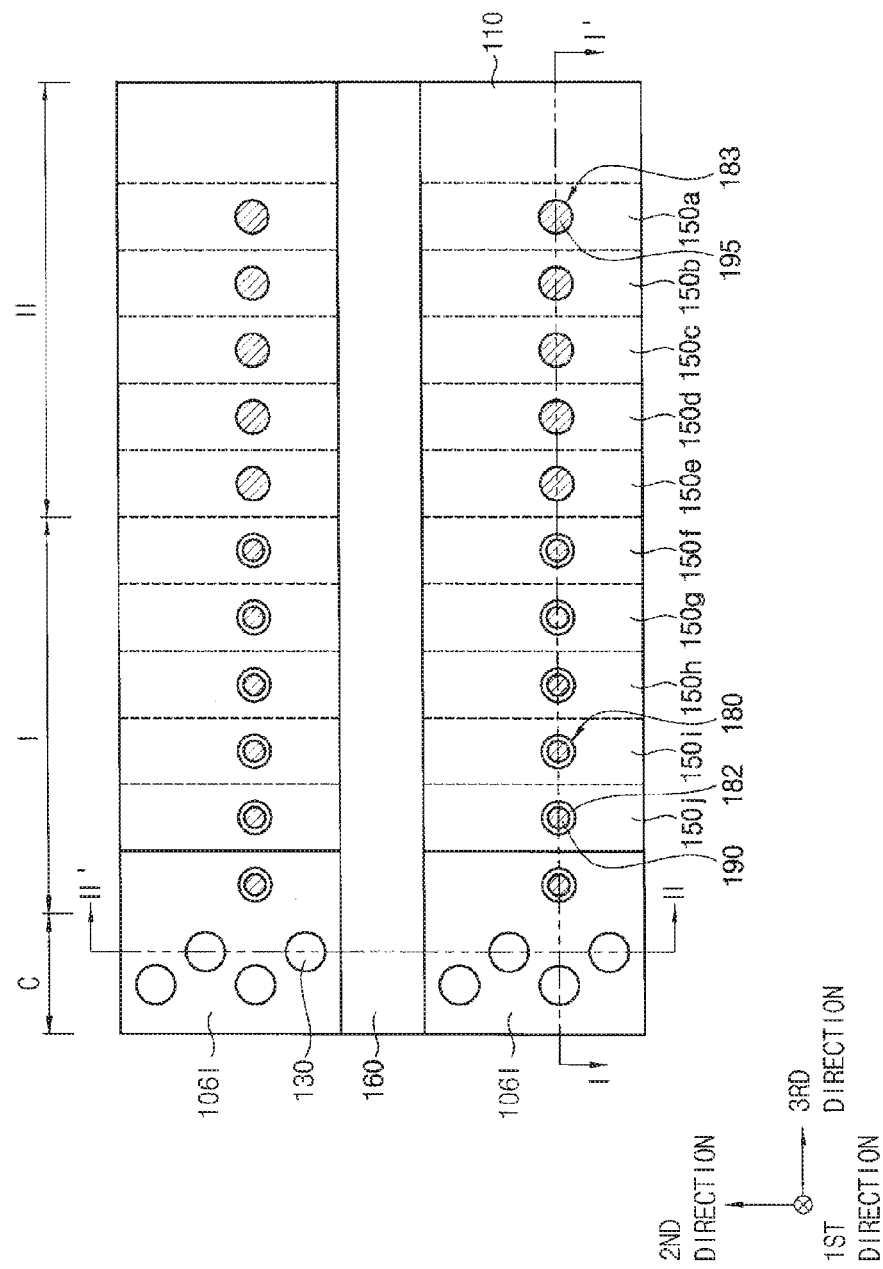

Referring to FIGS. 28 and 29, a first contact 190 and a second contact 195 may be formed in the first contact hole 180 and the second contact hole 183, respectively.

For example, a conductive layer filling the first and second contact holes 180 and 183 may be formed on the uppermost insulating interlayer pattern 106*l*, the mold protection layer 110 and the pads 130. The conductive layer may be formed of a metal, a metal nitride and/or doped polysilicon by a sputtering process or an ALD process.

An upper portion of the conductive layer may be planarized by a CMP process until the uppermost insulating interlayer pattern 106*l*, the mold protection layer 110 and/or the pads 130 are exposed to form the first and second contacts 190 and 195.

In example embodiments, as illustrated in FIG. 2, wirings 197 electrically connected to the first contacts 190 and the second contacts 195 may be further formed on the first region I and the second region II. A bit line 199 electrically connected to a plurality of the pads 130 may be further formed on the channel region C.

Figure 30:
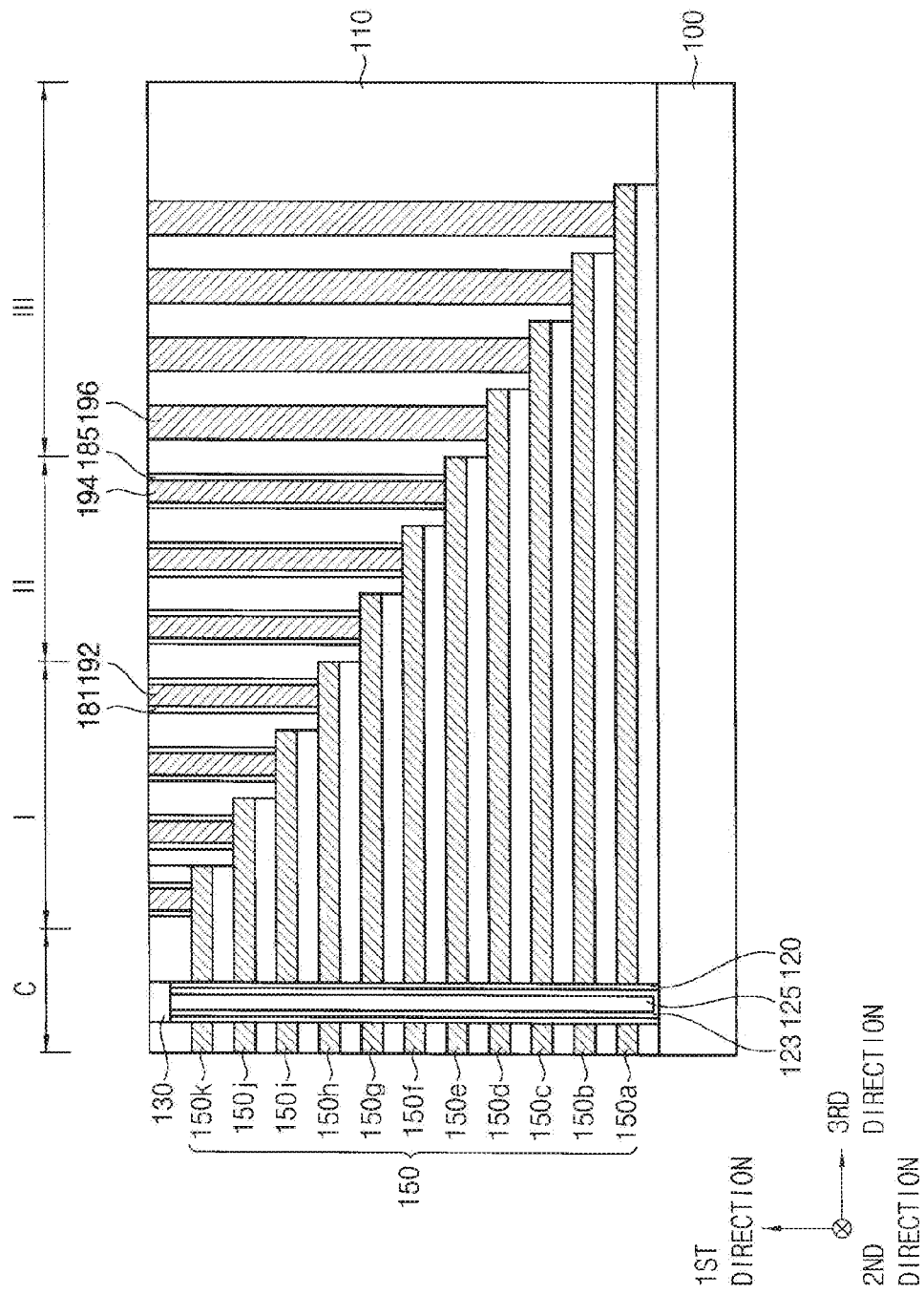
FIGS. 30 and 31 are a cross-sectional view and a top plan view, respectively, illustrating a vertical memory device in accordance with example embodiments.
Figure 31:
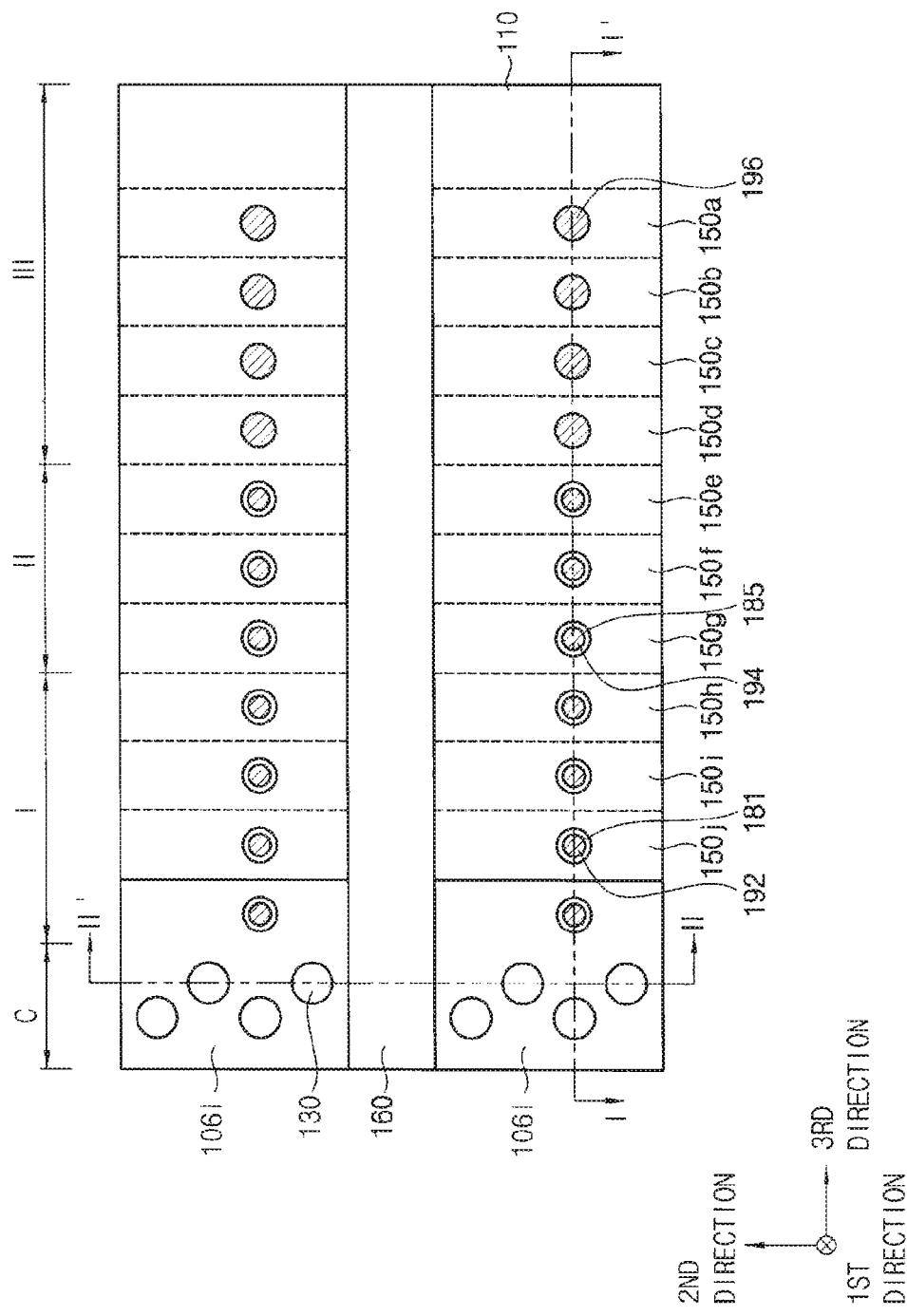

FIGS. 30 and 31 are a cross-sectional view and a top plan view, respectively, illustrating a vertical memory device in accordance with example embodiments. For example, FIG. 31 is a cross-sectional view taken along a line I-I' of FIG. 30.

Detailed descriptions on elements and/or structures substantially the same as or similar to those illustrated with reference to FIGS. 1 and 2 are omitted herein, and like reference numerals are used to designate like elements.

For convenience of descriptions, FIGS. 30 and 31 illustrate that a gate line structure has the number of levels the same as that of the gate line structure illustrated in FIGS. 1 and 2. However, the gate line structure of FIGS. 30 and 31 may have the number of levels greater than that of the gate line structure illustrated in FIGS. 1 and 2.

Referring to FIGS. 30 and 31, a substrate 100 of the vertical memory device may include a channel region C, a first region I, a second region II and a third region III. Step portions of gate lines 150 may be distributed in the first to third regions I, II and III. For example, some step portions of upper levels may be included in the first region I, some step portions of middle levels may be included in the second region II, and some step portions of lower levels may be included in the third region III.

First contacts 192 and second contacts 194 may be landed on the step portions of the gate lines 150 included in the first region I and the second region II, respectively. A first contact spacer 181 and a second contact spacer 185 may be formed on sidewalls of the first contact 192 and the second contact 194, respectively.

Third contacts 196 may be landed on the step portions of the gate lines 150 included in the third region III. In example embodiments, a contact spacer may not be formed on a sidewall of the third contact 196. In this case, the third contact 196 may be in contact with the mold protection layer 110.

As described above, as the number of levels included in the vertical memory device or the gate line structure becomes higher, the substrate 100 may be divided into more specific regions, and regions for the formation of the contact spacers may be selected in consideration of a process order and the number of photo processes. FIGS. 30 and 31 illustrate that the step portions are distributed throughout 3 regions. However, the step portions may be distributed throughout at least 4 regions in consideration of the number of levels of the vertical memory device.

FIGS. 32 to 38 are cross-sectional views illustrating a method of manufacturing a vertical memory device in accordance with example embodiments. For example, FIGS. 32 to 38 illustrate a method of manufacturing the vertical memory device of FIGS. 30 and 31.

Detailed descriptions on processes and materials substantially the same as or similar to those illustrated with reference to FIGS. 3 to 29.

Figure 32:
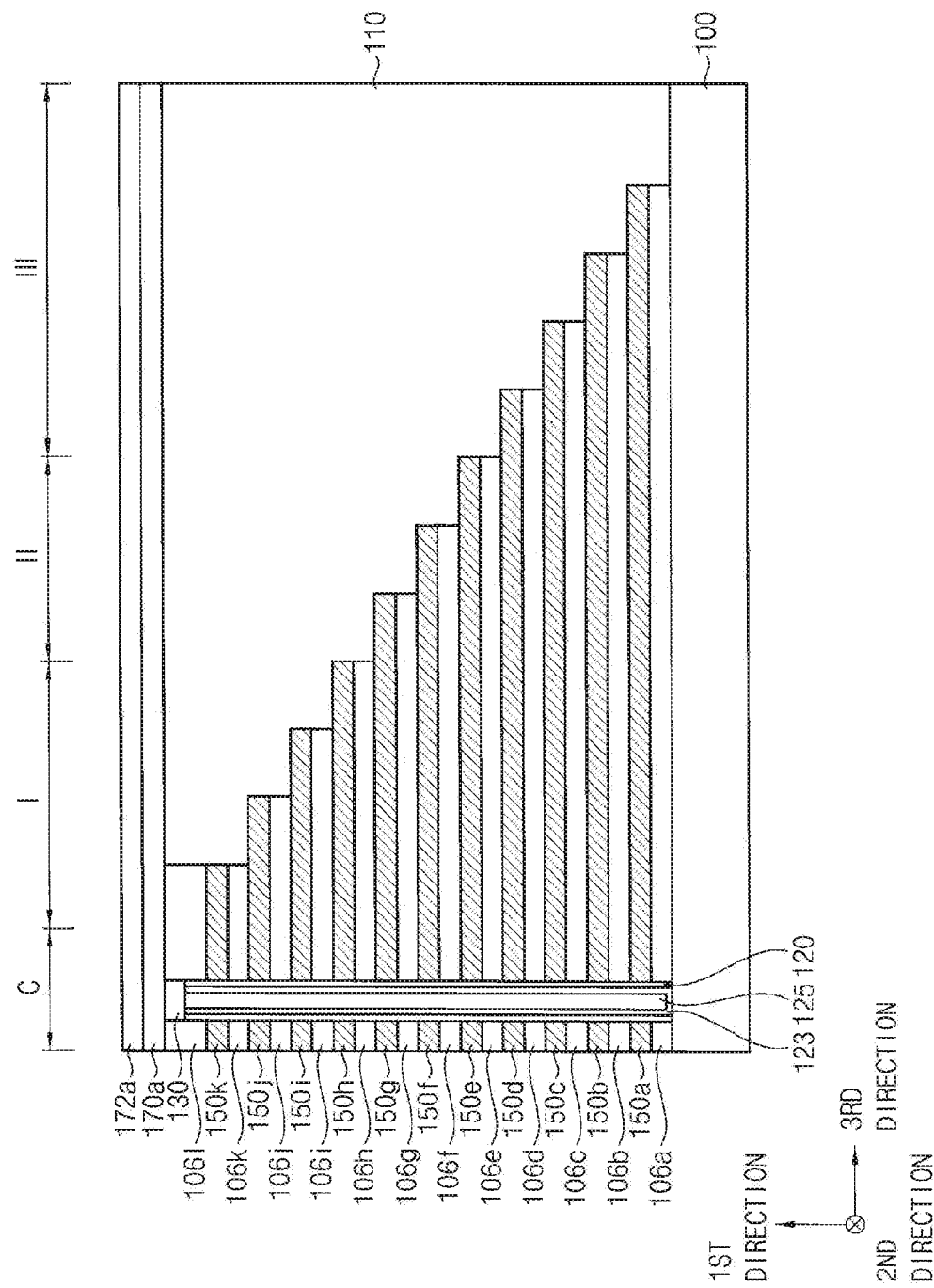
FIGS. 32 to 38 are cross-sectional views illustrating a method of manufacturing a vertical memory device in accordance with example embodiments.

Referring to FIG. 32, process substantially the same as or similar to those illustrated with reference to FIGS. 3 to 20 may be performed.

In example embodiments, a gate line structure may be formed on a substrate 100 including a channel region C, a first region I, a second region II and a third region III. The gate line structure may include insulating interlayer patterns 106 and gate lines 150 stacked in a stepped structure, and may include a vertical channel structure extending in the first direction through the insulating interlayer patterns 106 and the gate lines 150. The vertical channel structure may include a dielectric layer structure 120, a channel 123 and a first filling pattern 125. A pad 130 capping upper portions of the dielectric layer structure 120, the channel 123 and the first filling pattern 125 may be formed.

A first mask layer 170a may be formed on an uppermost insulating interlayer pattern 106l, the pads 130 and a mold protection layer 110, and a first photoresist layer 172a may be formed on the first mask layer 170a.

Figure 33:
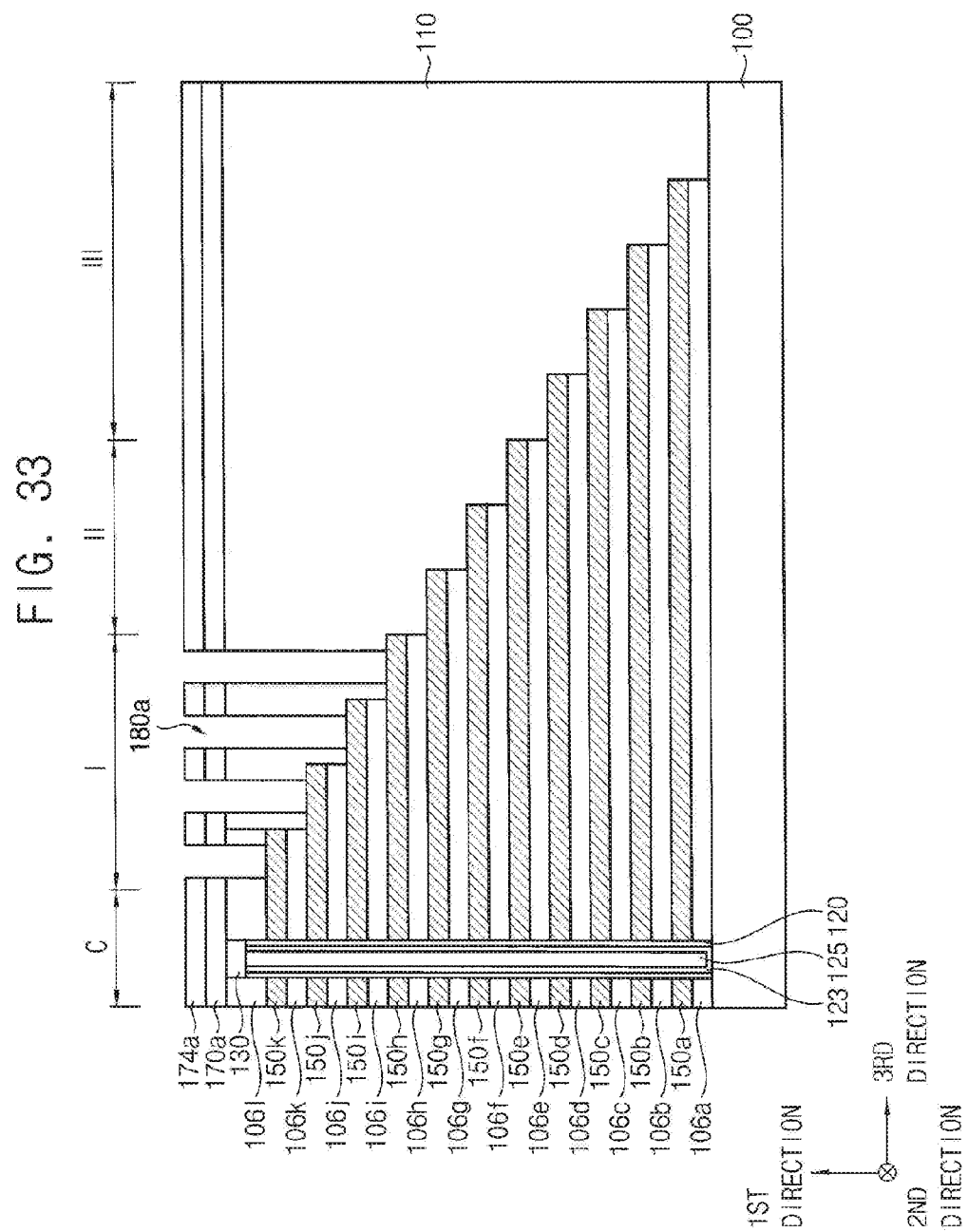

Referring to FIG. 33, a process substantially the same as or similar to that illustrated with reference to FIG. 21 may be performed. For example, the first photoresist layer 172a of the first region I may be partially removed to form a first photoresist pattern 174a. The first mask layer 170a may be etched through the first photoresist pattern 174a, and then the uppermost insulating interlayer pattern 106l or the mold protection layer 110 may be etched to form first contact holes 180a.

Step portions of the gate lines 150 (e.g., 150k through 150h) which may be included in the first region I may be exposed through the first contact holes 180a. The first photoresist pattern 174a and the first mask layer 170a may be removed by an ashing process and/or a strip process after the formation of the first contact holes 180a.

Figure 34:
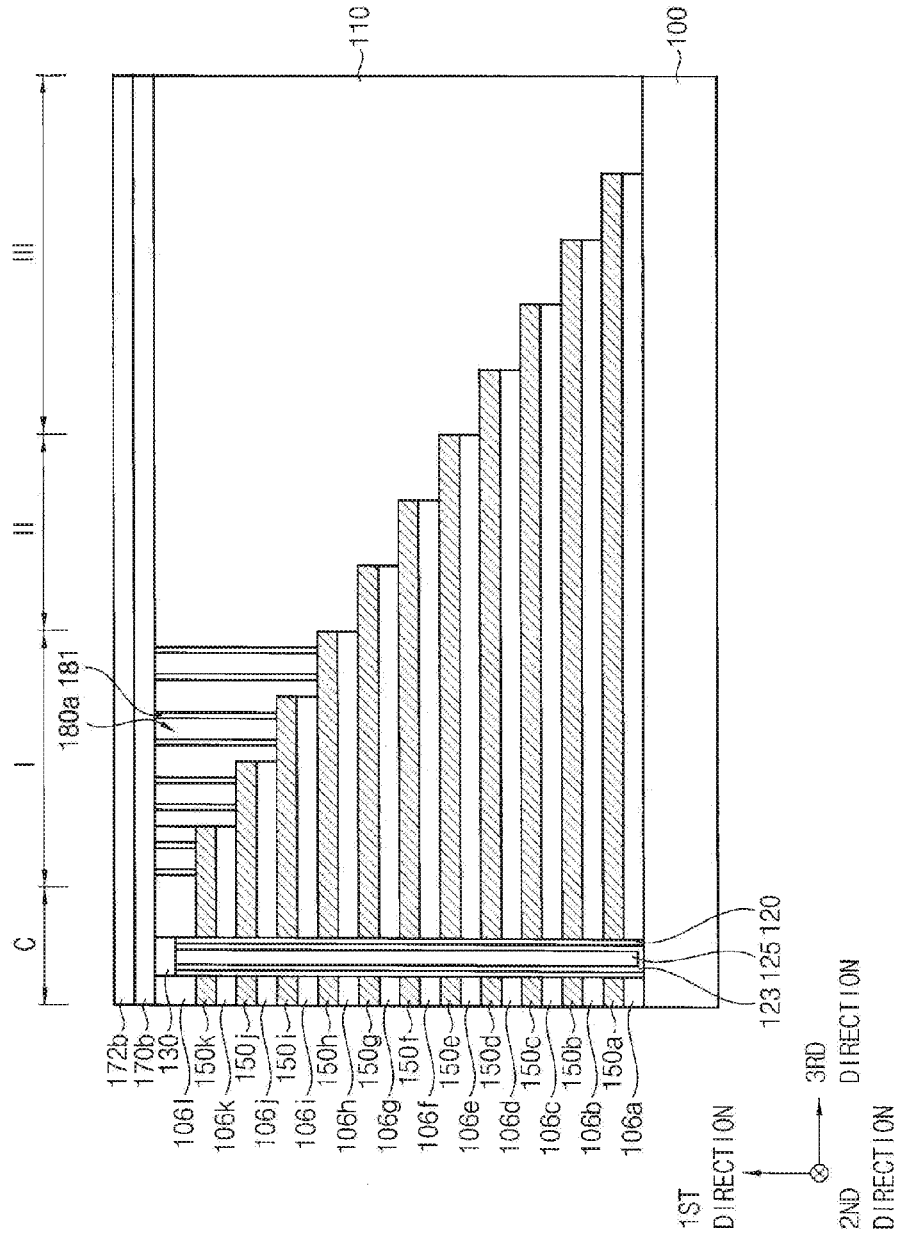

Referring to FIG. 34, a process substantially the same as or similar to that illustrated with reference to FIG. 23 may be performed to form a first contact spacer 181 on a sidewall of each first contact hole 180a.

A second mask layer 170b capping the first contact holes 172b may be formed on the uppermost insulating interlayer pattern 106l, the pads 130 and the mold protection layer 110. A second photoresist layer 172b may be formed on the second mask layer 170b.

Figure 35:
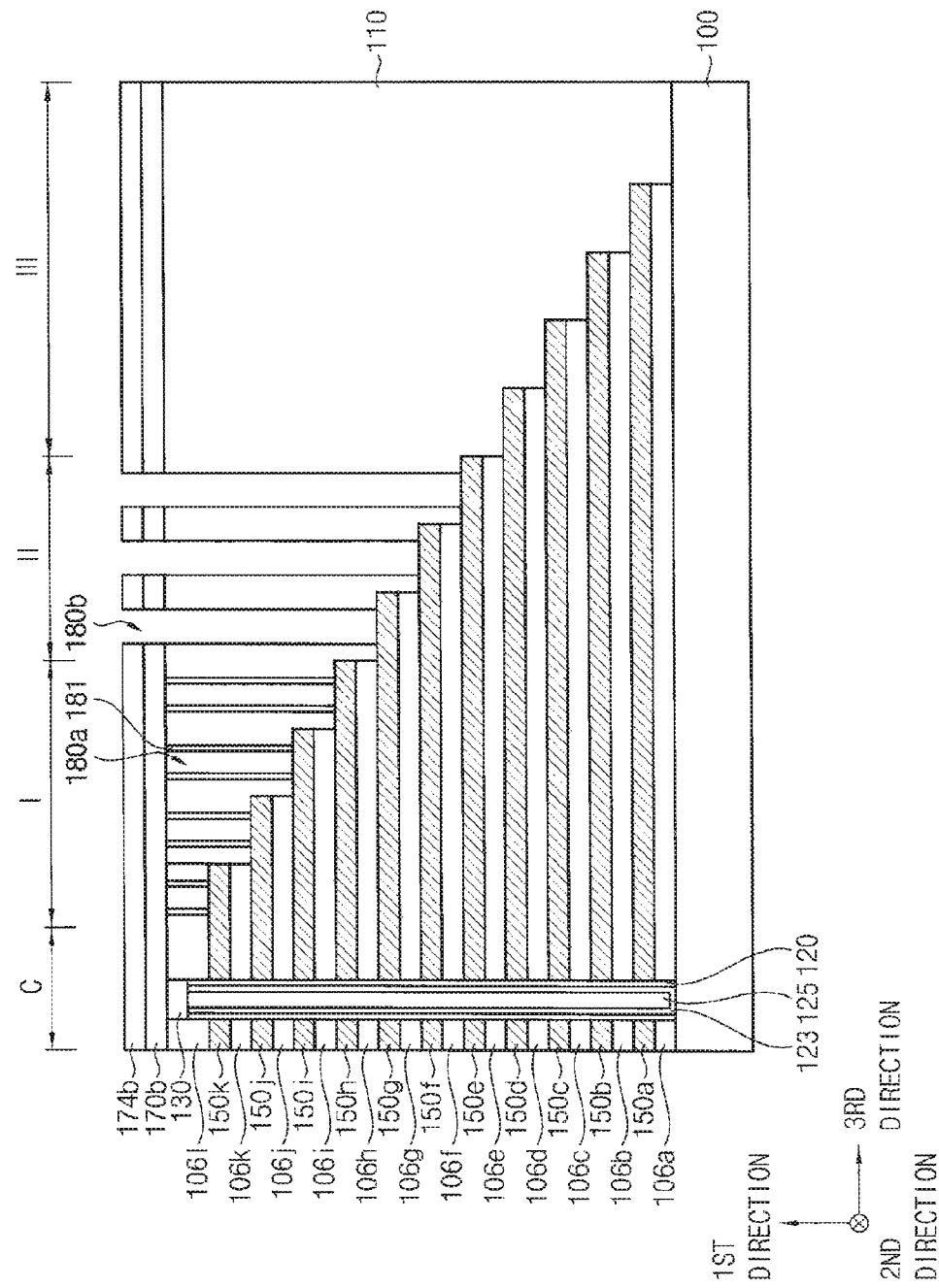

Referring to FIG. 35, a process substantially the same as or similar to that illustrated with reference to FIG. 33 may be performed on the second region II.

Accordingly, a portion of the second photoresist layer 172b on the second region II may be partially etched to form a second photoresist pattern 174b. The second mask layer 170b and the mold protection layer 110 may be partially removed using the second photoresist pattern 174b as an etching mask to form second contact holes 180b.

Step portions of the gate lines 150 (e.g., 150g, 150f and 150e) included in the second region II may be exposed through the second contact holes 180b.

Figure 36:
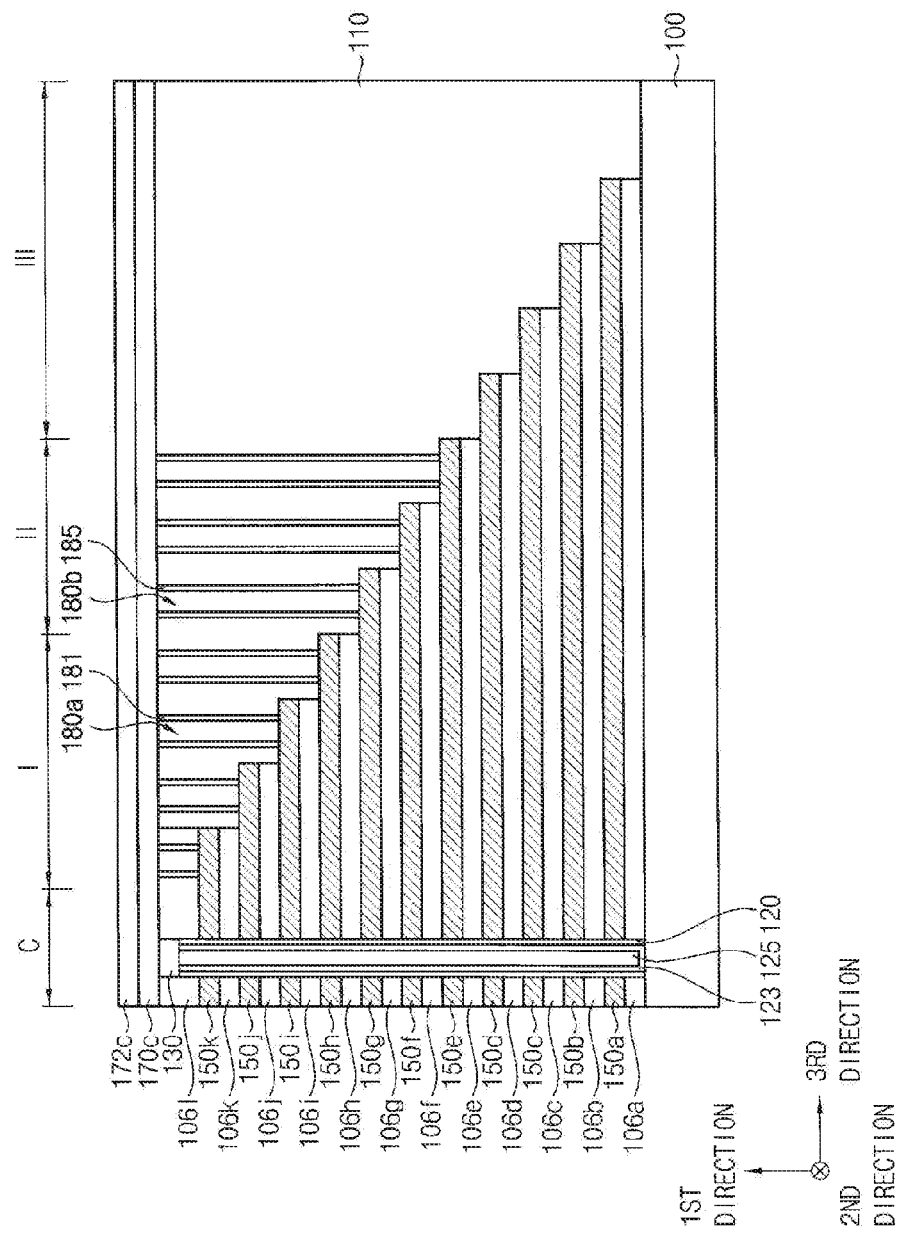

Referring to FIG. 36, a second contact spacer 185 may be formed on a sidewall of each second contact hole 180b. In example embodiments, a spacer layer may be formed along surfaces of the second photoresist pattern 174b and the second mask layer 170b, and along the sidewalls and bottoms of the second contact holes 180b. The spacer layer may be partially removed by an etch-back process to form the second contact spacers 185.

The second photoresist pattern 174b and the second mask layer 170b may be removed by a CMP process, an ashing process and/or a strip process after the formation of the second contact spacer 185.

In example embodiments, the first and second contact spacers 181 and 185 may be formed simultaneously. For example, the second contact hole 180b may be formed after forming the first contact hole 180a. A spacer layer extending commonly and continuously on the sidewalls and bottoms of the first and second contact holes 180a and 180b. The spacer layer may be partially removed by an etch-back process to form the first and second contact spacers 181 and 185.

After the formation of the second contact hole 180b and the second contact spacer 185, a third mask layer 170c capping the first and second contact holes 180a and 180b may be formed on the uppermost insulating interlayer pattern 106l, the pads 130 and the mold protection layer 110. A third photoresist layer 172c may be formed on the third mask layer 170c.

Figure 37:
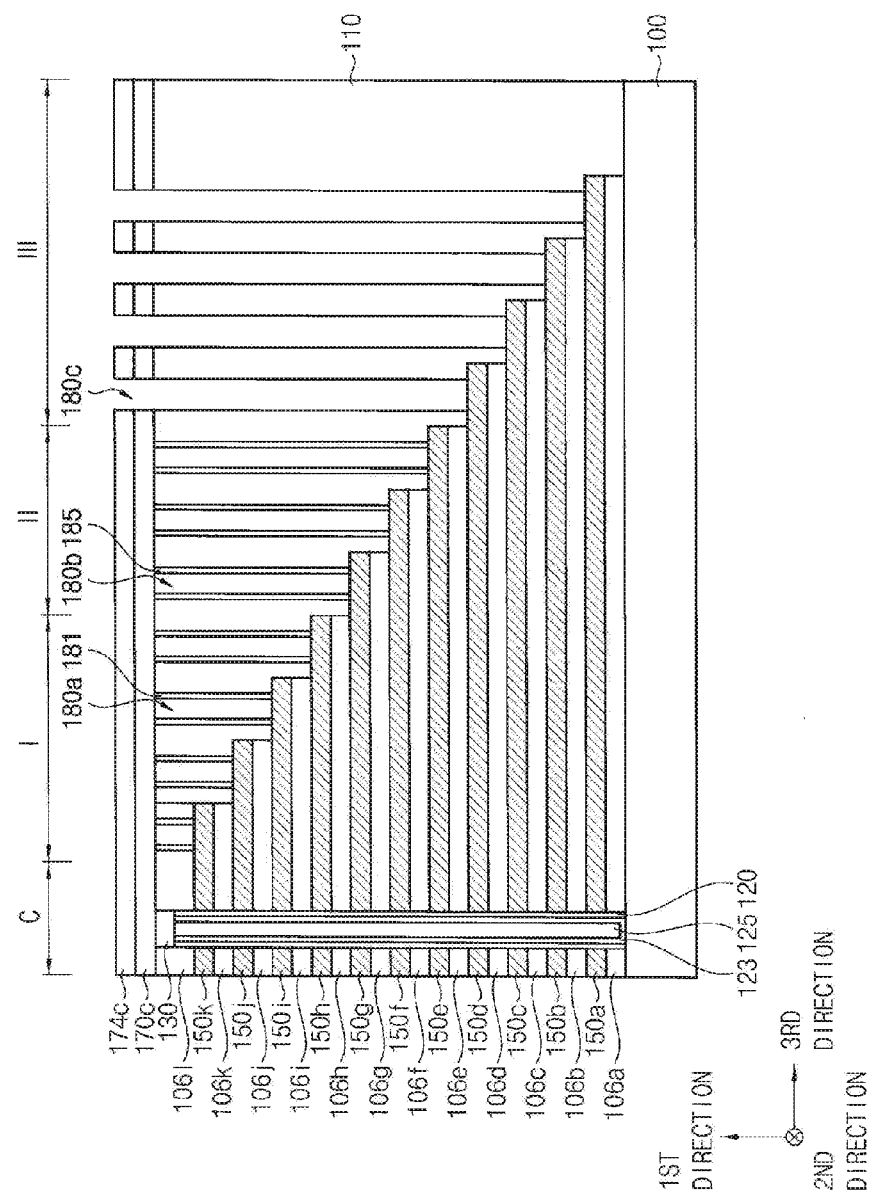

Referring to FIG. 37, a process substantially the same as or similar to that illustrated with reference to FIG. 33 may be repeated on the third region III.

In example embodiments, a portion of the third photoresist layer 172c formed on the third region III may be partially etched to form a third photoresist pattern 174c. The third mask layer 170c and the mold protection layer 110 may be partially etched using the third photoresist pattern 174c as an etching mask to form third contact holes 180c.

Step portions of the gate lines 150 (e.g., 150d through 150a) included in the third region III may be exposed through the third contact holes 180c. The third photoresist pattern 174c and the third mask layer 170c may be removed by an ashing process and/or a strip process after the formation of the third contact holes 180c.

Figure 38:
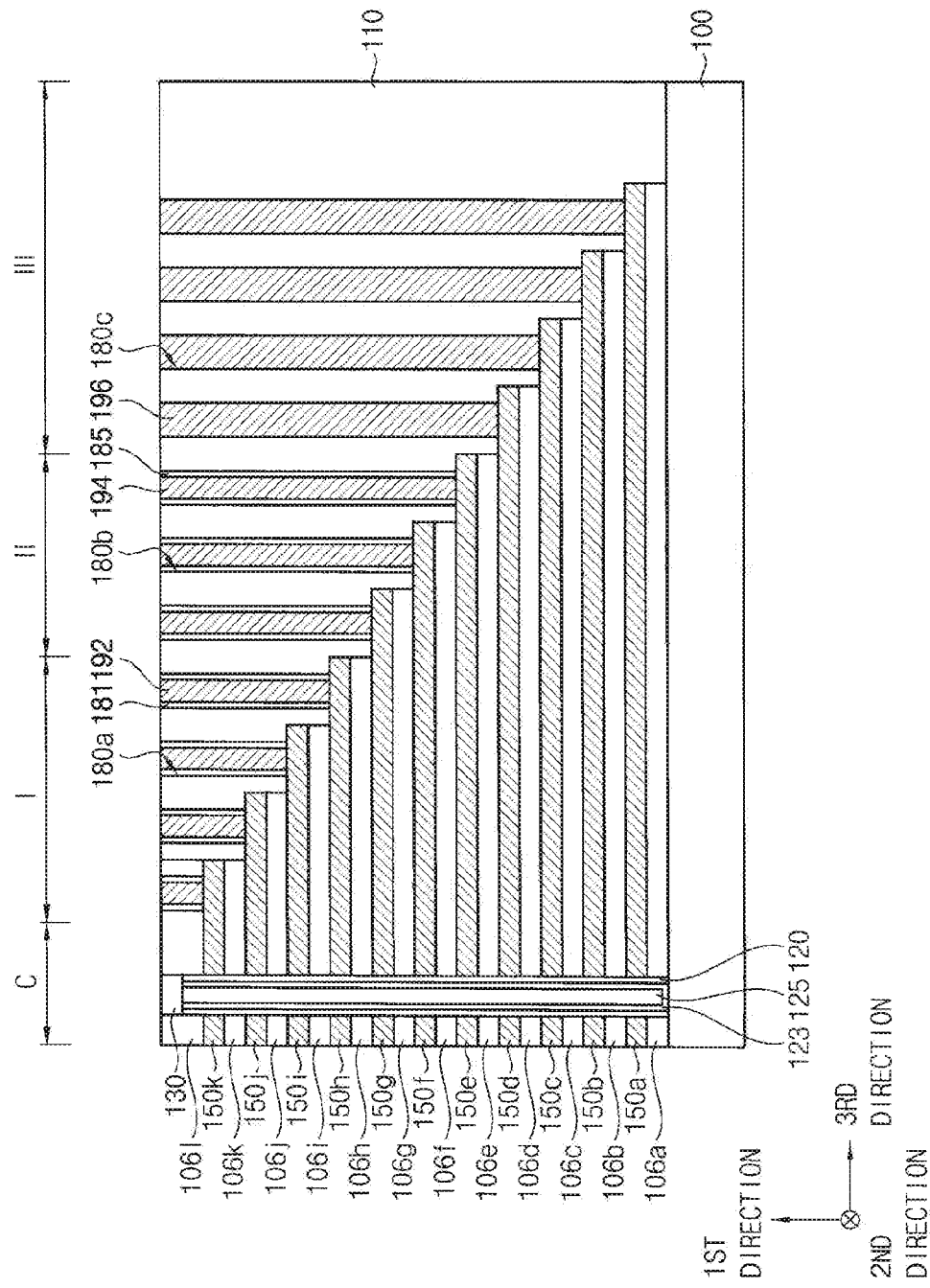

Referring to FIG. 38, processes substantially the same as or similar to those illustrated with reference to FIGS. 28 and 29 may be performed to form contacts.

For example, a conductive layer filling the first to third contact holes 180a, 180b and 180c may be formed on the uppermost insulating interlayer pattern 106l, the mold protection layer 110 and the pads 130. An upper portion of the conductive layer may be planarized by a CMP process until top surfaces of the uppermost insulating interlayer pattern 106l, the mold protection layer 110 and/or the pads 130 may be exposed. Accordingly, a first contact 192, a second contact 194 and a third contact 196 may be formed in the first contact hole 180a, the second contact hole 180b and the third contact hole 180c, respectively.

In example embodiments, as illustrated in FIG. 2, wirings electrically connected to the first, second and third contacts 192, 194 and 196 may be formed on the first, second and third regions I, II and III. A bit line electrically connected to the pads 130 may be formed on the channel region C.

According to example embodiments as described above, as the number of levels in the vertical memory device or the gate line structure becomes higher, a photo process for the formation of the contact holes (or the contacts) on the step portions of the gate lines may be additionally divided. For example, as illustrated with reference to FIGS. 32 to 38, the first, second and third contact holes 180a, 180b and 180c may be formed through first, second and third photo processes, respectively. In example embodiments, the contact spacers may be formed selectively in the contact holes (e.g., the first contact hole 180a and the second contact hole 180b) which may be exposed to a plurality of the divided photo processes, so that structural and mechanical reliability of the contact holes and the gate lines may be improved.

If the photo process is divided into at least four photo processes, the contact spacers may be selectively formed in consideration of a process order and the number of the divided processes.

Figure 39:
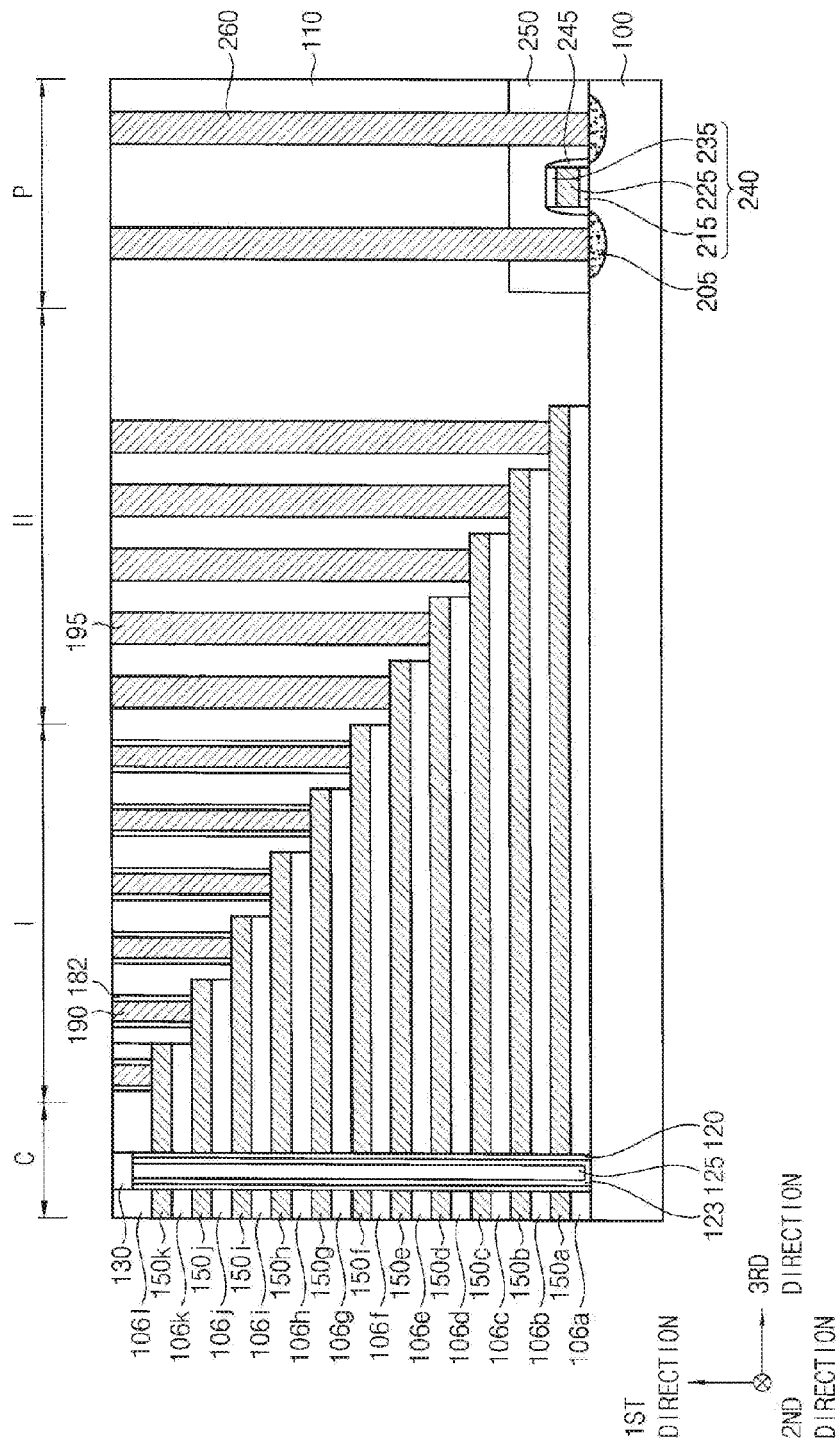
FIG. 39 is a cross-sectional view illustrating a vertical memory device in accordance with example embodiments.

FIG. 39 is a cross-sectional view illustrating a vertical memory device in accordance with example embodiments.

The vertical memory device of FIG. 39 may have elements and/or constructions substantially the same as or similar to those illustrated with reference to FIGS. 1 and 2 except that a peripheral circuit region or a peripheral circuit is included. Thus, detailed descriptions on repeated elements and/or structures are omitted herein, and like reference numerals are used to designate like elements.

Referring to FIG. 39, the substrate 100 may include a channel region C, a first region I, a second region II and a peripheral circuit region P.

A gate line structure substantially the same as or similar to that illustrated with reference to FIGS. 1 and 2 may be disposed on the channel region C, the first region I and the second region II of the substrate 100.

A vertical channel structure including a dielectric layer structure 120, a channel 123 and a first filling pattern 125 may extend through gate lines 150 and insulating interlayer patterns 106 on the channel region C.

Step portions of the gate lines 150 may be disposed on the first region I and the second region II. First contacts 190 and second contacts 195 may be landed on the step portions of the first region I and the second region II, respectively. In example embodiments, first contact spacers 182 may be formed only on sidewalls of the first contacts 190.

The peripheral circuit region P may be allotted at an edge portion of the substrate 100. A peripheral circuit of the vertical memory device may be disposed on the peripheral circuit region P. The peripheral circuit may include a transistor. The peripheral circuit may be covered by a peripheral circuit protection layer 250.

For example, a gate structure 240 including a gate insulation pattern 215, a gate electrode 225 and a gate mask 235 may be disposed on the peripheral circuit region P of the substrate 100. Source/drain regions 205 may be formed at upper portions of the substrate 100 adjacent to the gate structure 240. The transistor may be defined by the gate structure 240 and the source/drain regions 205. A gate spacer may be further formed on a sidewall of the gate structure 240.

The peripheral circuit protection layer 205 may be formed on the peripheral circuit region P to cover the gate structure 240, the gate spacer 245 and the source/drain regions 205.

A peripheral circuit contact 260 may extend through the mold protection layer 110 and the peripheral circuit protection layer 250 on the peripheral circuit region P, and may be electrically connected to the peripheral circuit. For example, the peripheral circuit contact 260 may be in contact with or electrically connected to the source/drain regions 205.

In example embodiments, a contact spacer may be excluded on a sidewall of the peripheral circuit contact 260. Accordingly, the sidewall of the peripheral circuit contact 260 may be in contact with the mold protection layer 110.

FIGS. 40 to 46 are cross-sectional views illustrating a method of manufacturing a vertical memory device in accordance with example embodiments. Detailed descriptions on processes and/or materials substantially the same as or similar to those illustrated with reference to FIGS. 3 to 29 are omitted herein.

Figure 40:
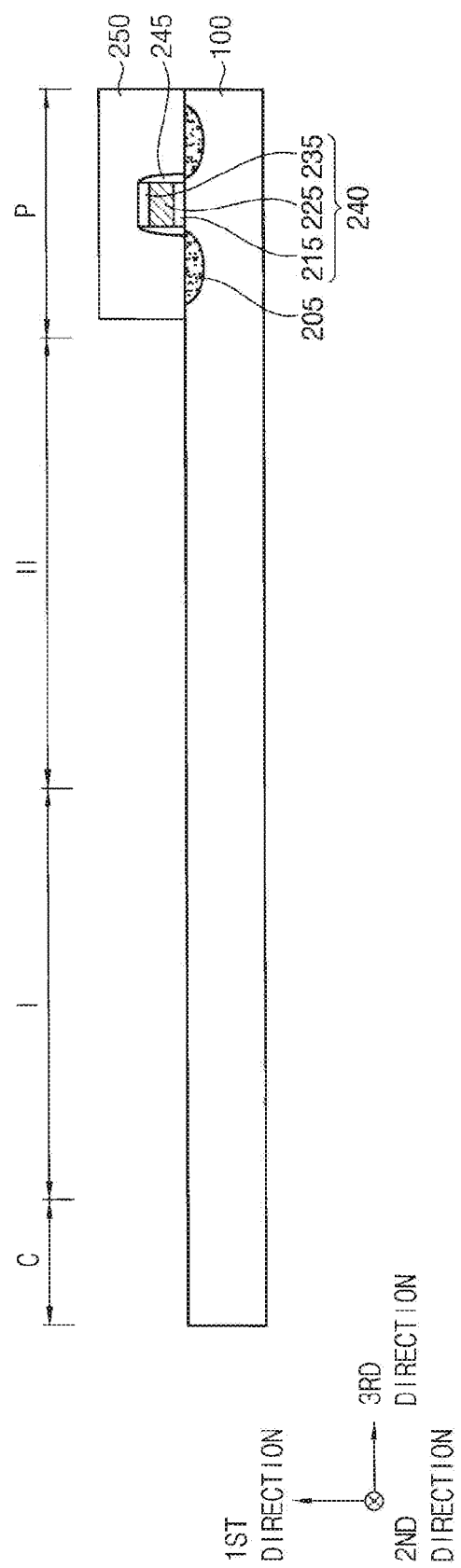
FIGS. 40 to 46 are cross-sectional views illustrating a method of manufacturing a vertical memory device in accordance with example embodiments.

Referring to FIG. 40, a peripheral circuit may be formed on a peripheral circuit region P of a substrate 100.

For example, a gate insulation layer, a gate electrode layer and a gate mask layer may be sequentially formed on the substrate 100. The gate mask layer may be partially etched to form a gate mask 235, and then the gate electrode layer and the gate insulation layer may be etched using the gate mask 235 as an etching mask to form a gate electrode 225 and a gate insulation pattern 215. Accordingly, a gate structure 240 including the gate insulation pattern 215, the gate electrode 225 and the gate mask 235 sequentially stacked on the substrate 100 may be formed.

The gate insulation layer may be formed of silicon oxide or a metal oxide. The gate electrode layer may be formed of a metal, a metal nitride and/or doped polysilicon. The gate mask layer may be formed of silicon nitride. The gate insulation layer, the gate electrode layer and the gate mask layer may be formed by at least one of a CVD process, a PECVD process, a HDP-CVD process, an ALD process and a sputtering process. In example embodiments, the gate insulation layer may be formed by performing a thermal oxidation process on the substrate 100.

An ion-implantation process may be performed using the gate structure 240 as an implantation mask to form source/drain regions 205 at upper portions of the substrate 100. Thus, a transistor including the gate structure 240 and source/drain regions 205 may be formed on the peripheral circuit region P.

In example embodiments, a spacer layer covering the gate structure 240 may be formed on the substrate 100. The spacer layer may be anisotropically etched to form a gate spacer 245 covering a sidewall of the gate structure 240.

A peripheral circuit protection layer 250 may be further formed so that the transistor may be protected during subsequent processes. For example, a protection layer covering the source/drain region 205, the gate structure 240 and the gate spacer 245 may be formed on the substrate 100. A portion of the protection layer formed on a channel region C, a first region I and a second region II may be removed to form the peripheral circuit protection layer 250. The protection layer may be formed of an insulation material such as silicon oxide.

Figure 41:
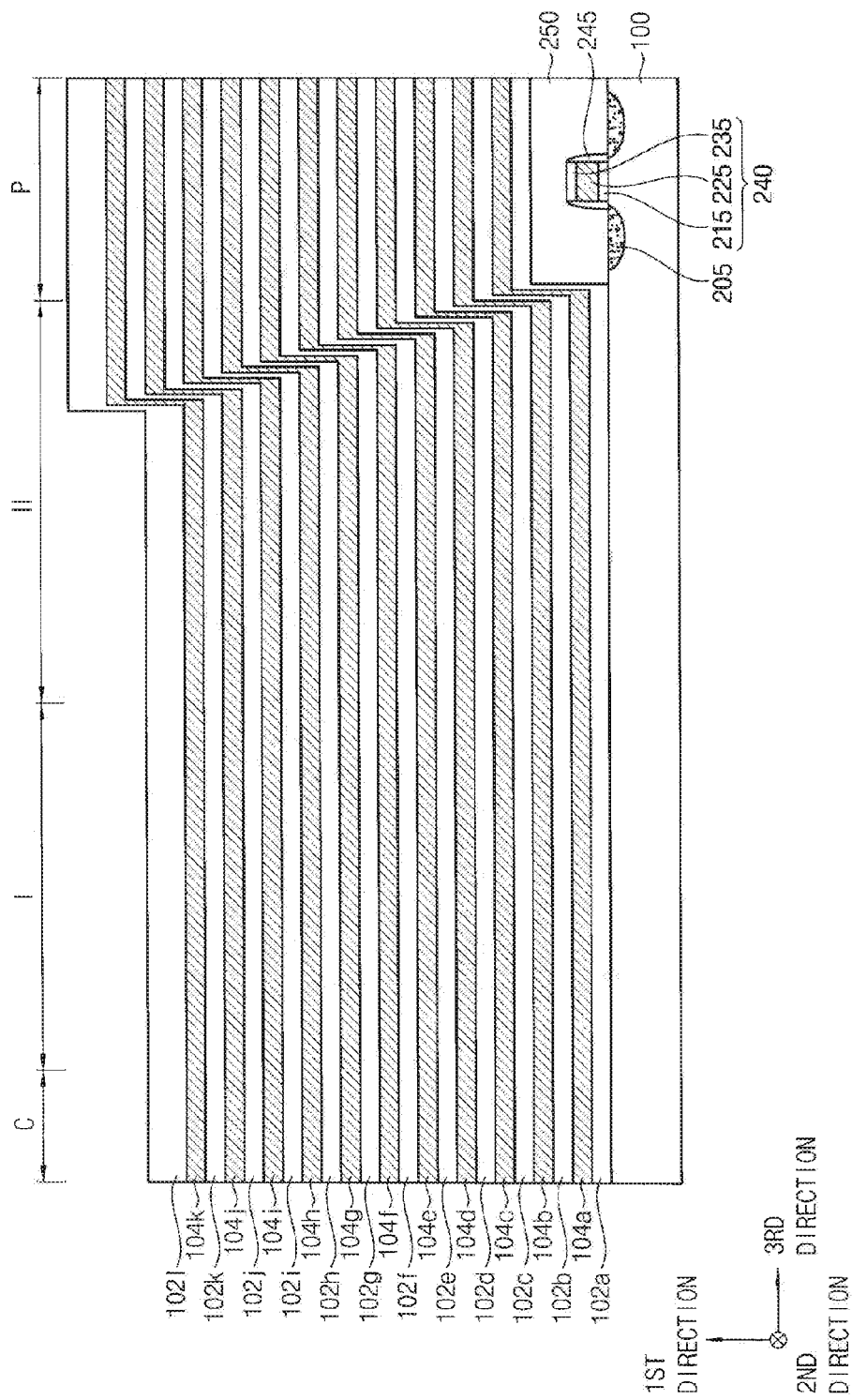

Referring to FIG. 41, a process substantially the same as or similar to that illustrated with reference to FIG. 3 may be performed. In example embodiments, insulating interlayers 102 and sacrificial layers 104 may be alternately and repeatedly formed to obtain a mold structure.

The insulating interlayers 102 and the sacrificial layers 104 may extend commonly and continuously on the channel region C, the first region I, the second region II and the peripheral circuit region P. The mold structure may protrude on the peripheral circuit region P and a portion of the second region II due to a height difference from the peripheral circuit protection layer 250.

Figure 42:
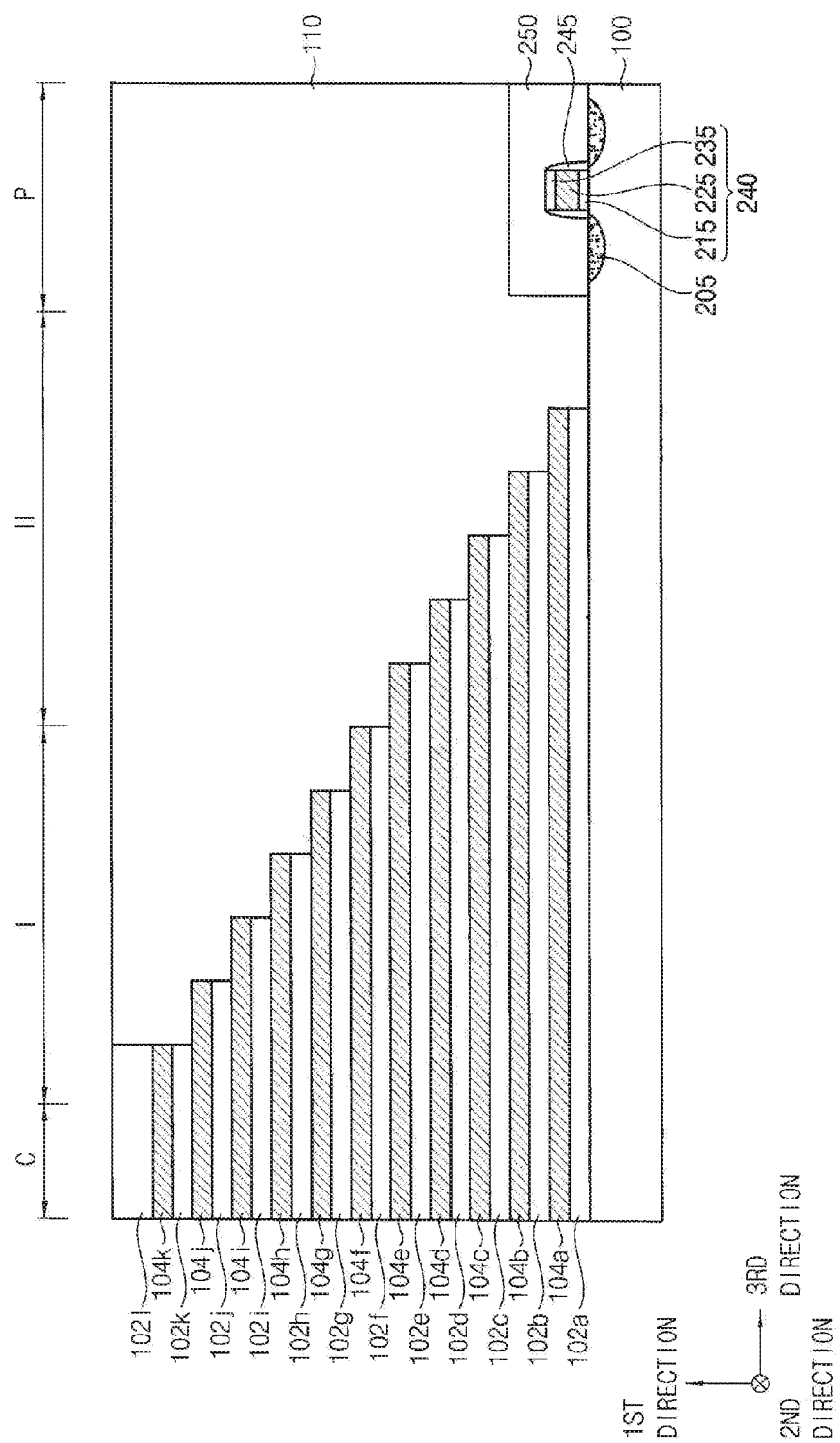

Referring to FIG. 42, a process substantially the same as or similar to that illustrated with reference to FIG. 4 may be performed to form a stepped mold structure.

The mold structure may be substantially removed from the peripheral circuit region P. An uppermost insulating interlayer 102*l* may be exposed on the channel region C. Step portions of the stepped mold structure may be exposed on the first and second regions I and II.

A mold protection layer 110 covering a lateral portion of the stepped mold structure and covering the peripheral circuit protection layer 250 may be formed.

Figure 43:
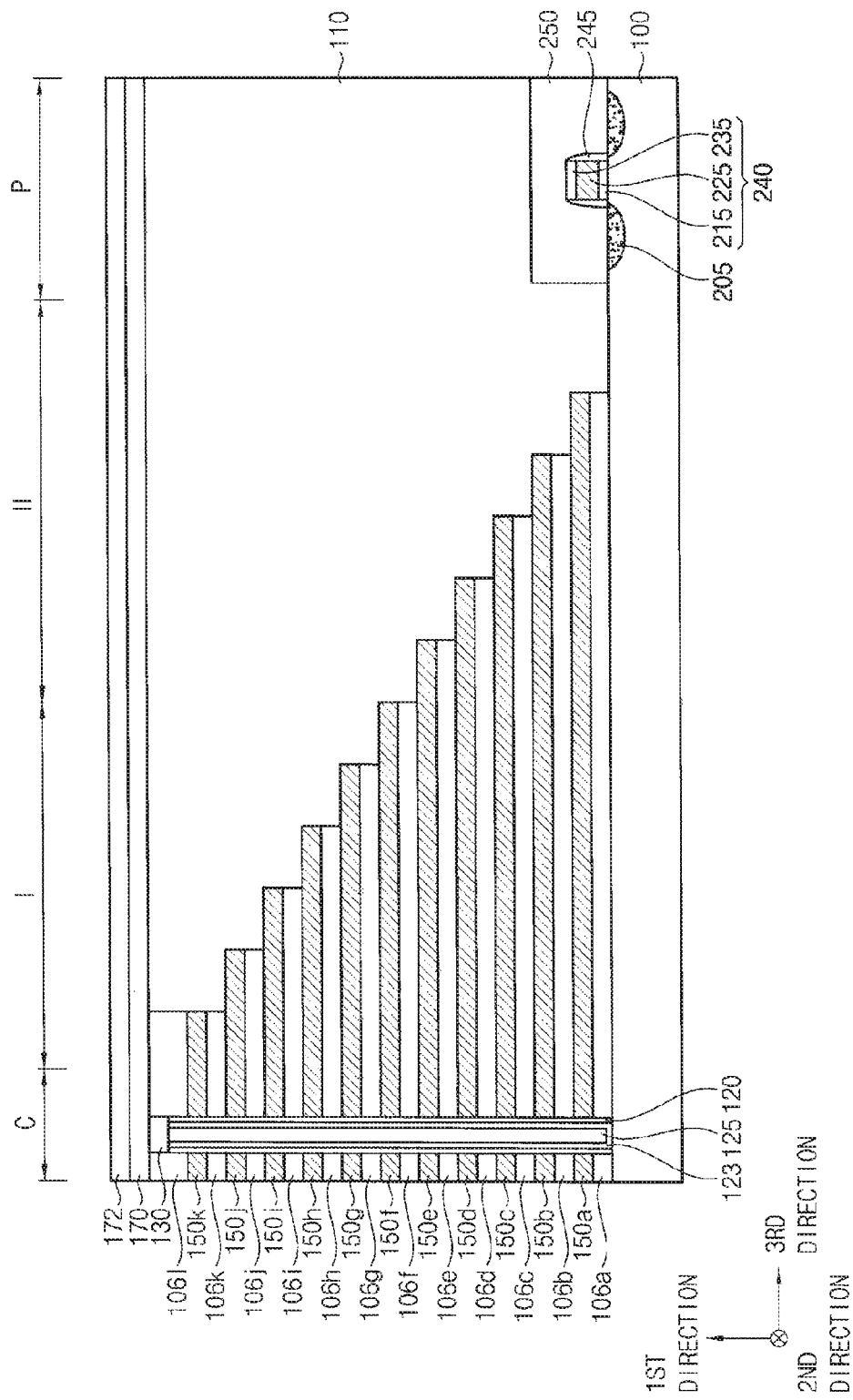

Referring to FIG. 43, processes substantially the same as or similar to those illustrated with reference to FIGS. 5 to 20 may be performed.

In example embodiments, a vertical structure including a dielectric layer structure 120, a channel 123 and a first filling pattern 125 may be formed through the stepped mold structure on the channel region C. A pad 130 capping the vertical channel structure may be formed on the dielectric layer structure 120, the channel 123 and the first filling pattern 125.

Subsequently, the sacrificial layers 104 may be replaced with gate lines such that a gate line structure in which insulating interlayer patterns 106 and the gate lines 150 may be alternately stacked in a stepped construction or a pyramidal construction may be formed.

A first mask layer 170 may be formed on the gate line structure and the mold protection layer 110, and a first photoresist layer 172 may be formed on the first mask layer 170. The first mask layer 170 and the first photoresist layer 172 may be formed commonly on the channel region C, the first region I, the second region II and the peripheral circuit region P.

Figure 44:
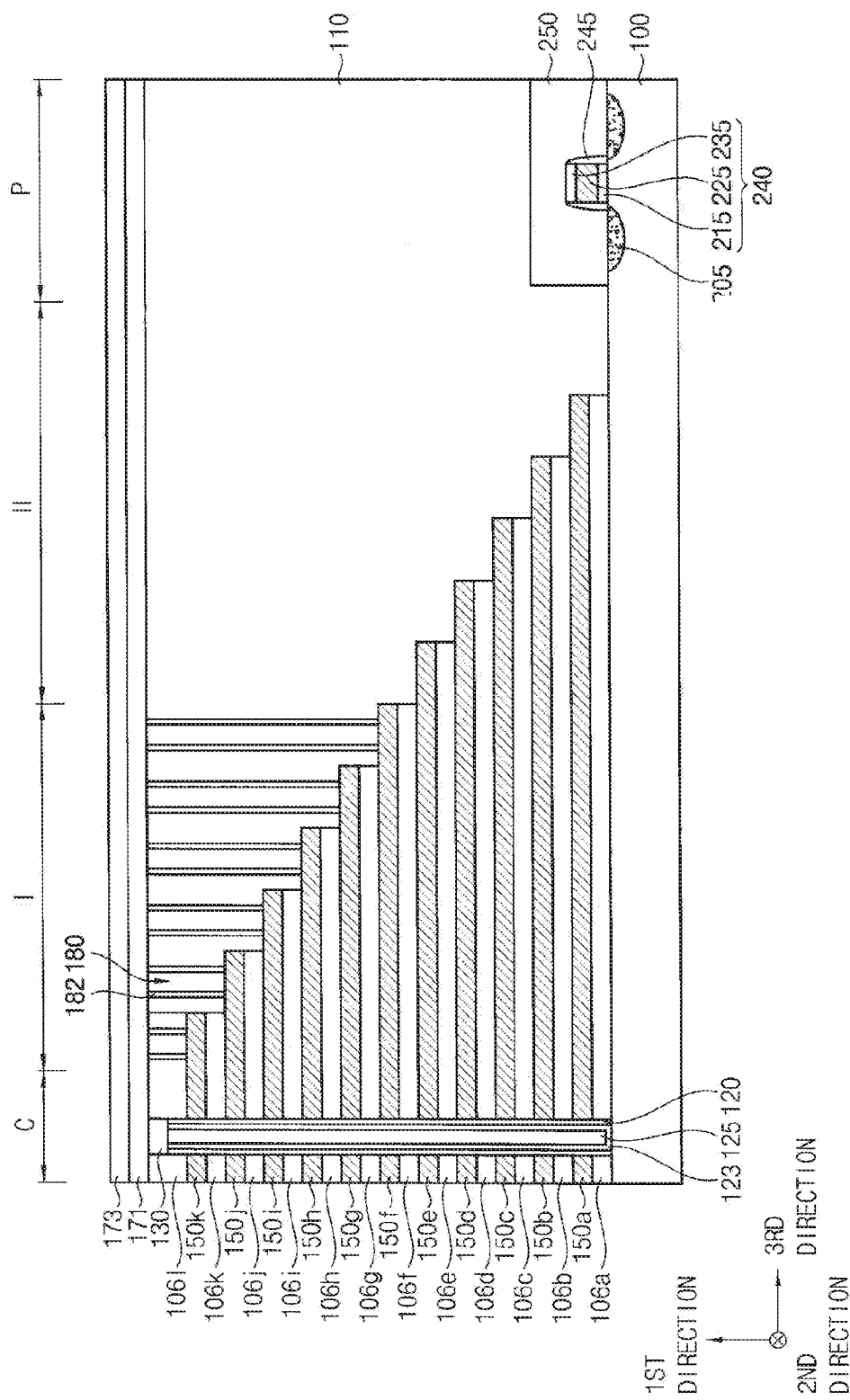

Referring to FIG. 44, processes substantially the same as or similar to those illustrated with reference to FIGS. 21 to 25 may be performed.

Accordingly, first contact holes 180 exposing the step portions of the gate lines 150 (e.g., 150*k* through 150*f*) included in the first region I may be formed, and a first contact spacer 182 may be formed on a sidewall of each first contact hole 180. The first photoresist layer 172 and the first mask layer 170 may be removed by an ashing process and/or a strip process after the formation of the first contact hole 180 and/or the first contact spacer 182.

A second mask layer 171 capping the first contact holes 180 may be formed on an upper insulating interlayer pattern 106*l* and the mold protection layer 110. A second photoresist layer 173 may be formed on the second mask layer 171.

Figure 45:
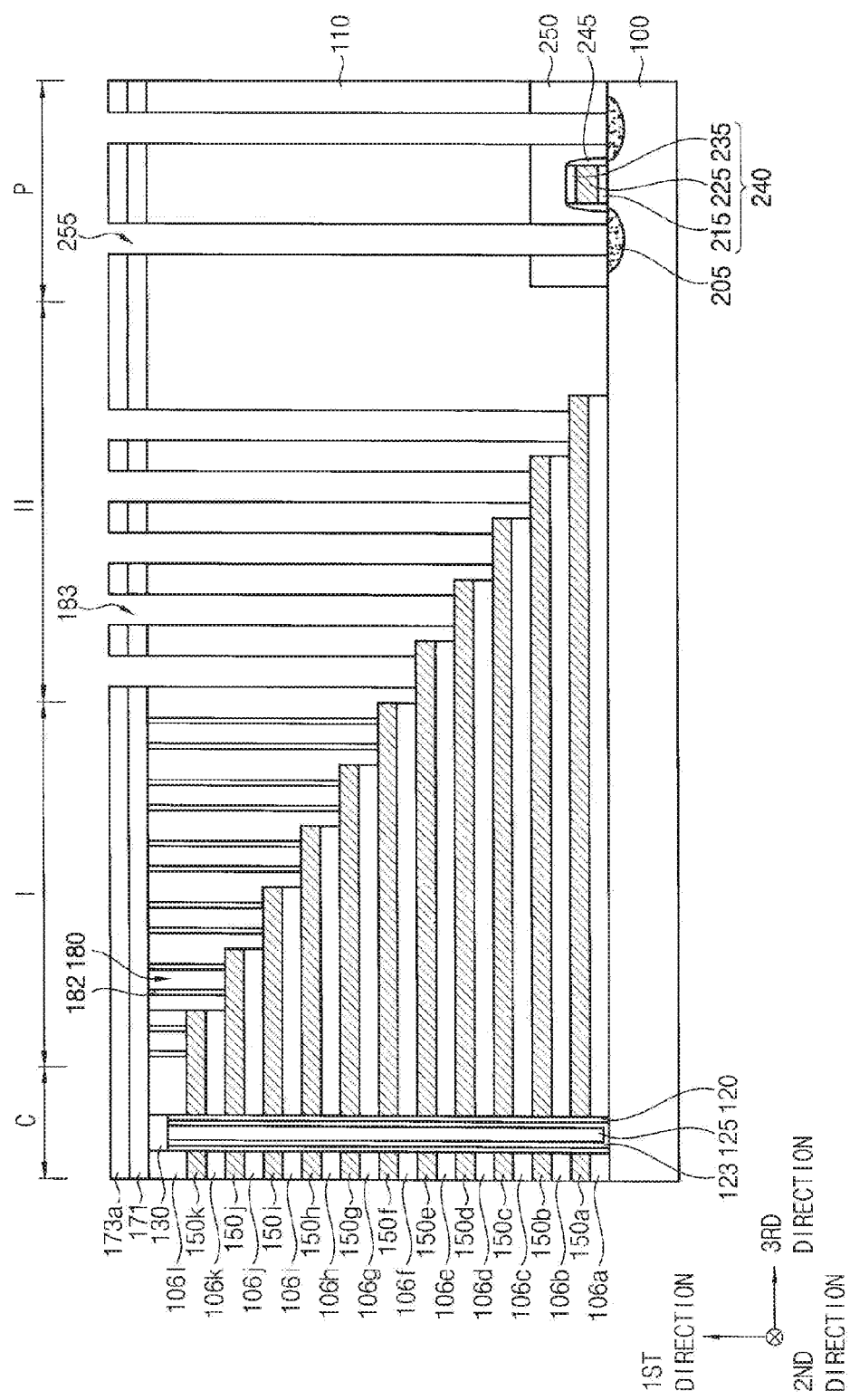

Referring to FIG. 45, processes substantially the same as or similar to those illustrated with reference to FIGS. 26 and 27 may be performed.

In example embodiments, portions of the second photoresist layer 173 on the second region II and the peripheral circuit region P may be partially removed to form a second photoresist pattern 173*a*. The second mask layer 171 and the mold protection layer 110 may be partially removed using the second photoresist pattern 173*a* as an etching mask to form second contact holes 183 and a peripheral circuit contact hole 255.

The step portions of the gate lines 150 (e.g., 150*e* through 150*a*) included in the second region II may be exposed through the second contact hole 183. The source/drain regions 205 may be exposed through the peripheral circuit contact hole 255.

The second photoresist pattern 173*a* and the second mask layer 171 may be removed by an ashing process and/or a strip process after the formation of the second contact hole 183 and the peripheral circuit contact hole 255.

In example embodiments, the second contact hole 183 and the peripheral circuit contact hole 255 may be formed by substantially the same photo process, and may be formed simultaneously. For example, a contact hole through which a GSL is exposed, and the peripheral circuit contact hole 255 may be simultaneously formed by the same photo process.

In example embodiments, after forming the second contact hole 183, the peripheral circuit contact hole 255 may be formed by an additional photo process.

Figure 46:
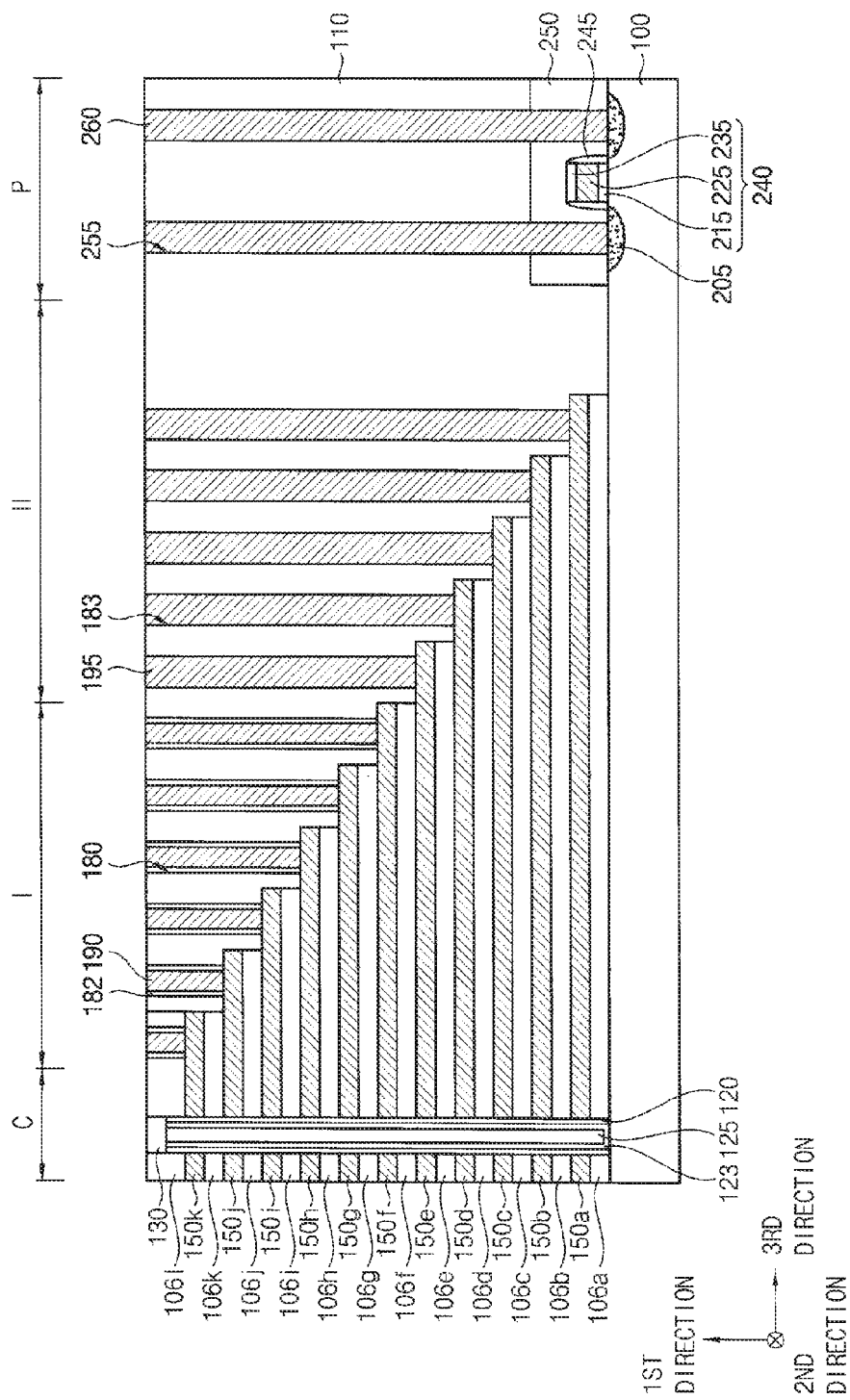

Referring to FIG. 46, processes substantially the same as or similar to those illustrated with reference to FIGS. 28 and 29 may be performed.

For example, a conductive layer sufficiently filling the first contact hole 180, the second contact hole 183 and the peripheral circuit contact hole 255 may be formed. An upper portion of the conductive layer may be planarized until the uppermost insulating interlayer pattern 106*l* and/or the mold protection layer 110 may be exposed such that a first contact 190, a second contact 195 and a peripheral circuit contact 260 may be formed in the first contact hole 180, the second contact hole 183 and the peripheral circuit contact hole 255, respectively.

In example embodiments, wirings electrically connected to the first contacts 190 and the second contacts 195 may be formed on the first region I and the second region II. A peripheral circuit wiring electrically connected to the peripheral circuit contacts 260 may be formed on the peripheral circuit region P. A bit line electrically connected to the pads 130 may be formed on the channel region C.

According to example embodiments as described above, the contact spacers 182 may be formed selectively on sidewalls of some contacts in consideration of photo processes for the contact holes and the peripheral circuit contact hole 255.

Figure 47:
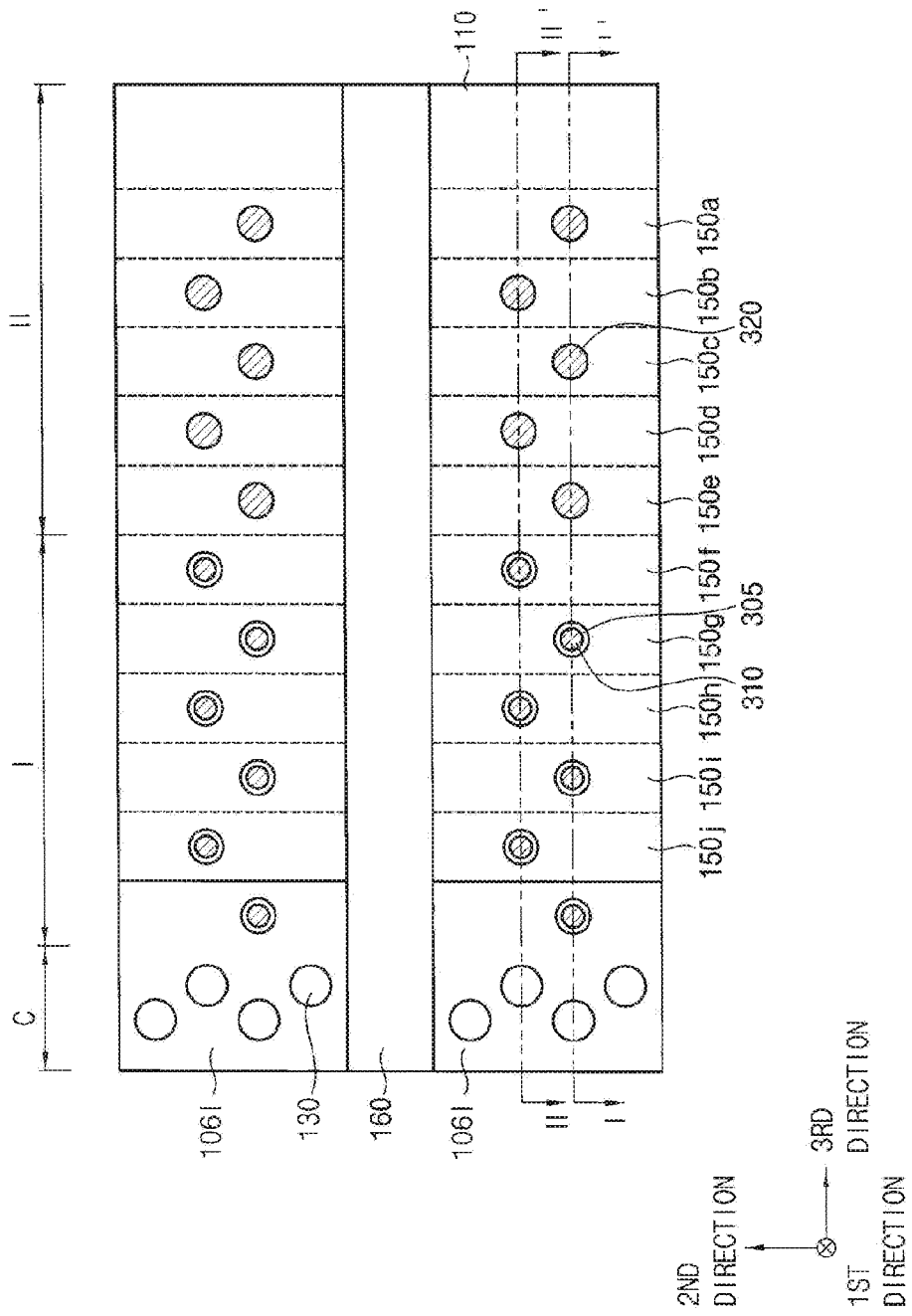
FIGS. 47 to 49 are a top plan view and cross-sectional views illustrating a vertical memory device in accordance with example embodiments.
Figure 48:
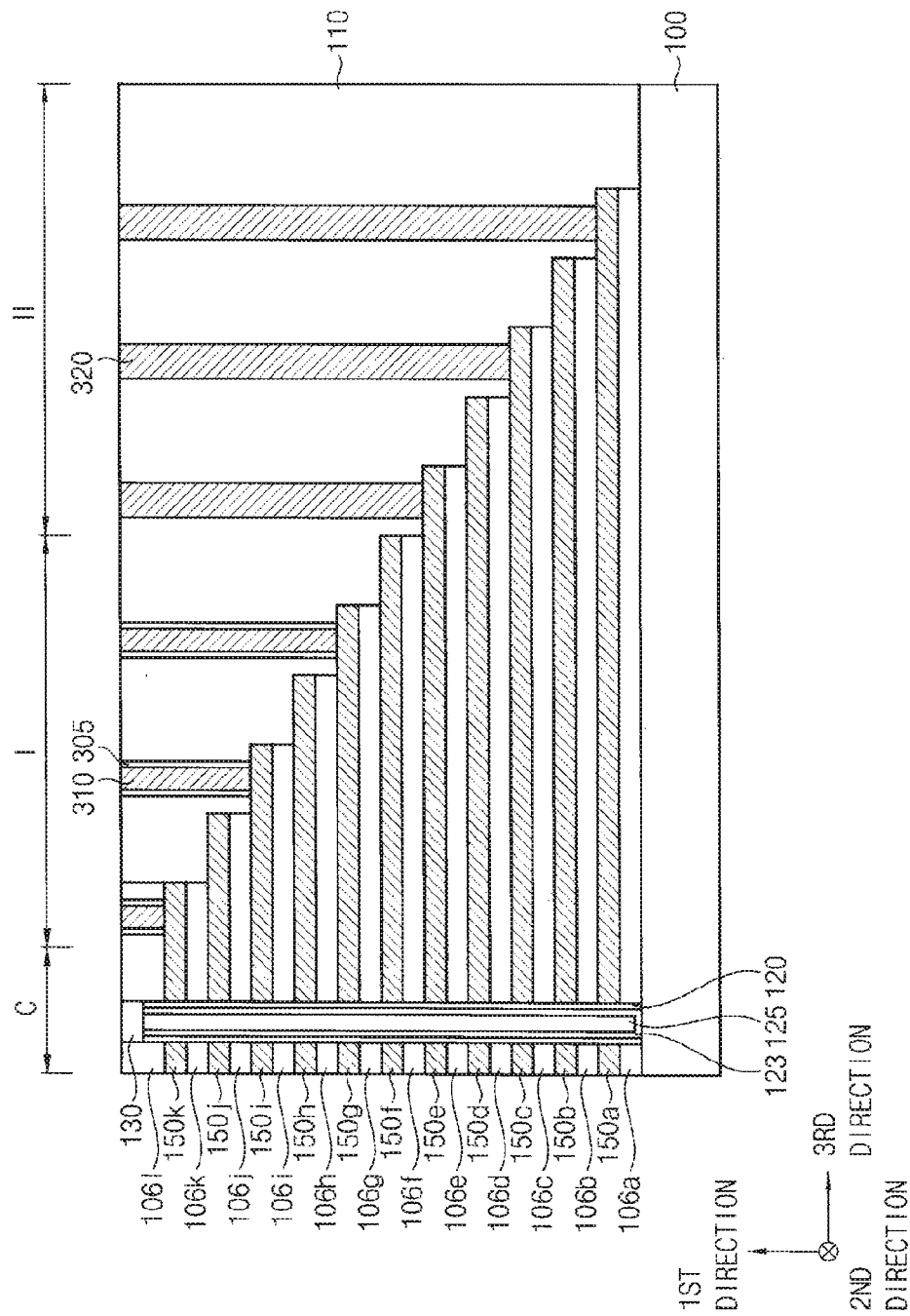
Figure 49:
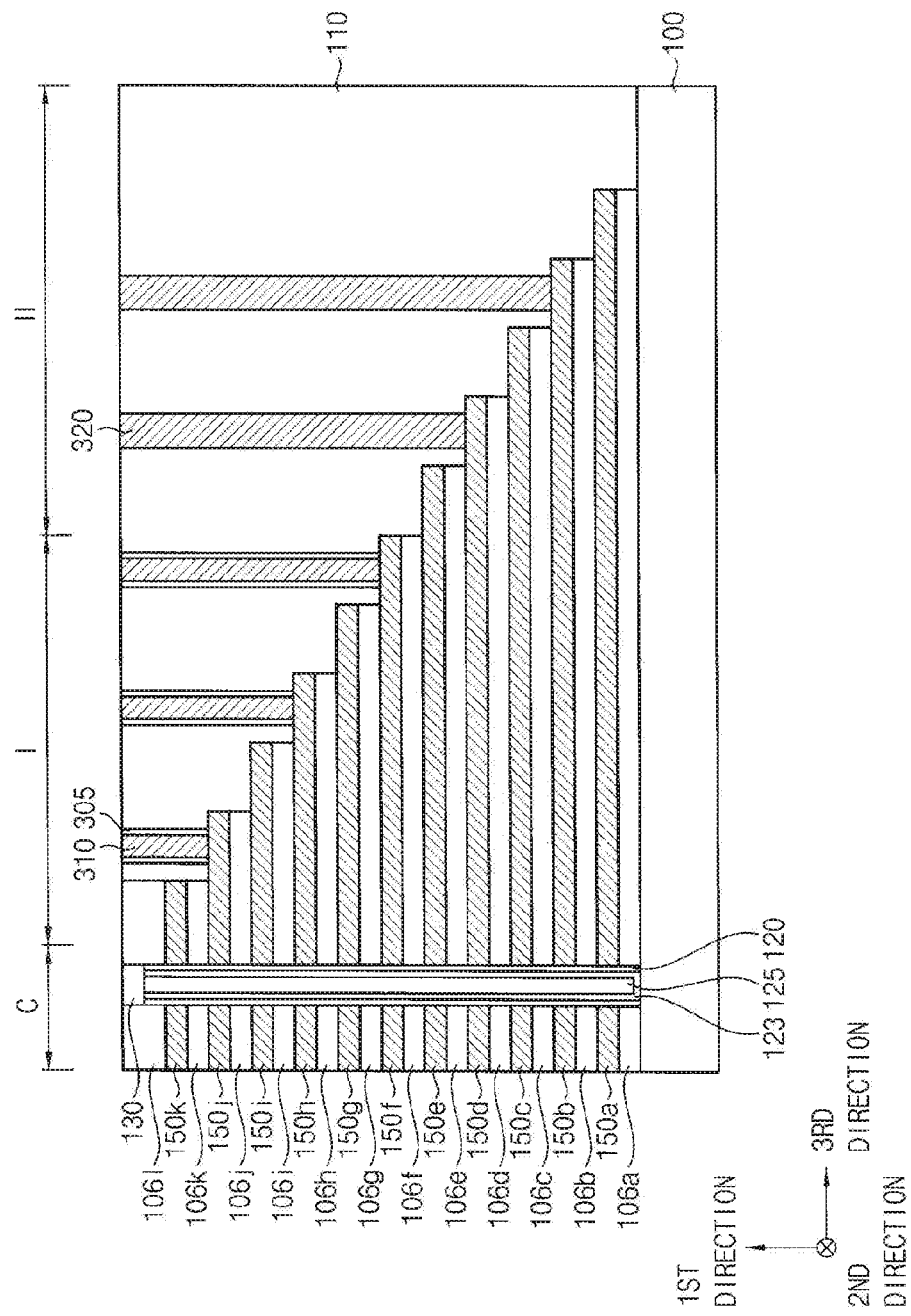

FIGS. 47 to 49 are a top plan view and cross-sectional views illustrating a vertical memory device in accordance with example embodiments. Specifically, FIG. 47 is a top plan view of the vertical memory device. FIGS. 48 and 49 are cross-sectional views taken along lines I-I' and II-II' of FIG. 47, respectively.

The vertical memory device of FIGS. 47 to 49 may have elements and/or constructions substantially the same as or similar to those illustrated with reference to FIGS. 1 and 2 except for an arrangement of contacts. Thus, detailed descriptions on repeated elements and/or structures are omitted herein, and like reference numerals are used to designate like elements.

Referring to FIGS. 47 to 49, as also described in FIGS. 1 and 2, a plurality of gate line structures divided by a second filling pattern 160 may be disposed on a substrate 100. The gate line structure may include insulating interlayer patterns 106 and gate lines 150 stacked in a pyramidal construction or a stepped construction.

A plurality of vertical channel structures, each of which may include a dielectric layer structure 120, a channel 123 and a first filling layer pattern 125, may be formed on a channel region C of the substrate 100, and a pad 130 capping the vertical channel structure may be formed.

Step portions of the gate lines may be distributed on a first region I and a second region II of the substrate 100.

In example embodiments, contacts 310 and 320 may be disposed along the third direction in a zigzag arrangement in a planar view.

In example embodiments, the contacts 310 and 320 may be arranged on every other step portions in a vertical cross-sectional view. For example, as illustrated in FIG. 48, the contacts 310 and 320 may be landed on the step portions of the gate lines 150 at odd levels (e.g., 150$a$, 150$c$, 150$e$, 150$g$, 150$i$ and 150$k$) in the cross-sectional view taken along the line I-I'. As illustrated in FIG. 49, the contacts 310 and 320 may be landed on the step portions of the gate lines 150 at even levels (e.g., 150$b$, 150$d$, 150$f$, 150$h$ and 150$j$) in the cross-sectional view taken along the line II-II'.

As described above, the contacts 310 and 320 may be dispersed in the zigzag arrangement so that a distance between the neighboring contacts 310 and 320 may be increased. Thus, an alignment margin in a photo process may be additionally achieved.

The contacts 310 and 320 may be divided into first contacts 310 landed on the step portions of the gate lines 150 (e.g., 150$k$ through 150$f$) included in the first region I, and second contacts 320 landed on the step portions of the gate lines 150 (e.g., 150$e$ through 150$a$) included in the second region II. The first and second contacts 310 and 320 may be in the zigzag arrangement in a planar view.

In example embodiments, first contact spacers 305 may be selectively formed on sidewalls of the first contacts 310.

According to example embodiment as described above, the contacts 310 and 320 may be formed in the zigzag arrangement to increase the alignment margin of the photo process. Further, the contact spacers may be provided only on the first contacts 310 so that defects due to an etching residue may be prevented.

Figure 50:
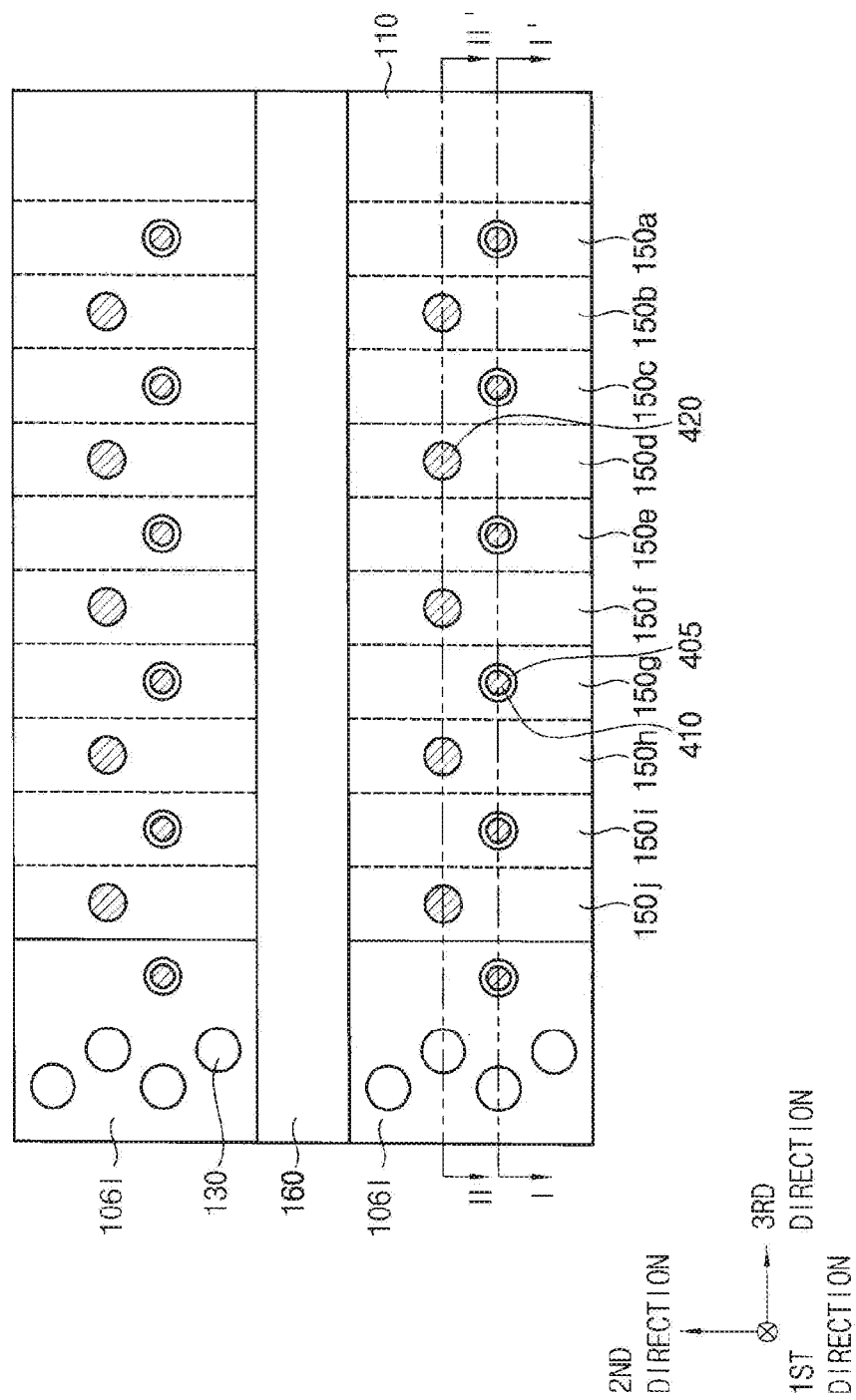
FIGS. 50 to 52 are a top plan view and cross-sectional views illustrating a vertical memory device in accordance with example embodiments.
Figure 51:
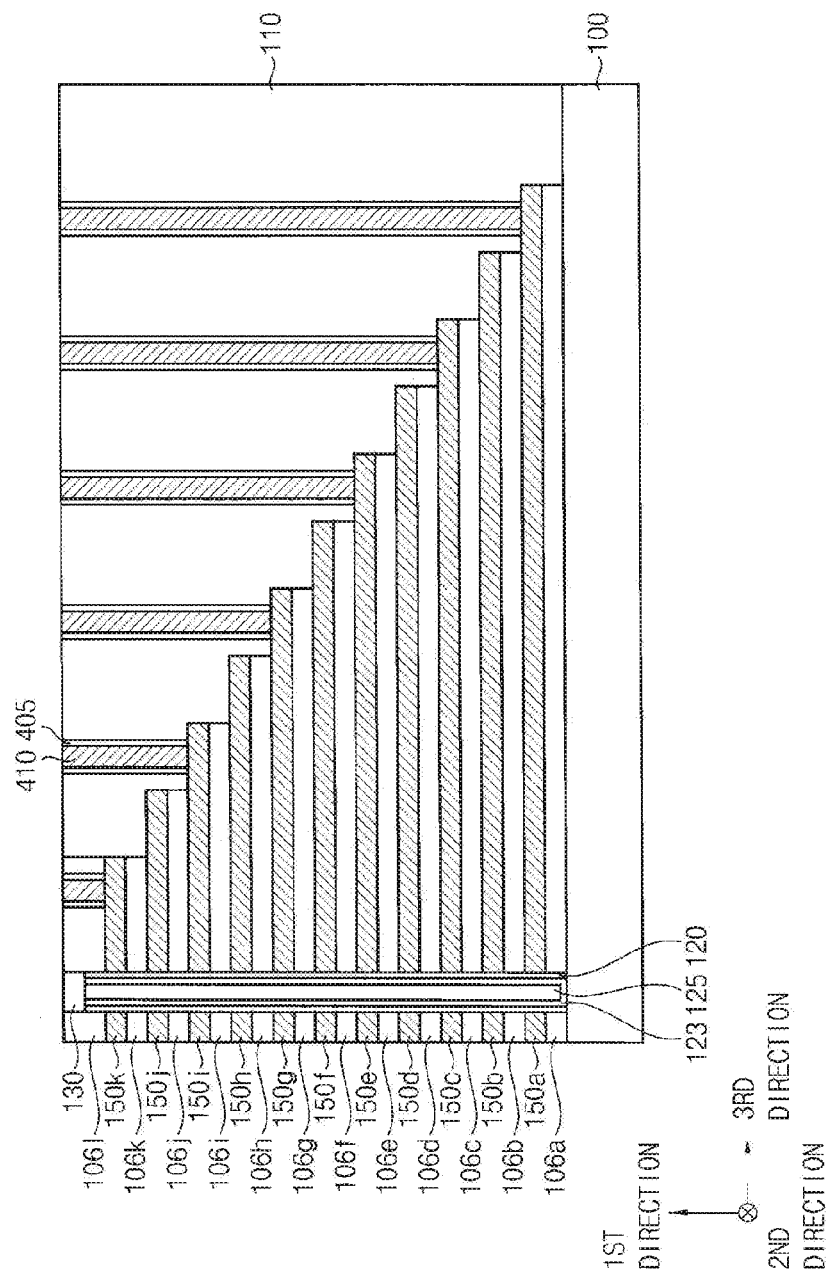
Figure 52:
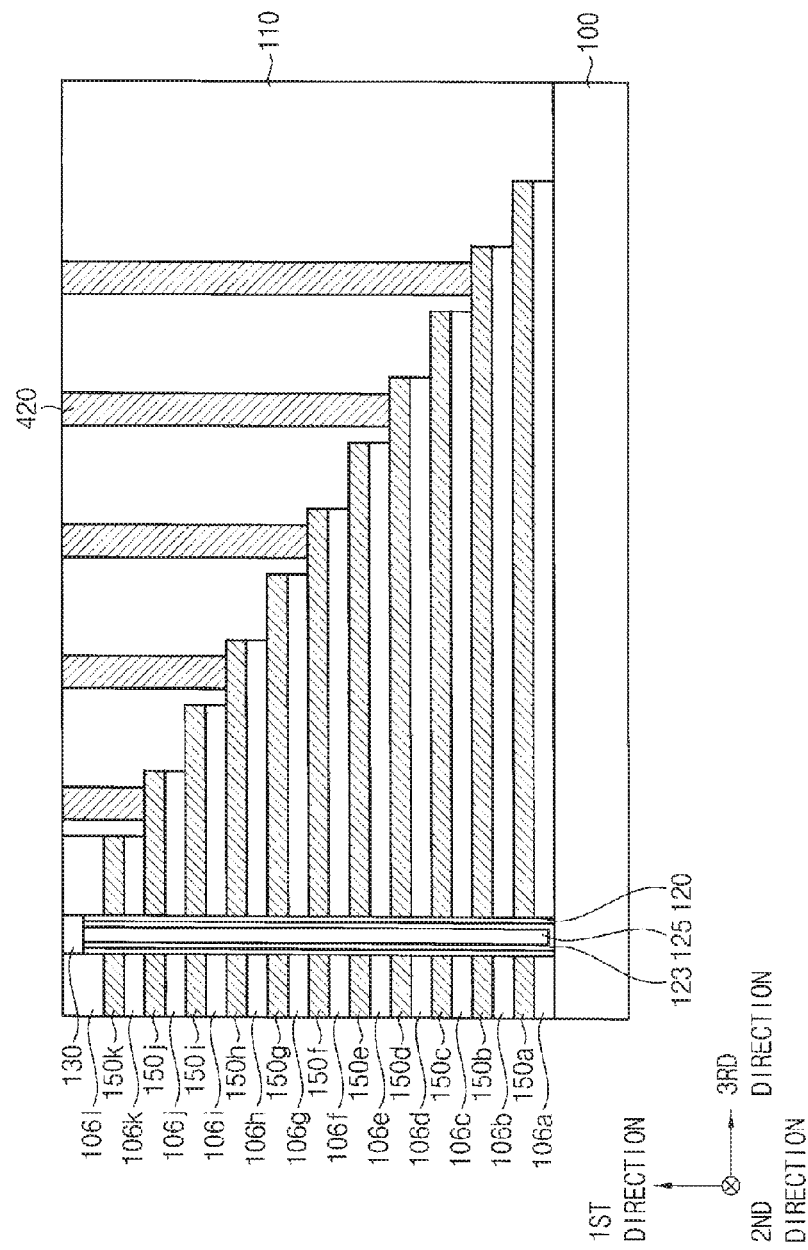

FIGS. 50 to 52 are a top plan view and cross-sectional views illustrating a vertical memory device in accordance with example embodiments. Specifically, FIG. 50 is a top plan view of the vertical memory device. FIGS. 51 and 52 are cross-sectional views taken along lines I-I' and II-II' of FIG. 50, respectively.

The vertical memory device of FIGS. 50 to 52 may have elements and/or constructions substantially the same as or similar to those illustrated with reference to FIGS. 47 to 49 except for an arrangement of contact spacers. Thus, detailed descriptions on repeated elements and/or structures are omitted herein, and like reference numerals are used to designate like elements.

Referring to FIGS. 50 to 52, as also illustrated with reference to FIGS. 47 to 49, the contacts may be formed in a zigzag arrangement along the third direction.

The contacts may include first contacts 410 and second contacts 420. The first contacts 410 may be arranged along the third direction to form a first contact row. The second contacts 420 may be arranged along the third direction to form a second contact row. The first contact row and the second contact row may be included in different vertical cross-sectional views, and the contacts included in the first and second contact rows may be in the zigzag arrangement in a planar view as illustrated in FIG. 50.

As illustrated in FIG. 51, the first contacts 410 included in the first contact row may be arranged in the cross-sectional view taken along the line I-I'. For example, the first contacts 410 may be landed on step portions of gate lines 150 at odd levels (e.g., 150$a$, 150$c$, 150$e$, 150$g$, 150$i$ and 150$k$). In example embodiments, first contact spacers 405 may be formed on sidewalls of the first contacts 410.

As illustrated in FIG. 52, the second contacts 420 included in the second contact row may be arranged in the cross-sectional view taken along the line II-II'. For example, the second contacts 420 may be landed on step portions of gate lines 150 at even levels (e.g., 150$b$. 150$d$, 150$f$, 150$h$ and 150$j$). In example embodiments, contact spacers may be excluded on sidewalls of the second contacts 420.

FIGS. 53 to 61 are top plan views and cross-sectional views illustrating a method of manufacturing a vertical memory device in accordance with example embodiments. For example, FIGS. 53 to 61 illustrate a method of manufacturing the vertical memory device of FIGS. 50 to 52.

Specifically, FIGS. 53, 55, 57, 59 and 61 are top plan views illustrating the method. FIG. 54 is a vertical cross-sectional view illustrating the method. FIGS. 56 and 58 are cross-sectional views taken along a line I-I' indicated in FIGS. 55 and 57. FIG. 60 is a cross-sectional view taken along a line II-II' indicated in FIG. 59.

Detailed descriptions on processes and/or materials substantially the same as or similar to those illustrated with reference to FIGS. 3 to 29 are omitted herein.

Figure 53:
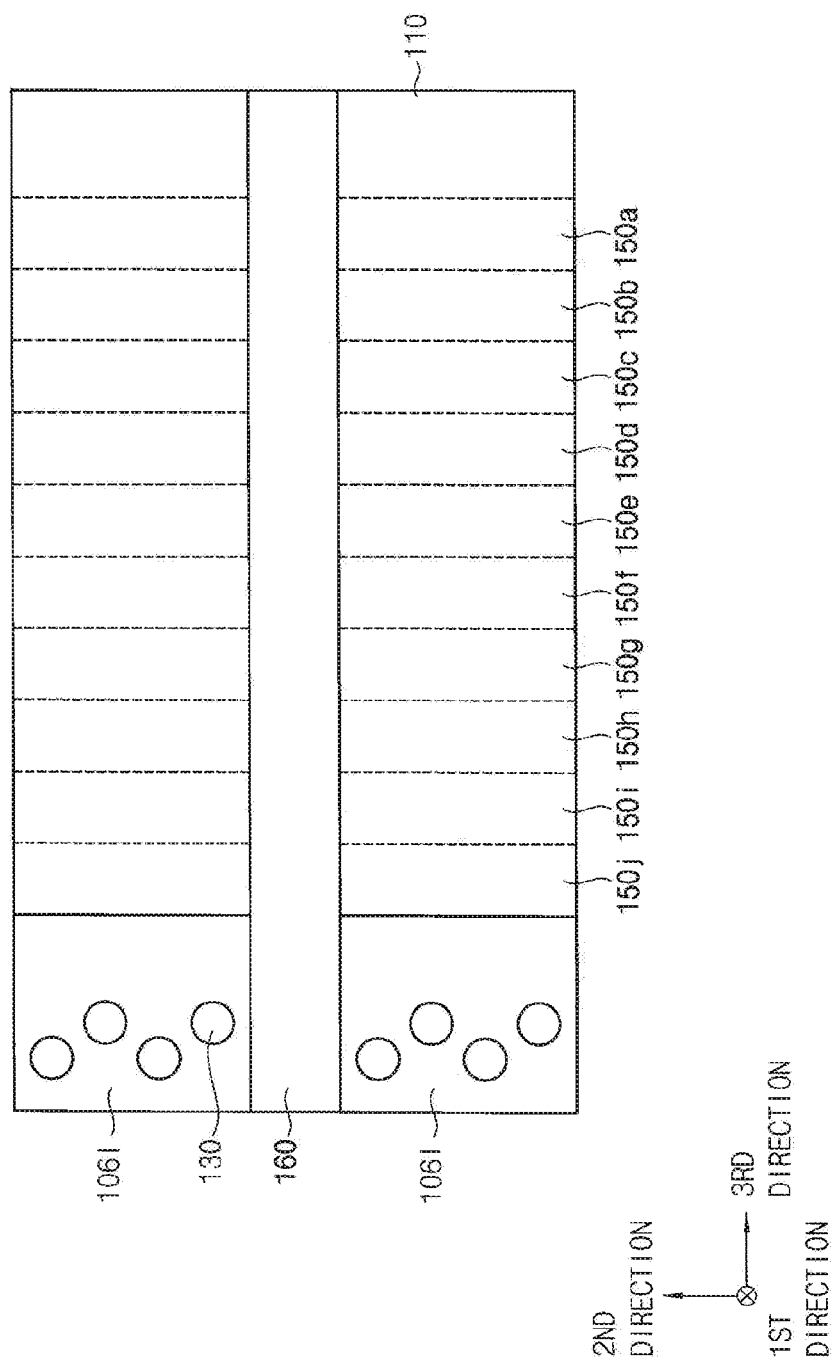
FIGS. 53 to 61 are top plan views and cross-sectional views illustrating a method of manufacturing a vertical memory device in accordance with example embodiments.
Figure 54:
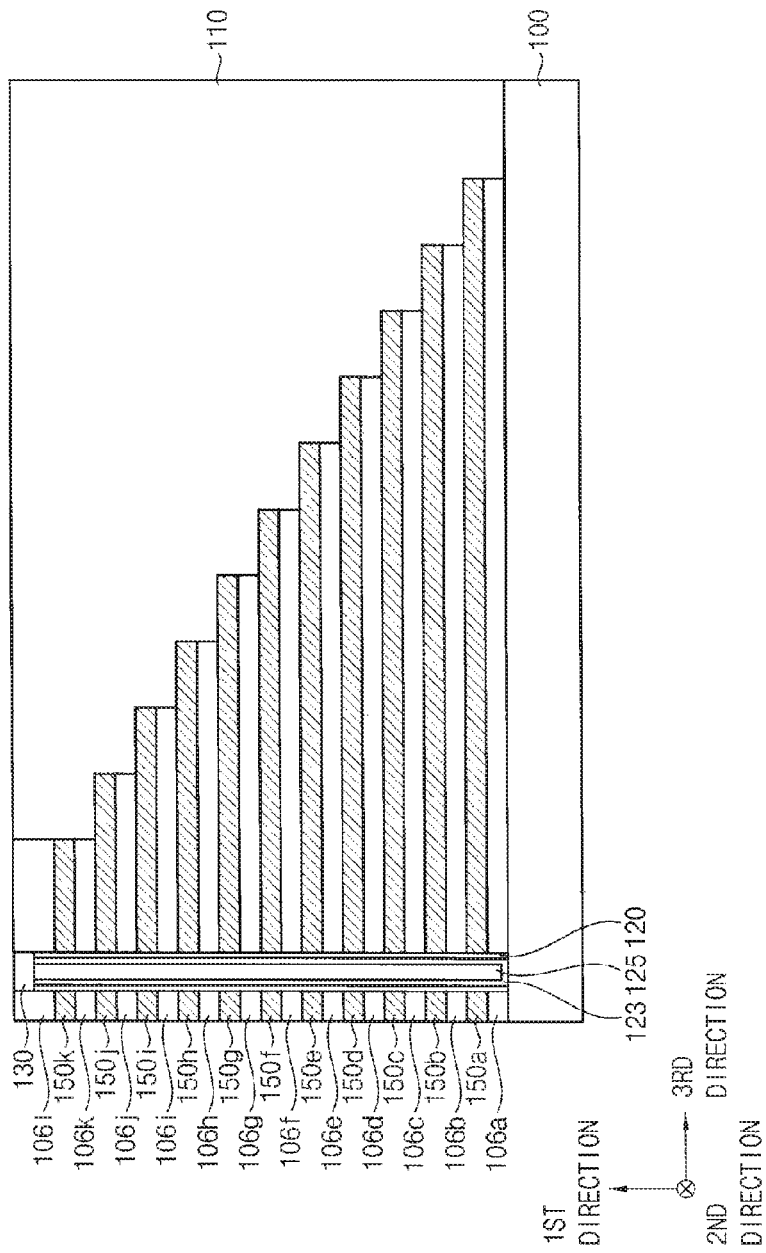

Referring to FIGS. 53 and 54, process substantially the same as or similar to those illustrated with reference to FIGS. 3 to 19 may be performed.

In example embodiments, a plurality of gate line structures divided by a second filling pattern 160 may be formed on a substrate 100. The gate line structure may include insulating interlayer patterns 106 and gate lines 150 stacked in a stepped structure, and may include a plurality of vertical channel structures extending through the insulating interlayer patterns 106 and the gate lines 150 in the first direction. The vertical channel structure may include a dielectric layer structure 120, a channel 123 and a first filling pattern 125, and a pad 130 capping the vertical channel structure may be formed on the dielectric layer structure 120, the channel 123 and the first filling pattern 125. A mold protection layer 110 may be formed on a lateral portion of the gate line structure.

Figure 55:
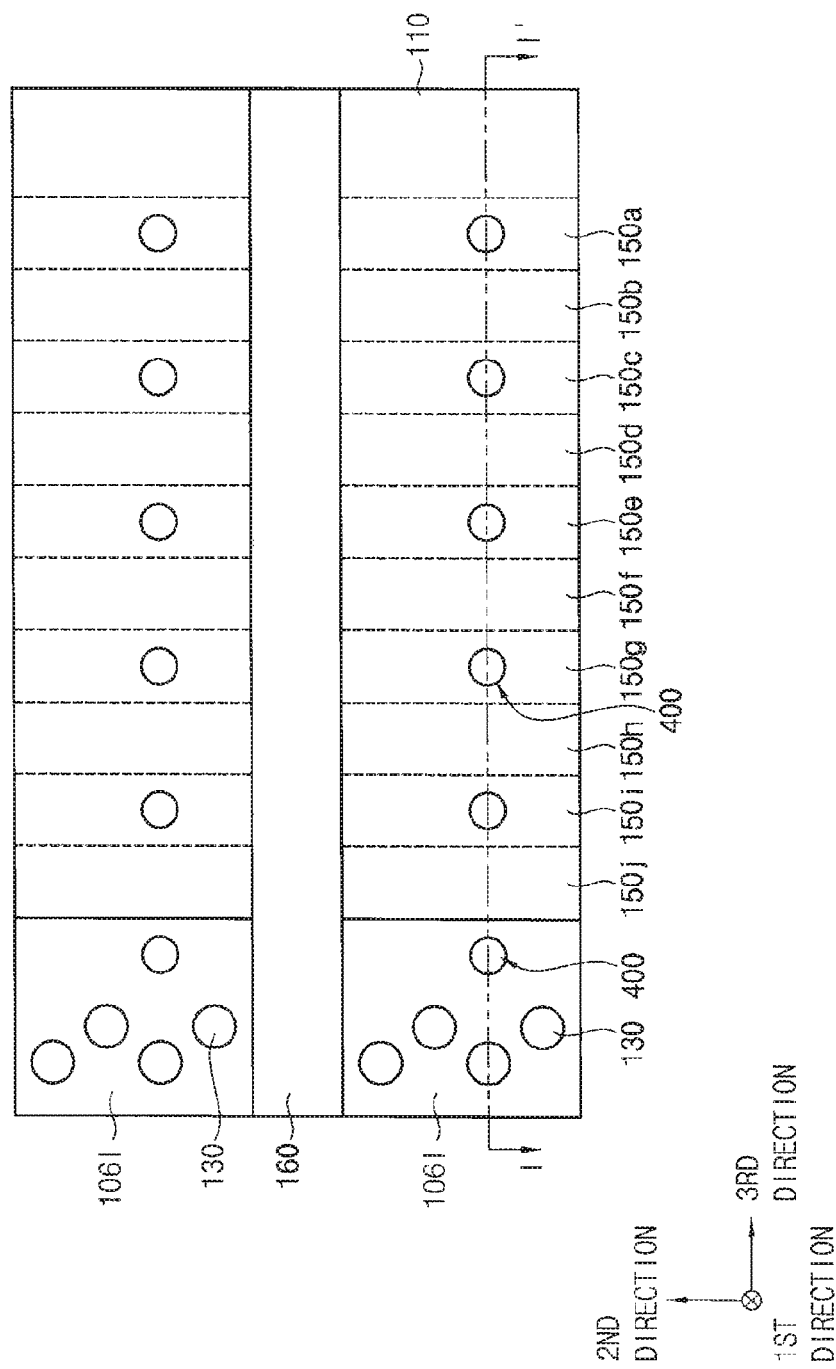
Figure 56:
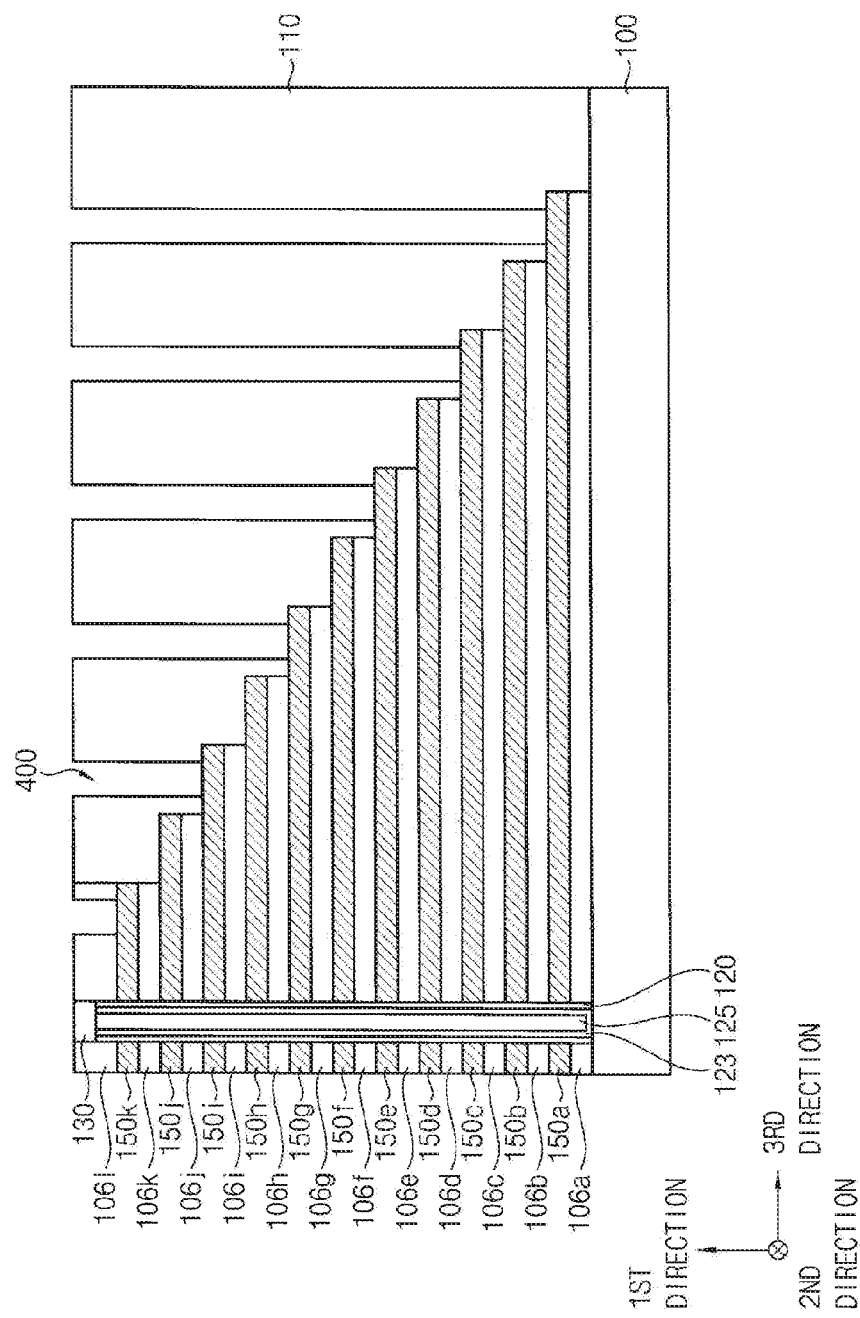

Referring to FIGS. 55 and 56, an uppermost insulating interlayer pattern 106*l* and the mold protection layer 110 may be partially removed by, e.g., a first photo process to form contact holes 400.

In example embodiments, the first contact holes 400 may be formed along the third direction to define a first contact hole row. The first contact holes 400 may be formed on every other level along the first direction. For example, step portions of the gate lines 150 at odd levels (e.g., 150*a*, 150*c*, 150*e*, 150*g*, 150*i* and 150*k*) may be exposed through the first contact holes 400.

Figure 57:
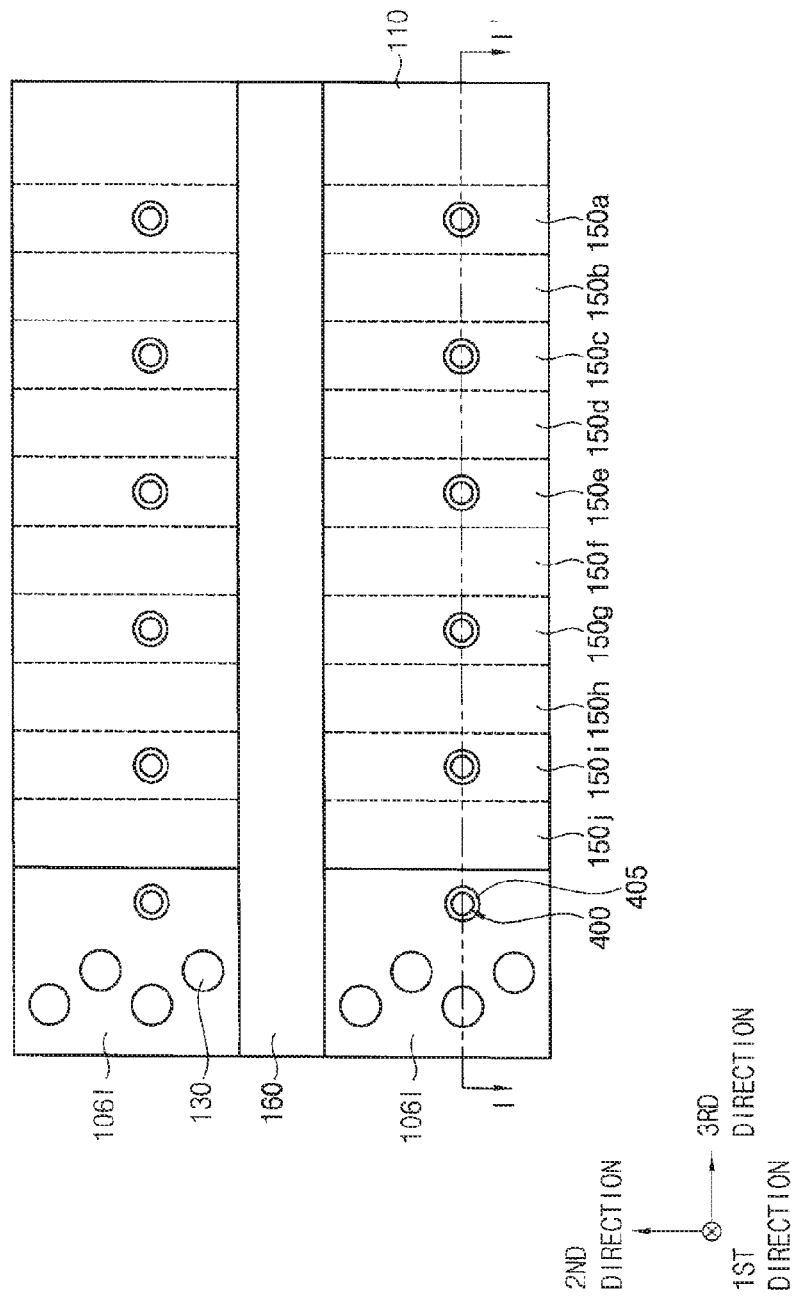
Figure 58:
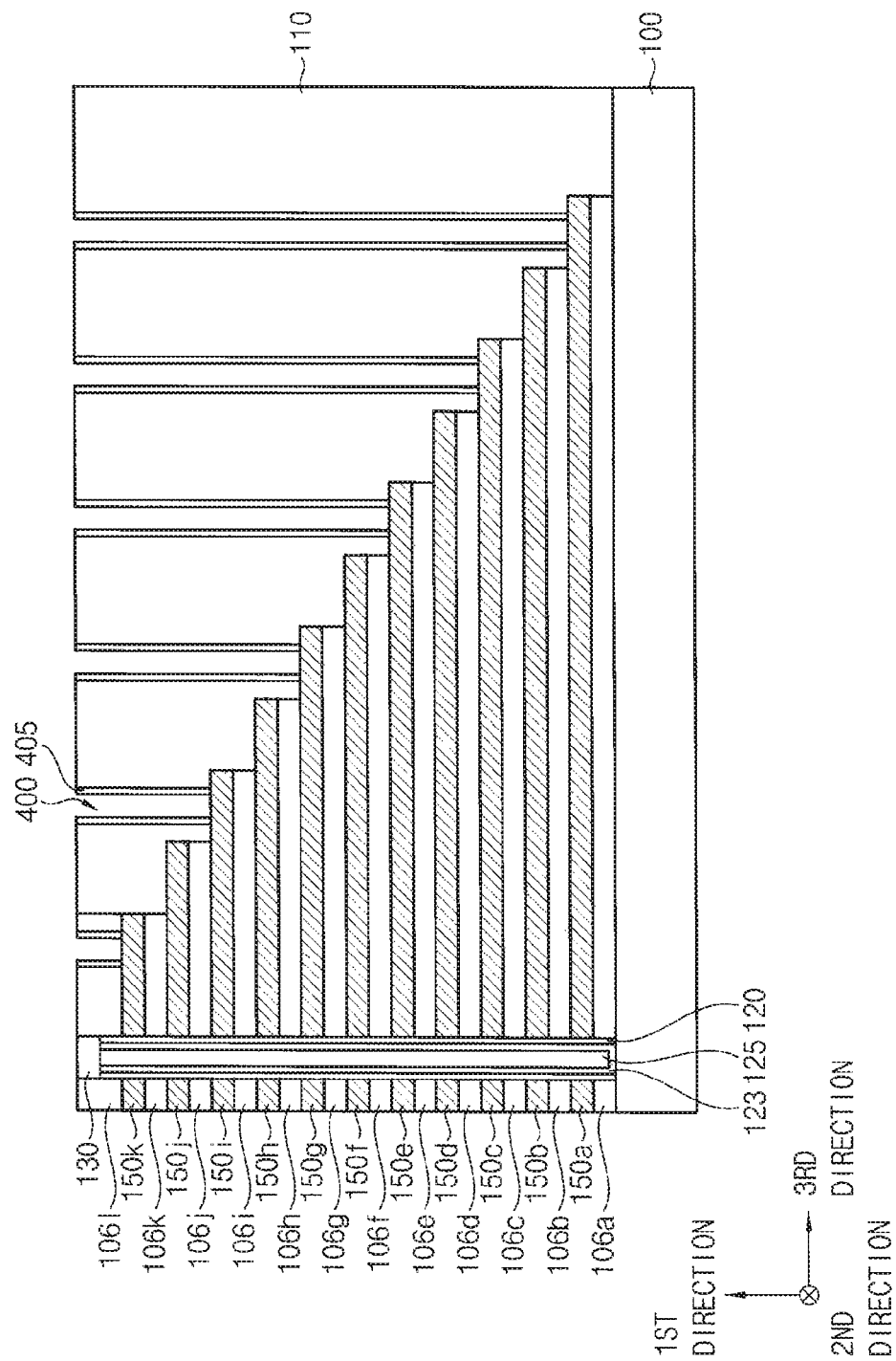

Referring to FIGS. 57 and 58, a first contact spacer 405 may be formed on a sidewall of each first contact hole 400.

For example, a spacer layer including silicon nitride may be formed on top surfaces of the uppermost insulating interlayer pattern 106*l* and the mold protection layer 110, and on the sidewalls and bottoms of the first contact holes 400. Upper and lower portions of the spacer layer may be removed by an etch-back process to form the first contact spacers 405.

Figure 59:
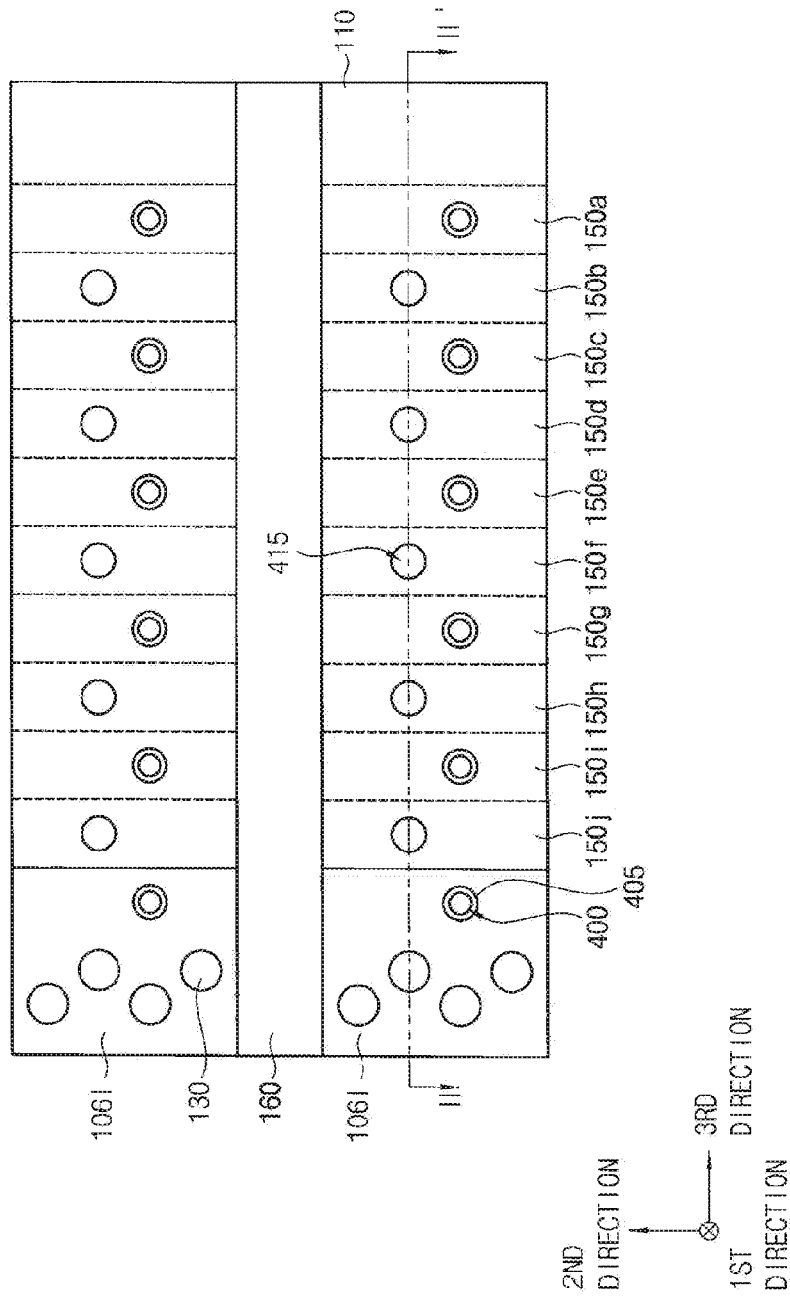
Figure 60:
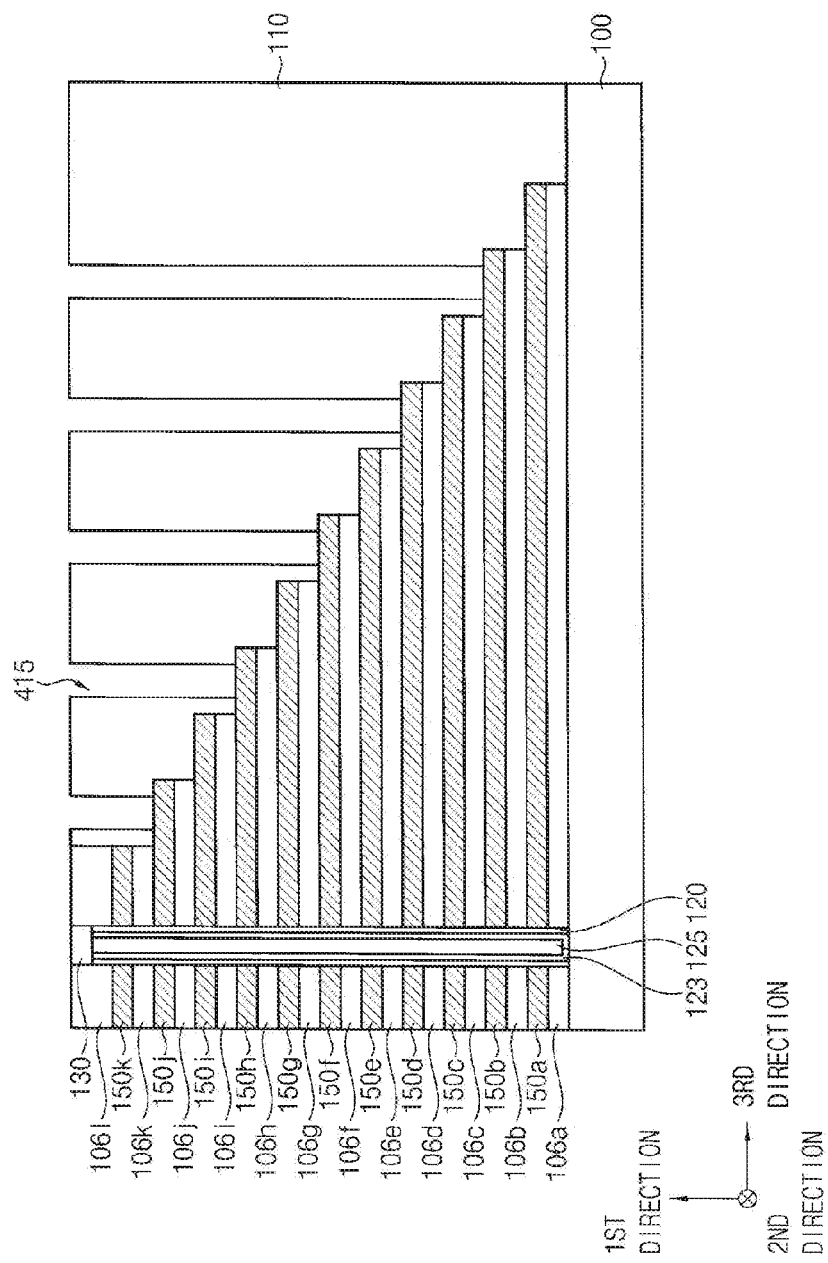

Referring to FIGS. 59 and 60, the mold protection layer 110 may be partially removed by, e.g., a second photo process to form second contact holes 415.

In example embodiments, the second contact holes 415 may be formed along the third direction to define a second contact hole row. The second contact holes 415 may be formed on every other level along the first direction. For example, step portions of the gate lines 150 at even levels (e.g., 150*b*, 150*d*, 150*f*, 150*h* and 150*j*) may be exposed through the second contact holes 415.

As described above, the first contact holes 405 and the second contact holes 415 may be formed by the first photo process and the second photo process, respectively, which may be divided based on the contact hole rows. The first and second contact holes 405 and 415 may be arranged alternately along the first direction in a zigzag arrangement. Thus, an alignment margin for the photo processes may be additionally achieved.

In example embodiments, the contact spacer may be formed only on the sidewalls of the first contact holes 405 that may be formed by the first photo process and may be included in the first contact hole row. Thus, defects from an etching residue while performing the second photo process may be prevented.

Figure 61:
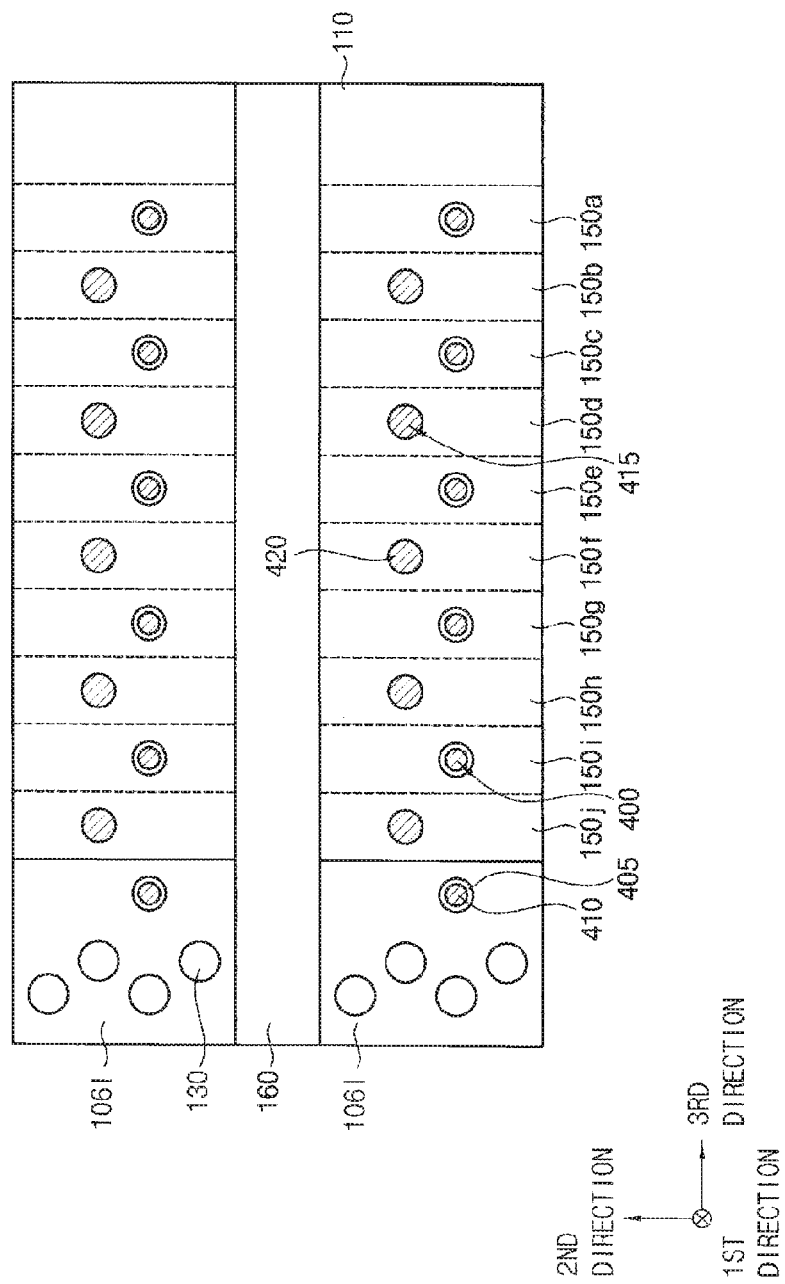

Referring to FIG. 61, first contacts 410 and second contacts 420 may be formed in the first contact holes 405 and the second contact holes 415, respectively.

For example, a conductive layer sufficiently filling the first and second contact holes 405 and 415 may be formed on the top surfaces of the uppermost insulating interlayer pattern 106*l* and the mold protection layer 110. An upper portion of the conductive layer may be planarized by a CMP process until the top surfaces of the upper most insulating interlayer pattern 106*l* and/or the mold protection layer 110 may be exposed to form the first contacts 410 and the second contacts 420. The first and second contacts 410 and 420 may be formed simultaneously.

The first and second contacts 410 and 420 may be formed along the first direction in a zigzag arrangement according to the arrangement of the first and second contact holes 405 and 415, and may be landed on the step portions of the gate lines 150.

In example embodiments, as illustrated with reference to FIG. 2, wirings electrically connected to the first and second contacts 410 and 420 may be further formed. A bit line electrically connected to a plurality of the pads 130 may be also formed.

According to example embodiments, contact spacers may be selectively formed on sidewalls of some contacts among contacts electrically connected to step portions of gate lines included in a vertical memory device. For example, first contact holes exposing the step portions of upper gate lines may be formed by a first photo process, and then the contact spacers may be formed on sidewalls of the first contact holes. Therefore, while performing subsequent photo processes, an etching gas from the first contact holes may be blocked to prevent a profile damage of the contacts.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical memory device, comprising:
    a substrate;
    gate lines stacked on top of each other on the substrate, the gate lines being spaced apart from each other in a vertical direction with respect to a top surface of the substrate, the gate lines including step portions that extend in a parallel direction with respect to the top surface of the substrate, the gate lines including first gate lines and second gate lines, wherein the first gate lines ate either on top of the second gate lines or the first gate lines are alternately stacked with the second gate lines;

channels extending through the gate lines in the vertical direction;

contacts on the step portions of the gate lines, the contacts including first contacts connected to the first gate lines and second contacts connected to the second gate lines; and contact spacers formed along sidewalls of the first contacts, the contact spacers not being formed along sidewalls of the second contacts.

2. The vertical memory device of claim 1, wherein the contact spacers include one of silicon nitride and silicon oxynitride.

3. The vertical memory device of claim 2, further comprising:
a mold protection layer covering top and lateral surfaces of the step portions, wherein
the mold protection layer includes silicon oxide.

4. The vertical memory device of claim 3, wherein
the contact spacers surround the sidewalls of the first contacts,
the contact spacers extend through the mold protection layer,
the second contacts are in contact with the mold protection layer, and
the second contacts extend through the mold protection layer.

5. The vertical memory device of claim 1, wherein
the substrate includes a channel region, a first region, and a second region,
the channels are on the channel region,
the first region and the second region are sequentially positioned from the channel region in the parallel direction, and
the first contacts are on the step portions included in the first region and the second contacts are on the step portions included in the second region.

6. The vertical memory device of claim 1, wherein
the first gate lines are on top of the second gate lines,
the first gate lines include a string selection lines (SSL) and upper word lines,
the second gate lines include a ground selection line (GSL) and lower word lines,
the GSL, the lower word lines, the upper word lines, and the SSL are sequentially stacked from the top surface of the substrate, and
the first contacts are electrically connected to the SSL and the upper word lines.

7. The vertical memory device of claim 6, wherein
the second contacts are electrically connected to the lower word lines and the GSL.

8. The vertical memory device of claim 5, wherein
the first gate lines are on the second gate lines,
the substrate further includes a third region between the first region and the second region in the parallel direction,
the gate lines include third gate line between the first gate lines and the second gate lines, and
the contacts further include third contacts on the step portions of the third gate lines.

9. The vertical memory device of claim 1, wherein
the first gate lines are on the second gate lines,
the gate lines include third gate lines between the first gate lines and the second gate lines in the vertical direction,
the contact spacers further include second contact spacers along sidewalls of the third contacts.

10. The vertical memory device of claim 1, further comprising:
a peripheral circuit on a peripheral portion of the substrate;
a mold protection layer covering top and lateral surfaces of the step portions, and the peripheral circuit; and
a peripheral circuit contact extending through the mold protection layer to the peripheral circuit, wherein
the peripheral circuit contact is electrically connected to the peripheral circuit, and
the peripheral circuit contact is in contact with the mold protection layer.

11. The vertical memory device of claim 1, wherein the contacts are arranged in a zigzag arrangement along the parallel direction.

12. The vertical memory device of claim 1, wherein the first gate lines are alternately stacked with the second gate lines such that the contact spacers are formed along the sidewalls of the first gate contacts on the step portions of either odd levels or even levels of the gate lines.

13. The vertical memory device of claim 1, further comprising:
a peripheral circuit contact on a peripheral portion of the substrate, wherein
the contact spacers are not formed along a sidewall of the peripheral circuit contact.

14. A vertical memory device, comprising:
a substrate including a channel region, a contact region, and a peripheral circuit region;
a gate line structure on the substrate, the gate line structure including
gate lines on the channel region and the contact region, and stacked vertically from the substrate, the gate lines including step portions that extend to the contact region,
insulating interlayer patterns between the gate lines, and
channels extending vertically through the gate lines and the insulating interlayer patterns;
gate line contacts electrically connected to the gate lines on the contact region;
a peripheral circuit contact on the peripheral circuit region; and
contact spacers selectively formed along sidewalls of a portion of the gate line contacts, wherein
the contact spacers are not formed along a sidewall of the peripheral circuit contact.

15. The vertical memory device of claim 14, wherein
the gate lines include first gate lines and second gate lines,
the first gate lines are either on top of the second gate lines or the first gate lines are alternately stacked with the second gate lines,
the insulating interlayer patterns are between the first gate lines and second gate lines,
the gate line contacts include first gate line contacts connected to the first gate lines and second gate line contacts connected to the second gate lines on the contact region, and
the contact spacers surround the first gate line contacts but not the second gate line contacts.

16. A vertical memory device, comprising:
a substrate;

vertical channel structures spaced apart from each other on the substrate, gate lines surrounding the vertical channel structures, the gate lines being spaced apart from each other in a vertical direction, the gate lines including step portions that extend different extension lengths in a horizontal direction from a same one of the vertical channel structures, the extension lengths of the step portions increasing from top to bottom, the gate lines including first gate lines and second gate lines, wherein the first gate lines are either on top of the second gate lines or the first gate lines are alternately stacked with the second gate lines;

contacts that extend vertically and connect to corresponding ones of the step portions, the contacts including first contacts connected to the first gate lines and second contacts connected to the second gate lines; and contact spacers surrounding the first contacts, the contact spacers not surrounding the second contacts.

17. The vertical memory device of claim 16, wherein the first gate lines are on top of second gate lines,
the first contacts are connected to the step portions of the first gate lines, and
the second contacts are connected to the step portions of the second gate lines.

18. The vertical memory device of claim 16, wherein the contact spacers include one of silicon nitride and silicon oxynitride.

19. The vertical memory device of claim 16, further comprising:
a mold protection layer on the step portions, wherein
the mold protection layer and the contact spacers are formed of different insulating materials.

20. The vertical memory device of claim 19, further comprising:
a peripheral circuit on the substrate; and
at least one peripheral circuit contact that extends through the mold protection layer and connects to the peripheral circuit, wherein
the peripheral circuit is spaced apart from the gate lines.

21. The vertical memory device of claim 16, further comprising:
a peripheral circuit contact on a peripheral portion of the substrate, wherein
the contact spacers are not formed along a sidewall of the peripheral circuit contact.

* * * * *